(12) United States Patent
Yang et al.

(10) Patent No.: US 11,804,499 B2
(45) Date of Patent: Oct. 31, 2023

(54) OPTICAL AND ELECTRICAL SECONDARY PATH REJECTION

(71) Applicant: Quantum-Si Incorporated, Guilford, CT (US)

(72) Inventors: Dajiang Yang, San Jose, CA (US); Farshid Ghasemi, Guilford, CT (US); Keith G. Fife, Palo Alto, CA (US); Todd Rearick, Cheshire, CT (US); Ali Kabiri, Guilford, CT (US); Gerard Schmid, Guilford, CT (US); Eric A. G. Webster, Santa Clara, CA (US)

(73) Assignee: Quantum-Si Incorporated, Branford, CT (US)

( * ) Notice: Subject to any disclaimer, the term of this patent is extended or adjusted under 35 U.S.C. 154(b) by 177 days.

(21) Appl. No.: 16/913,688

(22) Filed: Jun. 26, 2020

(65) Prior Publication Data

US 2020/0408690 A1    Dec. 31, 2020

Related U.S. Application Data

(60) Provisional application No. 62/868,829, filed on Jun. 28, 2019.

(51) Int. Cl.
*H01L 27/146* (2006.01)
*H04N 25/771* (2023.01)

(52) U.S. Cl.
CPC .. *H01L 27/14609* (2013.01); *H01L 27/14623* (2013.01); *H01L 27/14625* (2013.01); *H01L 27/14636* (2013.01); *H04N 25/771* (2023.01)

(58) Field of Classification Search
None
See application file for complete search history.

(56) References Cited

U.S. PATENT DOCUMENTS 4,315,159 A * 2/1982 Niwa ................ H01L 27/14818
250/214 B
5,961,924 A 10/1999 Reichert et al.
(Continued)

FOREIGN PATENT DOCUMENTS

CN      109997229 A * 7/2019 ........... H01L 27/146
EP      3 483 938 A1    5/2019
(Continued)

OTHER PUBLICATIONS

Invitation to Pay Additional Fees for International Application No. PCT/US2020/039868 dated Oct. 22, 2020.
(Continued)

*Primary Examiner* — Scott B Geyer
(74) *Attorney, Agent, or Firm* — Wolf, Greenfield & Sacks, P.C.

(57) ABSTRACT

Described herein are techniques to reduce or remove the impact of secondary path photons and/or charge carriers on storage bins of an integrated device to improve noise performance, and thus, sample analysis. Some embodiments relate to optical rejection techniques such as including an optical barrier positioned to block at least some photons from reaching the storage bins. Some embodiments relate to electrical rejection techniques such as including an electrical barrier configured to block at least some charge carriers from reaching the storage bins along at least one secondary path. Some embodiments relate to an integrated device in which at least one storage bin is shaped and/or positioned relative to the photodetector to facilitate receipt of some charge carriers (e.g., fluorescent emission charge carriers) and/or photons and to impede receipt of other charge carriers (e.g., noise charge carriers) and/or photons.

29 Claims, 38 Drawing Sheets

(56) References Cited

U.S. PATENT DOCUMENTS

| | | | | |
|---|---|---|---|---|
| 5,986,297 A * | 11/1999 | Guidash | | H01L 27/14609 257/292 |
| 6,303,919 B1 * | 10/2001 | Yokomichi | | H01L 27/14609 348/307 |
| 6,316,814 B1 * | 11/2001 | Nagata | | H01L 27/14623 257/233 |
| 6,624,456 B2 * | 9/2003 | Fossum | | H01L 27/14609 348/E3.018 |
| 6,787,308 B2 | 9/2004 | Balasubramanian et al. | | |
| 6,917,726 B2 | 7/2005 | Levene et al. | | |
| 7,175,811 B2 | 2/2007 | Bach et al. | | |
| 7,426,322 B2 | 9/2008 | Hyde | | |
| 7,738,086 B2 | 6/2010 | Shepard et al. | | |
| 7,820,983 B2 | 10/2010 | Lundquist et al. | | |
| 7,834,329 B2 | 11/2010 | Lundquist et al. | | |
| 7,838,847 B2 | 11/2010 | Lundquist et al. | | |
| 8,053,742 B2 | 11/2011 | Lundquist et al. | | |
| 8,207,509 B2 | 6/2012 | Lundquist et al. | | |
| 8,274,040 B2 | 9/2012 | Zhong et al. | | |
| 8,278,728 B2 | 10/2012 | Murshid | | |
| 8,465,699 B2 | 6/2013 | Fehr et al. | | |
| 8,471,219 B2 | 6/2013 | Lundquist et al. | | |
| 8,471,230 B2 | 6/2013 | Zhong et al. | | |
| 8,502,169 B2 | 8/2013 | Rigneault et al. | | |
| 8,618,507 B1 | 12/2013 | Lundquist et al. | | |
| 8,860,862 B2 * | 10/2014 | Kobayashi | | H01L 27/14614 348/308 |
| 8,878,264 B2 * | 11/2014 | Velichko | | H01L 27/14461 257/256 |
| 9,029,802 B2 | 5/2015 | Lundquist et al. | | |
| 9,157,864 B2 | 10/2015 | Fehr et al. | | |
| 9,222,123 B2 | 12/2015 | Zhong et al. | | |
| 9,222,133 B2 | 12/2015 | Lundquist et al. | | |
| 9,223,084 B2 | 12/2015 | Grot et al. | | |
| 9,372,308 B1 | 6/2016 | Saxena et al. | | |
| 9,587,276 B2 | 3/2017 | Lundquist et al. | | |
| 9,606,060 B2 | 3/2017 | Chen et al. | | |
| 9,658,161 B2 | 5/2017 | Saxena et al. | | |
| 9,666,748 B2 | 5/2017 | Leobandung | | |
| 9,719,138 B2 | 8/2017 | Zhong et al. | | |
| 9,765,395 B2 | 9/2017 | Goldsmith | | |
| 9,917,126 B1 | 3/2018 | Lagrasta et al. | | |
| 9,921,157 B2 | 3/2018 | Rothberg et al. | | |
| 9,946,017 B2 | 4/2018 | Saxena et al. | | |
| 10,018,764 B2 | 7/2018 | Grot et al. | | |
| 10,090,429 B2 | 10/2018 | Leobandung | | |
| 10,138,515 B2 | 11/2018 | Fehr et al. | | |
| 10,280,457 B2 | 5/2019 | Zhong et al. | | |
| 10,310,178 B2 | 6/2019 | Saxena et al. | | |
| 10,487,356 B2 | 11/2019 | Lundquist et al. | | |
| 10,566,359 B1 * | 2/2020 | Leung | | H01L 27/14603 |
| 10,578,788 B2 | 3/2020 | Grot et al. | | |
| 10,655,172 B2 | 5/2020 | Rank et al. | | |
| 10,724,090 B2 | 7/2020 | McCaffrey et al. | | |
| 2002/0180054 A1 | 12/2002 | Zambrano et al. | | |
| 2002/0182716 A1 | 12/2002 | Weisbuch et al. | | |
| 2003/0049905 A1 | 3/2003 | Nitta et al. | | |
| 2003/0174992 A1 | 9/2003 | Levene et al. | | |
| 2006/0132632 A1 * | 6/2006 | Ihara | | H01L 27/14689 348/308 |
| 2006/0208285 A1 * | 9/2006 | Inoue | | H01L 27/14609 257/E27.131 |
| 2008/0265296 A1 * | 10/2008 | Uya | | H01L 27/14645 257/292 |
| 2009/0166514 A1 * | 7/2009 | Tokuda | | G01N 27/3275 257/E31.124 |
| 2009/0303366 A1 * | 12/2009 | Gambino | | H01L 27/14623 348/308 |
| 2010/0065726 A1 | 3/2010 | Zhong et al. | | |
| 2010/0187401 A1 * | 7/2010 | Kawahito | | H04N 3/155 257/E27.15 |
| 2013/0070131 A1 | 3/2013 | Ohkubo et al. | | |
| 2013/0116153 A1 | 5/2013 | Bowen et al. | | |
| 2013/0134299 A1 | 5/2013 | Durini Romero et al. | | |
| 2014/0077283 A1 | 3/2014 | Lenchenkov | | |
| 2014/0197301 A1 * | 7/2014 | Velichko | | H04N 5/37452 250/208.1 |
| 2014/0239155 A1 * | 8/2014 | Ohkubo | | H01L 27/14623 250/208.1 |
| 2014/0291793 A1 * | 10/2014 | Tanaka | | H01L 27/14689 257/435 |
| 2014/0327051 A1 * | 11/2014 | Ahn | | H01L 31/18 438/69 |
| 2015/0002718 A1 * | 1/2015 | Nomura | | H01L 27/1463 348/311 |
| 2015/0060966 A1 * | 3/2015 | Lenchenkov | | H01L 27/14689 257/292 |
| 2015/0264287 A1 | 9/2015 | Shimotsusa et al. | | |
| 2015/0325606 A1 * | 11/2015 | Togashi | | H04N 25/63 257/443 |
| 2015/0340393 A1 * | 11/2015 | Tamaki | | H01L 27/14632 257/291 |
| 2015/0372038 A1 * | 12/2015 | Lee | | H01L 27/14612 257/435 |
| 2016/0013227 A1 * | 1/2016 | Kim | | H01L 27/14612 257/229 |
| 2016/0211306 A1 * | 7/2016 | Choi | | H01L 27/1464 |
| 2016/0381310 A1 * | 12/2016 | Lenchenkov | | H01L 27/14623 257/435 |
| 2017/0146479 A1 | 5/2017 | Levine et al. | | |
| 2018/0114806 A1 * | 4/2018 | Kim | | H01L 27/14627 |
| 2018/0130840 A1 * | 5/2018 | Kobayashi | | H01L 27/14643 |
| 2018/0180546 A1 | 6/2018 | Rothberg et al. | | |
| 2018/0197910 A1 * | 7/2018 | Lee | | H04N 5/353 |
| 2018/0226439 A1 * | 8/2018 | Oda | | H01L 27/14643 |
| 2018/0247969 A1 | 8/2018 | Mori et al. | | |
| 2019/0025511 A1 | 1/2019 | Rothberg et al. | | |
| 2019/0292590 A1 | 9/2019 | Zhong et al. | | |
| 2019/0378864 A1 | 12/2019 | Innocent | | |
| 2019/0391010 A1 | 12/2019 | Thurston et al. | | |
| 2021/0134855 A1 | 5/2021 | Ghasemi et al. | | |

FOREIGN PATENT DOCUMENTS

| | | | | |
|---|---|---|---|---|
| WO | WO 2011/153962 A1 | 12/2011 | | |
| WO | WO-2019026606 A1 * | 2/2019 | | G01S 17/36 |
| WO | WO-2019093479 A1 * | 5/2019 | | H01L 27/14603 |

OTHER PUBLICATIONS

International Search Report and Written Opinion for International Application No. PCT/US2020/039868 dated Dec. 15, 2020.

International Search Report and Written Opinion for International Application No. PCT/US2020/058134 dated Feb. 17, 2021.

Hale, Fibre Optic Sensors using Adiabatically Tapered Single Mode Fibres. Dissertation submitted to the University of Cambridge. Feb. 1994. 209 pages.

Mogensen et al., A Microfluidic Device with an Integrated Waveguide Beam Splitter for Velocity Measurements of Flowing Particles by Fourier Transformation. Analytical Chemistry. Sep. 15, 2003;75(18):4931-4936.

Taitt et al., Evanescent wave fluorescence biosensors. Biosens Bioelectron. Jun. 2005;20(12):2470-87. Epub Dec. 8, 2004.

International Preliminary Report on Patentability for International Application No. PCT/US2020/039868 dated Jan. 6, 2022.

International Preliminary Report on Patentability for International Application No. PCT/US2020/058134 dated May. 12, 2022.

* cited by examiner

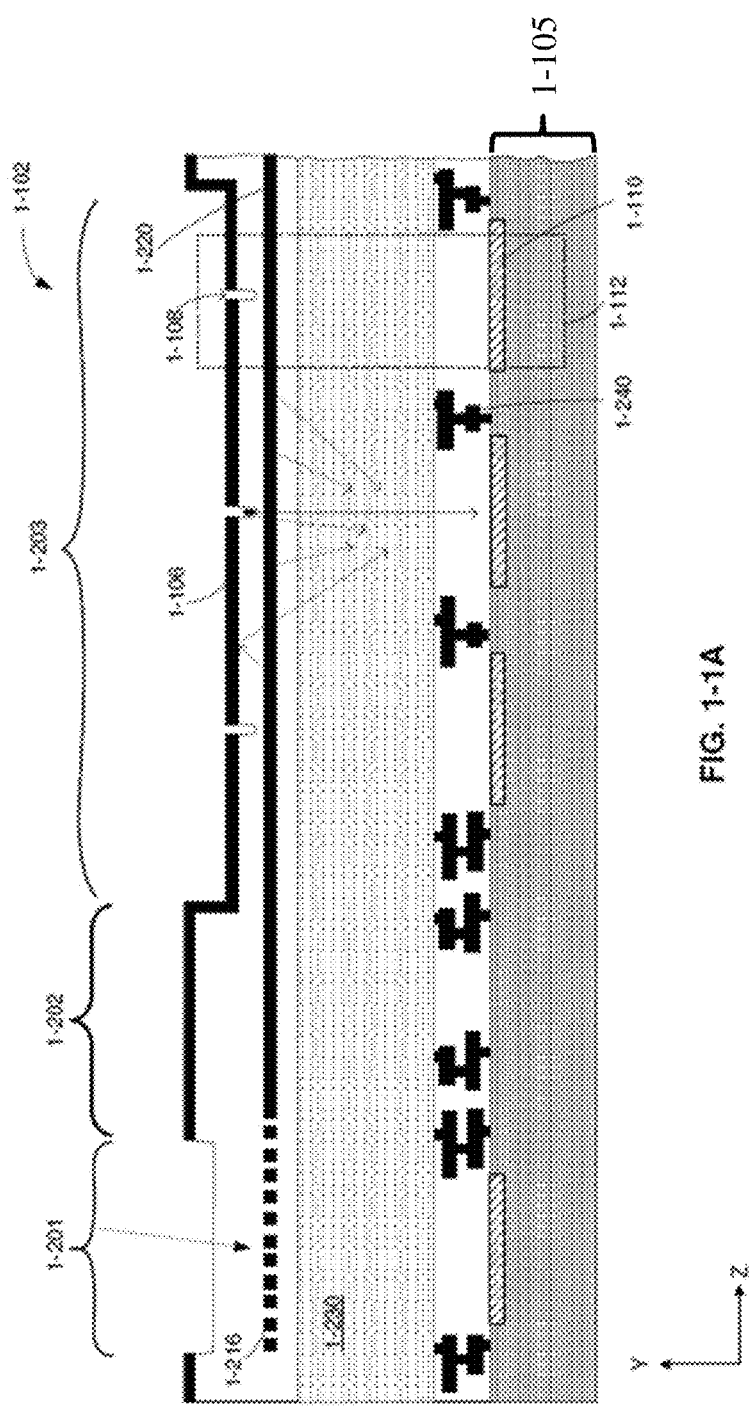

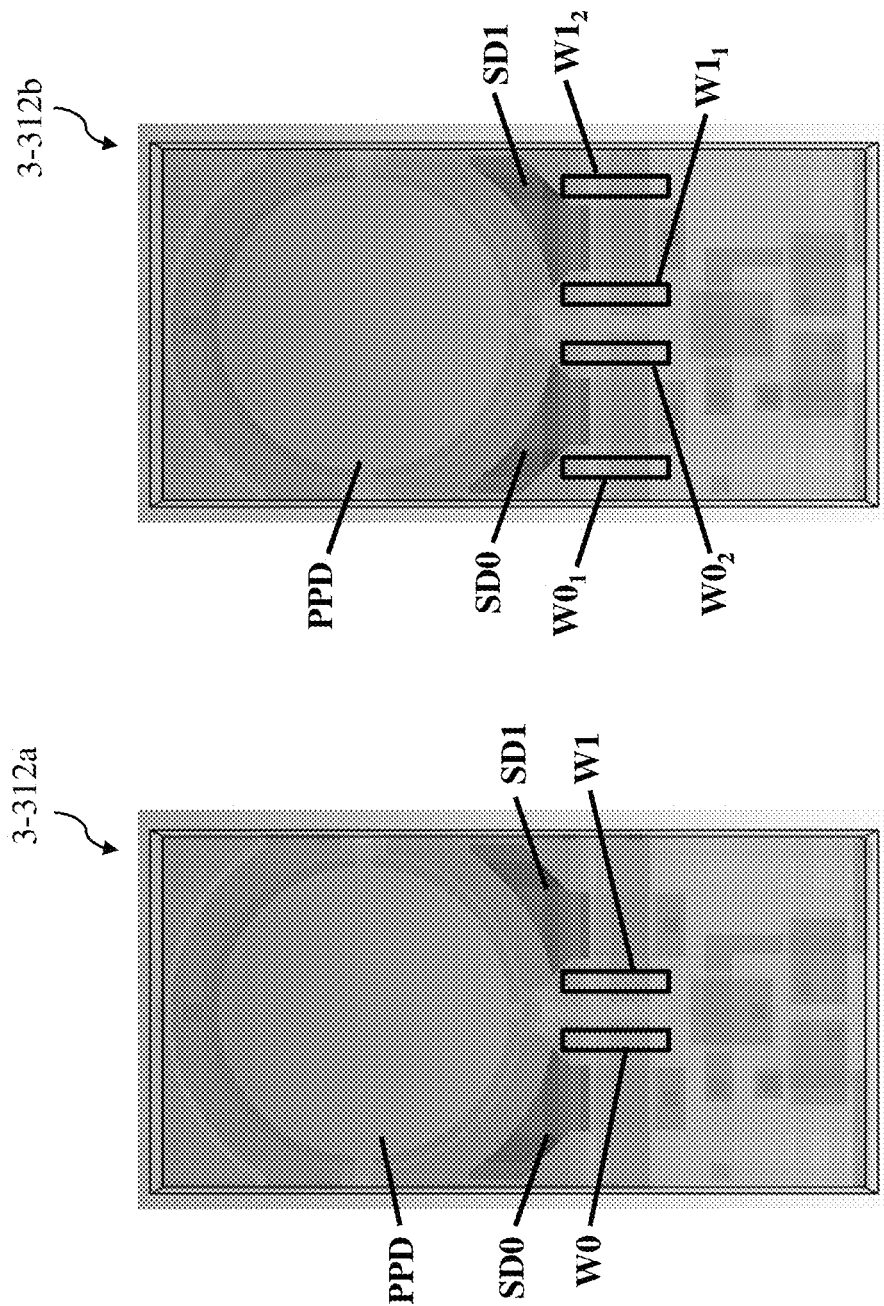

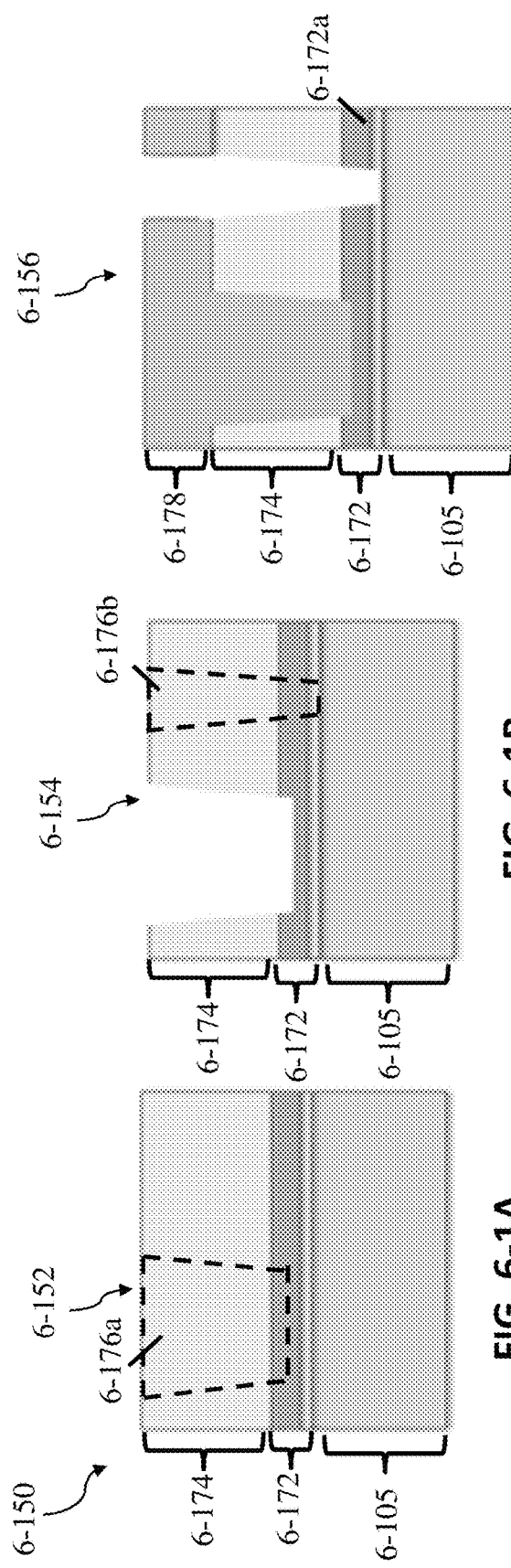
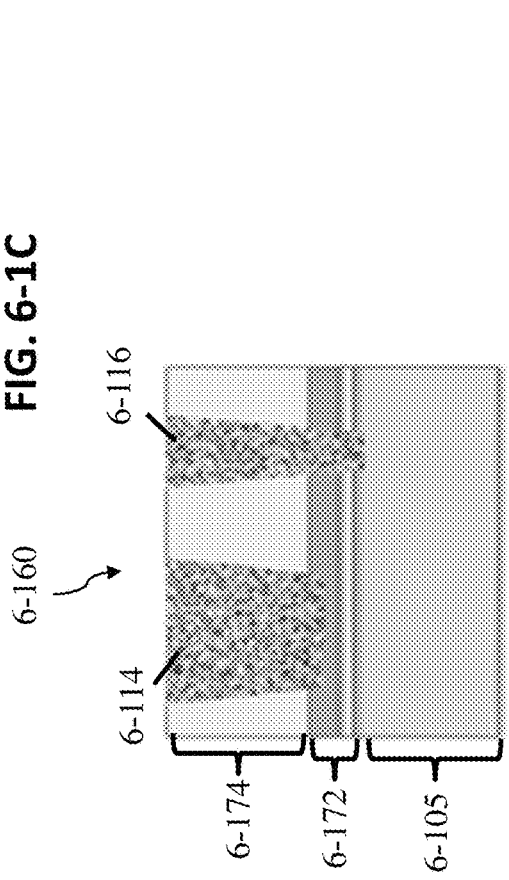
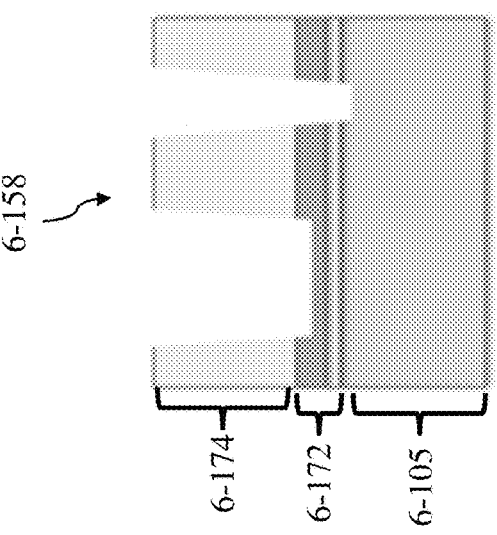
FIG. 6-1A
FIG. 6-1B
FIG. 6-1C
FIG. 6-1D
FIG. 6-1E

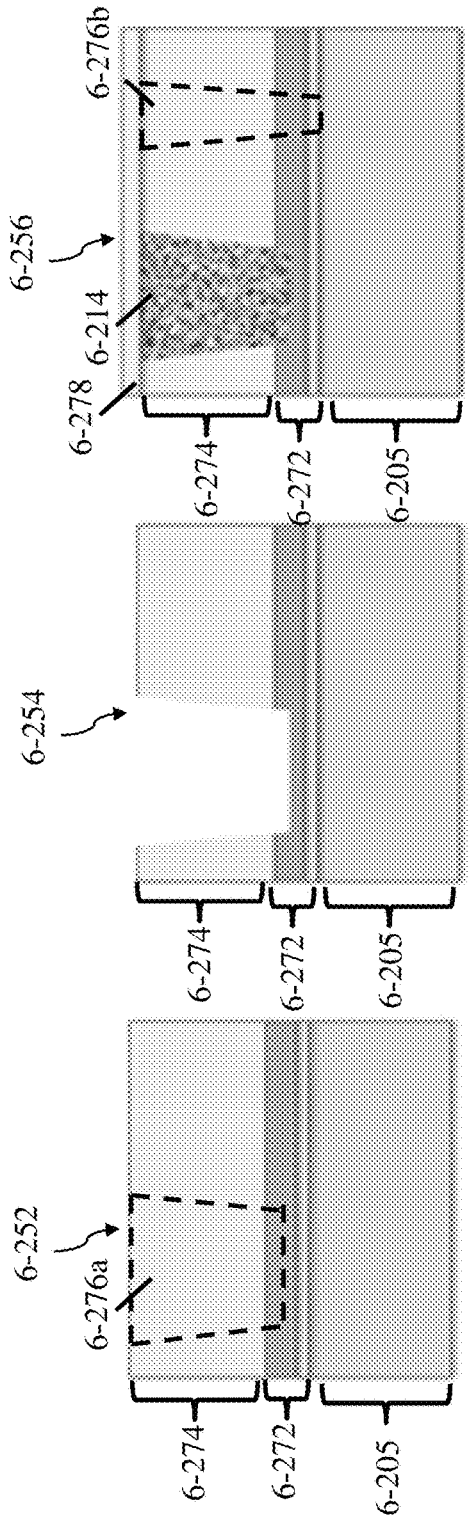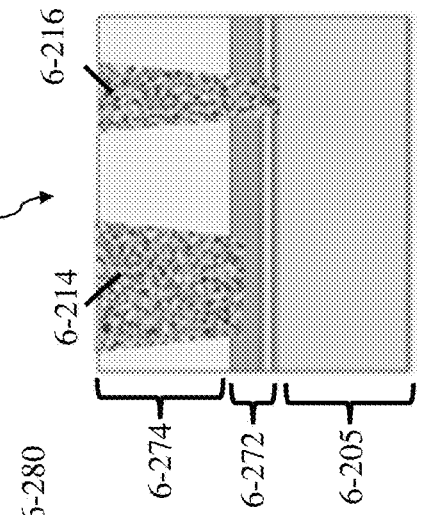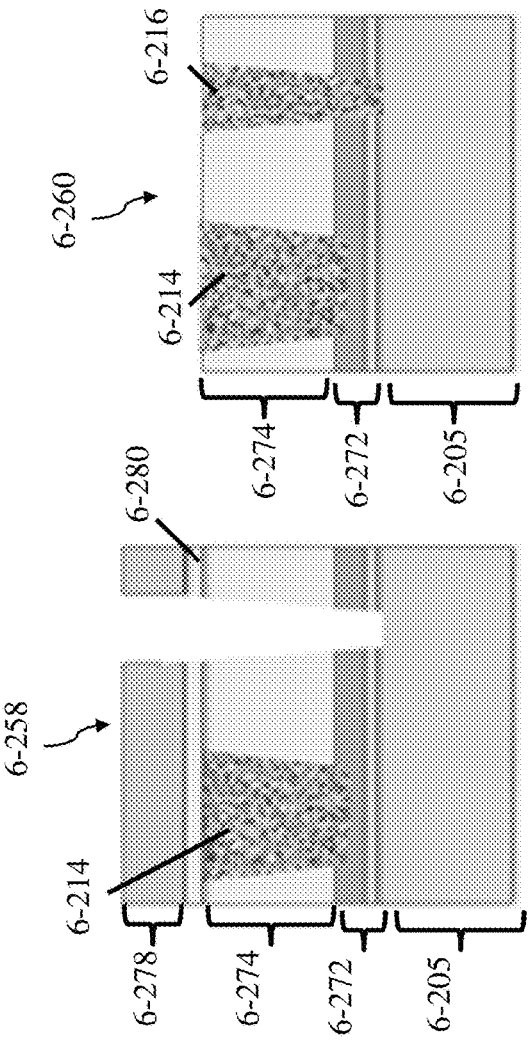
FIG. 6-2A   FIG. 6-2B   FIG. 6-2C   FIG. 6-2D   FIG. 6-2E

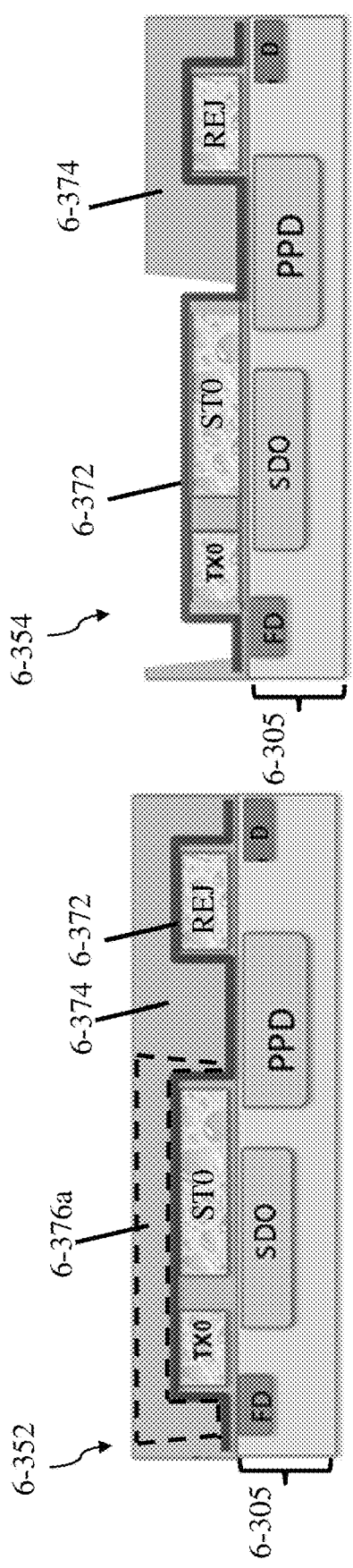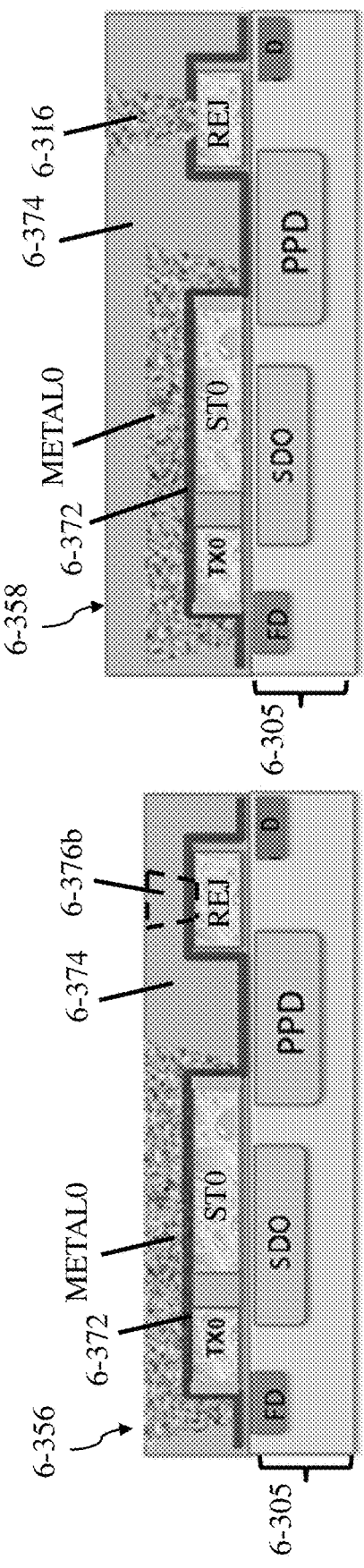
FIG. 6-3A
FIG. 6-3B
FIG. 6-3C
FIG. 6-3D

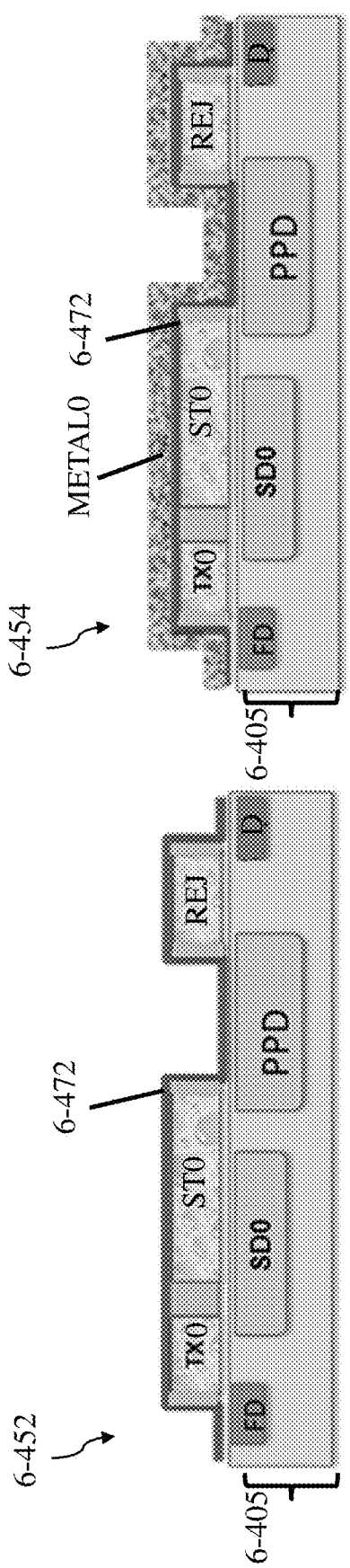
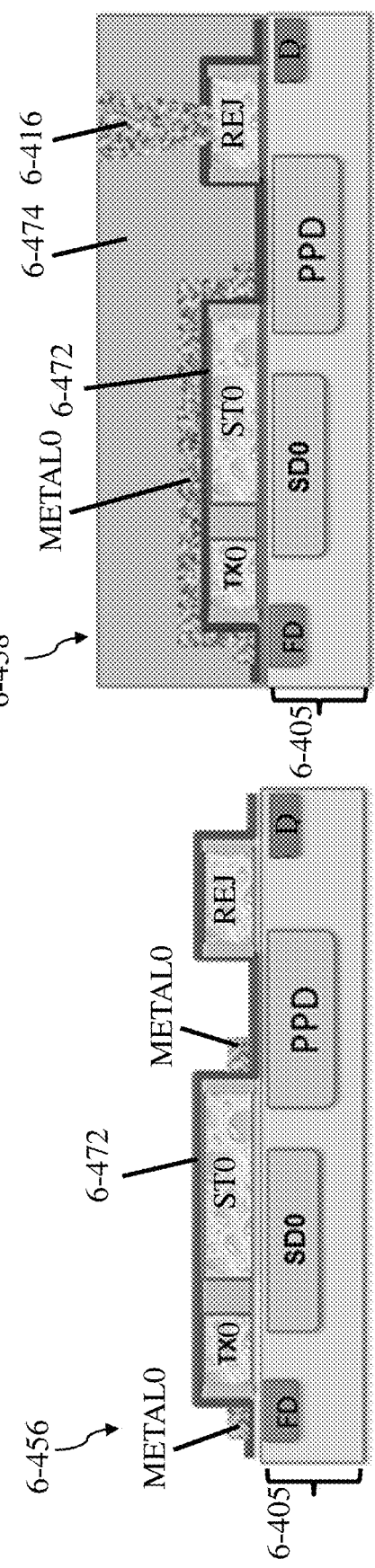
FIG. 6-4A
FIG. 6-4B
FIG. 6-4C
FIG. 6-4D

OPTICAL AND ELECTRICAL SECONDARY PATH REJECTION

RELATED APPLICATIONS

This application claims priority under 35 U.S.C. § 119(e) to U.S. Provisional Application Ser. No. 62/868,829, filed Jun. 28, 2019, and entitled, "OPTICAL AND ELECTRICAL SECONDARY PATH REJECTION," which is herein incorporated by reference in its entirety.

FIELD OF THE DISCLOSURE

The present disclosure relates to integrated devices and related instruments that can perform massively-parallel analyses of samples by providing short optical pulses to tens of thousands of sample wells or more simultaneously and receiving fluorescent signals from the sample wells for sample analyses. The instruments may be useful for point-of-care genetic sequencing and for personalized medicine.

BACKGROUND

Instruments that are capable of massively-parallel analyses of biological or chemical samples are typically limited to laboratory settings because of several factors that can include their large size, lack of portability, requirement of a skilled technician to operate the instrument, power need, need for a controlled operating environment, and cost. When a sample is to be analyzed using such equipment, a common paradigm is to extract a sample at a point of care or in the field, send the sample to the lab and wait for results of the analysis. The wait time for results can range from hours to days.

SUMMARY OF THE DISCLOSURE

Some aspects of the present disclosure relate to an integrated device, comprising a photodetection region configured to receive emission photons along a first portion of a primary path, one or more storage bins electrically coupled to receive charge carriers from the photodetection region along a second portion of the primary path, and at least one barrier configured to block at least some photons and/or at least some charge carriers from reaching the one or more storage bins along at least one secondary path.

In some embodiments, the at least one barrier may comprise an optical barrier configured to block the at least some photons from reaching the one or more storage bins along the at least one secondary path.

In some embodiments, the optical barrier may comprise an at least partially opaque component positioned along the at least one secondary path between a source of the at least some photons and the one or more storage bins.

In some embodiments, the at least partially opaque component comprises a contact and/or via.

In some embodiments, the integrated device may further comprise a transfer gate configured to control a flow of charge carriers along the primary path, and the at least partially opaque component may comprise a layer positioned around the transfer gate.

In some embodiments, the layer may comprise silicide.

In some embodiments, the layer may comprise metal.

In some embodiments, the integrated device may further comprise a transfer gate configured to control a flow of charge carriers along the primary path, and the at least partially opaque component may comprise a metal portion of the transfer gate.

In some embodiments, the at least partially opaque component may comprise a metal transfer gate of the integrated device, and the metal transfer gate may be configured to control a flow of charge carriers along the primary path.

In some embodiments, the optical barrier may include an optical waveguide elongated along the first portion of the primary path.

In some embodiments, the at least one barrier may comprise an electrical barrier configured to block the at least some charge carriers from reaching the one or more storage bins along the at least one secondary path.

In some embodiments, the electrical barrier may comprise a doped semiconductor region positioned above, below, and/or adjacent the one or more storage bins.

In some embodiments, the one or more storage bins may be positioned with respect to the photodetection region such that the electrical barrier comprises a region of bulk semiconductor material positioned therebetween.

Some aspects of the present disclosure relate to an integrated device, comprising a photodetection region, one or more storage bins spaced from the photodetection region in a first direction, and an optical barrier configured to block at least some photons from reaching the one or more charge storage bins.

In some embodiments, the optical barrier may comprise an at least partially opaque material.

In some embodiments, the at least partially opaque component may comprise a contact.

In some embodiments, the integrated device may further comprise a metal layer spaced from the photodetection region in a second direction perpendicular to the first direction, and the contact may be elongated from the metal layer toward the photodetection region.

In some embodiments, the contact may be electrically isolated from the photodetection region.

In some embodiments, the contact may be a first contact and the integrated device may further comprise a transfer gate disposed between the metal layer and the photodetection region in the second direction and a second contact elongated from the metal layer to the transfer gate, and the second contact may be electrically coupled to the transfer gate.

In some embodiments, the integrated device may further comprise a third contact elongated from the metal layer toward the photodetection region and electrically isolated from the photodetection region, and the first contact and the third contact may be disposed on opposite sides of the photodetection region in the first direction.

In some embodiments, the integrated device may further comprise a first pixel comprising the photodetection region and the one or more storage bins and a second pixel comprising a second photodetection region and one or more second storage bins, the first and second pixels may be spaced from one another in a third direction perpendicular to the first and second directions, and the first contact and the third contact may be configured to block at least some photons from reaching the one or more storage bins of the first pixel and the one or more second storage bins of the second pixel.

In some embodiments, the first contact and the third contact may be elongated in the third direction from the first pixel to the second pixel.

In some embodiments, the one or more storage bins may be one or more first charge storage bins, and the integrated device may further comprise one or more second storage bins spaced from the photodetection region in the first direction and spaced from the one or more first charge storage bins in a third direction perpendicular to the first and second directions.

In some embodiments, the integrated device may further comprise a transfer gate configured to control a flow of charge carriers from the photodetection region to the one or more storage bins, and a metal layer elongated in the first direction and spaced from the transfer gate in a second direction perpendicular to the first direction, and the contact may be elongated from the transfer gate to the metal layer.

In some embodiments, the at least partially opaque component may further comprise a via elongated from the metal layer to a second metal layer spaced from the metal layer in the second direction.

In some embodiments, the contact may be positioned cylindrically around the photodetection region.

In some embodiments, the contact may comprise metal.

In some embodiments, the integrated device may further comprise a transfer gate configured to control a flow of charge carriers from the photodetection region to the one or more storage bins, and the at least partially opaque component may comprise a layer positioned around the transfer gate.

In some embodiments, the layer may comprise a semiconductor-metal compound.

In some embodiments, the layer may comprise a dielectric film.

In some embodiments, the layer may comprise metal.

In some embodiments, the integrated device may further comprise a transfer gate configured to control a flow of charge carriers along the primary path, and the at least partially opaque component may comprise a portion of the transfer gate.

In some embodiments, the portion of the transfer gate may comprise metal.

In some embodiments, the portion may comprise an oxide component.

In some embodiments, the integrated device may further comprise a metal transfer gate configured to control a flow of charge carriers along the primary path, and the at least partially opaque component may comprise the metal transfer gate.

In some embodiments, the optical barrier may include an optical waveguide elongated from the photodetection region in a second direction perpendicular to the first direction.

Some aspects of the present disclosure relate to an integrated device, comprising a photodetection region, one or more storage bins coupled to the photodetection region via a primary path, and a doped semiconductor region configured to block at least some charge carriers from reaching the one or more storage bins along at least one secondary path.

In some embodiments, the doped semiconductor region may be positioned above, below, and/or adjacent the one or more storage bins.

In some embodiments, the integrated device may further comprise a bulk semiconductor region positioned around the photodetection region and the one or more storage bins, and the doped semiconductor region may be positioned between the one or more storage bins and the bulk semiconductor region.

In some embodiments, the doped semiconductor region may comprise an opposite conductivity type from the photodetection region and the one or more storage bins and may be configured to impede the at least some charge carriers from reaching the one or more storage bins.

In some embodiments, the doped semiconductor region may comprise a same conductivity type as the photodetection region and the one or more storage bins and may be configured to impede the at least some charge carriers from reaching the one or more storage bins.

Some aspects of the present disclosure relate to an integrated device comprising a photodetection region and one or more storage bins shaped and/or positioned along a primary path relative to the photodetection region as to enable receipt of first charge carriers along the primary path from the photodetection region and impede receipt of second charge carriers along at least one secondary path.

Some aspects of the present disclosure relate to an integrated device comprising a photodetection region configured to receive photons along a primary optical path and a first storage bin configured to receive charge carriers transferred laterally along a primary electrical path from the photodetection region, and the storage bin may be shaped and/or located to reduce receipt, by the storage bin, of undesirable charge carriers along at least one secondary path.

Some aspects of the present disclosure relate to a method comprising exciting a sample with a light pulse, receiving, at a photodetection region along a primary optical path, emissions from the sample, providing, by the photodetection region to a storage bin along a primary electrical path, first charge carriers indicative of the emissions, and limiting a number of photons and/or second charge carriers received by the storage bin through at least one secondary path.

In some embodiments, limiting the number of second charge carriers may comprise blocking, by an optical barrier positioned adjacent the storage bin, secondary path photons incident along the at least one secondary path from reaching the storage bin.

In some embodiments, receiving the emissions from the sample may comprise receiving the emissions along a first direction, and limiting the number of second charge carriers may comprise blocking, by a doped semiconductor region positioned adjacent the storage bin in a second direction perpendicular to the first direction, the second charge carriers from reaching the storage bin.

Some aspects of the present disclosure relate to an integrated device, comprising a photodetection region configured to receive fluorescent emission photons from a sample along a primary optical path, one or more storage bins electrically coupled to the photodetection region along a primary electrical path, and at least one barrier configured to block at least some photons from reaching the one or more storage bins along at least one secondary optical path different from the primary optical path, and/or at least some photo-electrons from reaching the one or more storage bins along at least one secondary electrical path different from the primary electrical path.

Some aspects of the present disclosure relate to a method of performing at least partial sequencing and/or analysis of a sample, the method comprising exciting the sample with a light pulse, receiving, at a photodetection region along a primary optical path, emissions from the sample, providing, by the photodetection region to a storage bin along a primary electrical path, first charge carriers indicative of the emissions, and limiting a number of photons and/or second charge carriers received by the storage bin through at least one secondary path.

In some embodiments, the at least partial sequencing and/or analysis may include at least one of DNA sequencing, RNA sequencing, and/or protein sequencing.

The foregoing summary is not intended to be limiting. Moreover, various aspects of the present disclosure may be implemented alone or in combination.

BRIEF DESCRIPTION OF DRAWINGS

Various aspects and embodiments of the present disclosure will be described with reference to the following figures. It should be appreciated that the figures are not necessarily drawn to scale. Items appearing in multiple figures are indicated by the same reference number in all the figures in which they appear.

FIG. 1-1A is a schematic of an integrated device, according to some embodiments.

FIG. 1-1B is a schematic of a pixel of an integrated device, according to some embodiments.

FIG. 1-1C is a circuit diagram of the pixel of FIG. 1-1B, according to some embodiments.

FIG. 1-1D is a plan view of the pixel of FIGS. 1-1B and 1-1C, according to some embodiments.

FIG. 2-1 is a schematic of a pixel including a contact as an optical barrier, according to some embodiments.

FIG. 2-2A is a schematic of a pixel including a plurality of contacts as an optical barrier, according to some embodiments.

FIG. 2-2B is a top view of a portion of an integrated device including the pixel of FIG. 2-2A, according to some embodiments.

FIG. 2-3 is a schematic of a pixel including a contact coupled to a transfer gate as an optical barrier, according to some embodiments.

FIG. 2-4A is a schematic of a pixel including a contact wall and a plurality of via walls as an optical barrier, according to some embodiments.

FIG. 2-4B is a perspective view of an alternative pixel including a contact wall and a plurality of via walls as an optical barrier, according to some embodiments.

FIG. 2-4C is a perspective view of a further alternative pixel including a contact wall and a plurality of via walls as an optical barrier, according to some embodiments.

FIG. 2-5 is a schematic of a pixel including a metal layer as an optical barrier, according to some embodiments.

FIG. 2-6 is a schematic of a pixel including a plurality of metal transfer gates as an optical barrier, according to some embodiments.

FIG. 2-7 is a schematic of a pixel including a plurality of opaque layers disposed over a plurality of transfer gates as an optical barrier, according to some embodiments.

FIG. 2-8A is a plan view of a pixel including an array of pillars as an optical barrier, according to some embodiments.

FIG. 2-8B is a perspective view of the pixel of FIG. 2-8A, according to some embodiments.

FIG. 2-9A is a plan view of a pixel including an array of lines as an optical barrier, according to alternative embodiments.

FIG. 2-9B is a perspective view of the pixel of FIG. 2-9A according to some embodiments.

FIG. 2-10A is a plan view of a pixel including an optical waveguide as an optical barrier, according to some embodiments.

FIG. 2-10B is a perspective view of the pixel of FIG. 2-10A according to some embodiments.

FIG. 2-10C is a graph illustrating an isolation ratio between a storage bin and a photodetection region versus refractive index of the optical waveguide for the pixel of FIG. 2-10A, according to some embodiments.

FIG. 3-1 is a schematic of a pixel including a doped semiconductor well as an electrical barrier, according to some embodiments.

FIG. 3-2 is a schematic of a pixel including a doped semiconductor barrier as an electrical barrier, according to some embodiments.

FIG. 3-3A is a plan view of a pixel including two doped semiconductor wells as an electrical barrier, according to some embodiments.

FIG. 3-3B is a plan view of a pixel including four doped semiconductor wells as an electrical barrier, according to some embodiments.

FIG. 3-4A is a plan view of a pixel including two doped semiconductor barriers as an electrical barrier, according to some embodiments.

FIG. 3-4B is a plan view of a pixel including four doped semiconductor barriers as an electrical barrier, according to some embodiments.

FIG. 3-5 is a schematic of an alternative pixel including a doped semiconductor barrier as an electrical barrier, according to some embodiments.

FIG. 4-1 is a graph of electric potential vs. positioning within a pixel having an electrical barrier, according to some embodiments.

FIG. 4-2 is a graph of relative isolation vs. spacing from the photodetection region for the storage bin of FIG. 4-1, according to some embodiments.

FIG. 4-3 is a schematic of a pixel having a storage bin with reduced depth, according to some embodiments.

FIG. 4-4 is a graph of electric potential vs. depth for the pixel of FIG. 4-3, according to some embodiments.

FIG. 5-1A is a block diagram of an integrated device and an instrument, according to some embodiments.

FIG. 5-1B is a schematic of an apparatus including an integrated device, according to some embodiments.

FIG. 5-1C is a block diagram depiction of an analytical instrument that includes a compact mode-locked laser module, according to some embodiments.

FIG. 5-1D depicts a compact mode-locked laser module incorporated into an analytical instrument, according to some embodiments.

FIG. 5-2 depicts a train of optical pulses, according to some embodiments.

FIG. 5-3 depicts an example of parallel reaction chambers that can be excited optically by a pulsed laser via one or more waveguides according to some embodiments.

FIG. 5-4 illustrates optical excitation of a reaction chamber from a waveguide, according to some embodiments.

FIG. 5-5 depicts further details of an integrated reaction chamber, optical waveguide, and time-binning photodetector, according to some embodiments.

FIG. 5-6 depicts an example of a biological reaction that can occur within a reaction chamber, according to some embodiments.

FIG. 5-7 depicts emission probability curves for two different fluorophores having different decay characteristics according to some embodiments.

FIG. 5-8 depicts time-binning detection of fluorescent emission, according to some embodiments.

FIG. 5-9 depicts a time-binning photodetector, according to some embodiments.

FIG. 5-10A depicts pulsed excitation and time-binned detection of fluorescent emission from a sample, according to some embodiments.

FIG. 5-10B depicts a histogram of accumulated fluorescent photon counts in various time bins after repeated pulsed excitation of a sample, according to some embodiments.

FIG. 5-11A-5-11D depict different histograms that may correspond to four nucleotides (T, A, C, G) or nucleotide analogs, according to some embodiments.

FIG. 5-12 is a flow diagram illustrating a method of sequencing a labeled polypeptide by Edman degradation according to some embodiments.

FIG. 5-13 includes a flow diagram illustrating a method of sequencing in which discrete binding events give rise to signal pulses of a signal output, and a graph illustrating the signal output according to some embodiments.

FIG. 6-1A is a diagram of a first step of an exemplary method for constructing contacts of the pixel of FIGS. 2-2A and 2-2B, according to some embodiments.

FIG. 6-1B is a diagram of a first etching step of the method of FIG. 6-1A, according to some embodiments.

FIG. 6-1C is a diagram of a second etching step of the method of FIG. 6-1A, according to some embodiments.

FIG. 6-1D is a diagram of a step subsequent to the second etching step of the method of FIG. 6-1A, according to some embodiments.

FIG. 6-1E is a diagram of a metal depositing step of the method of FIG. 6-1A, according to some embodiments.

FIG. 6-2A is a diagram of a first step of an alternative exemplary method for constructing contacts of the pixel of FIGS. 2-2A and 2-2B, according to some embodiments.

FIG. 6-2B is a diagram of a first etching step of the method of FIG. 6-2A, according to some embodiments.

FIG. 6-2C is a diagram of a first metal depositing step of the method of FIG. 6-2A, according to some embodiments.

FIG. 6-2D is a diagram of a second etching step of the method of FIG. 6-2A, according to some embodiments.

FIG. 6-2E is a diagram of a second metal depositing step of the method of FIG. 6-2A, according to some embodiments.

FIG. 6-3A is a diagram of a first step of an exemplary method for constructing the metal layer of FIG. 2-5, according to some embodiments.

FIG. 6-3B is a diagram of a first etching step of the method of FIG. 6-3A, according to some embodiments.

FIG. 6-3C is a diagram of a first metal deposit step of the method of FIG. 6-3A, according to some embodiments.

FIG. 6-3D is a diagram of a second metal deposit step of the method of FIG. 6-3A, according to some embodiments.

FIG. 6-4A is a diagram of a first step of an alternative exemplary method for constructing the metal layer of FIG. 2-5, according to some embodiments.

FIG. 6-4B is a diagram of a first metal deposit step of the method of FIG. 6-4A, according to some embodiments.

FIG. 6-4C is a diagram of a first etching step of the method of FIG. 6-4A, according to some embodiments.

FIG. 6-4D is a diagram of a second metal deposit step of the method of FIG. 6-4A, according to some embodiments.

Figures 1, 1B:
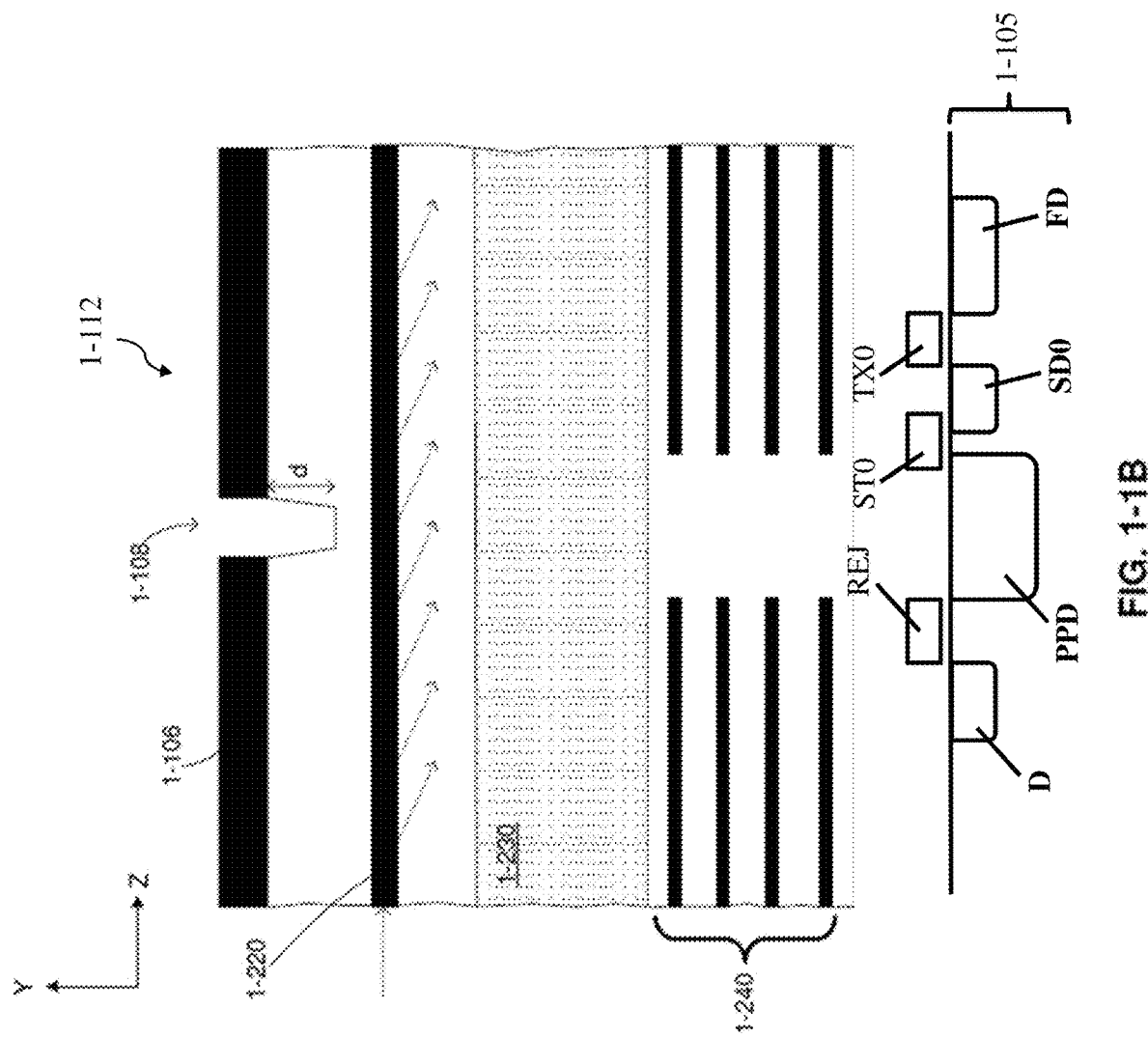

The features and advantages of the present invention will become more apparent from the detailed description set forth below when taken in conjunction with the drawings. When describing embodiments in reference to the drawings, directional references ("above," "below," "top," "bottom," "left," "right," "horizontal," "vertical," etc.) may be used. Such references are intended merely as an aid to the reader viewing the drawings in a normal orientation. These directional references are not intended to describe a preferred or only orientation of features of an embodied device. A device may be embodied using other orientations.

DETAILED DESCRIPTION

I. Introduction

Aspects of the present disclosure relate to integrated devices, instruments and related systems capable of analyzing samples in parallel, including identification of single molecules and nucleic acid sequencing. Such an instrument may be compact, easy to carry, and easy to operate, allowing a physician or other provider to readily use the instrument and transport the instrument to a desired location where care may be needed. Analysis of a sample may include labeling the sample with one or more fluorescent markers, which may be used to detect the sample and/or identify single molecules of the sample (e.g., individual nucleotide identification as part of nucleic acid sequencing). A fluorescent marker may become excited in response to illuminating the fluorescent marker with excitation light (e.g., light having a characteristic wavelength that may excite the fluorescent marker to an excited state) and, if the fluorescent marker becomes excited, emit emission light (e.g., light having a characteristic wavelength emitted by the fluorescent marker by returning to a ground state from an excited state). Detection of the emission light may allow for identification of the fluorescent marker, and thus, the sample or a molecule of the sample labeled by the fluorescent marker. According to some embodiments, the instrument may be capable of massively-parallel sample analyses and may be configured to handle tens of thousands of samples or more simultaneously.

The inventors have recognized and appreciated that an integrated device, having sample wells configured to receive the sample and integrated optics formed on the integrated device, and an instrument configured to interface with the integrated device may be used to achieve analysis of this number of samples. The instrument may include one or more excitation light sources, and the integrated device may interface with the instrument such that the excitation light is delivered to the sample wells using integrated optical components (e.g., waveguides, optical couplers, optical splitters) formed on the integrated device. The optical components may improve the uniformity of illumination across the sample wells of the integrated device and may reduce a large number of external optical components that might otherwise be needed. Furthermore, the inventors have recognized and appreciated that integrating photodetectors (e.g., photodiodes) on the integrated device may improve detection efficiency of fluorescent emissions from the sample wells and reduce the number of light-collection components that might otherwise be needed.

In some embodiments, the integrated device may receive emission photons and transmit charge carriers along a primary path. For example, a photodetector may be positioned on the integrated device to receive the fluorescent emissions along a primary optical path, and the photodetector also may be coupled to one or more storage bins (e.g., storage diodes) along one or more primary electrical paths, such that the storage bin(s) may collect charge carriers generated in the photodetector based on the fluorescent emissions. In some embodiments, during a collection period, the storage bin(s) may receive the charge carriers from the photodetector, and during a separate readout period, the storage bin(s) may provide the stored charge carriers to a readout circuit for processing.

Challenges may arise in collecting fluorescent emission charge carriers in the storage bins because undesirable charge carriers may be incident upon the storage bins, in addition to desirable charge carriers. More specifically, noise charge carriers generated by undesired photons incident on the storage bins along secondary paths (e.g., secondary optical paths other than the primary optical path from the sample well to the photodetector) may generate problematic quantities of noise charge carriers in and/or around the storage bins. For instance, to reliably excite a fluorescent marker, excitation light coupled into the integrated device and delivered to individual sample wells may be at such a relatively high power level that large quantities of excitation light photons may reach the storage bins along the secondary optical paths and generate noise charge carriers therein. Alternatively or additionally, when multiple sample wells are positioned in close proximity to one another, photons of excitation light illuminating one sample well, and/or fluorescent emissions from the sample well, may reach a storage bin of another sample well and generate noise charge carriers therein. More specifically, in cases where fluorescent emission charge carriers from a sample well are to be selectively stored in different storage bins (e.g., in a first storage bin over a first period and in a second storage bin over a second period), fluorescent emission charge carriers intended for storage in a first storage bin may reach the other storage bin and generate noise charge carriers therein, causing cross-pollution among the storage bins. Further challenges may arise due to undesired charge carriers (e.g., photo-electrons and/or holes generated in the photodetector based on excitation photons from the excitation light source and/or emission photons from neighboring sample wells) flowing into the storage bins along secondary electrical paths from elsewhere in the integrated device.

To solve the above problems, the inventors have developed techniques to reduce or eliminate the impact of secondary optical path photons and/or secondary electrical path charge carriers on the storage bins to improve noise performance, and thus, sample analysis. Such techniques may include optically rejecting some or all of the secondary optical path photons from reaching the storage bins, and/or electrically rejecting noise charge carriers from reaching the storage bins along secondary electrical paths within the device. For a charge carrier representing a single primary optical path photon of emission light to be stored in a storage bin, between hundreds and millions of secondary optical path photons and/or secondary electrical path charge carriers of excitation light may need to be optically and/or electrically rejected from reaching the storage bins, according to some embodiments.

Some embodiments relate to optical rejection techniques. In some embodiments, an integrated device includes an optical barrier configured to block at least some secondary optical path photons from reaching the storage bins. For example, in some embodiments, the optical barrier may include metal, such as a metal layer positioned around a transfer gate (e.g., electrode, control terminal, etc.) configured to bias a transmission channel between the photodetector and the storage bins, and/or a metal portion of the transfer gate. Alternatively or additionally, in some embodiments, the optical barrier may include one or more opaque layers disposed within or around the transfer gate, such as a silicide layer and/or an oxide component.

Some embodiments relate to electrical rejection techniques. In some embodiments, an integrated device includes an electric potential barrier (e.g., a doped region) configured to block at least some charge carriers from reaching the storage bins along at least one secondary electrical path. For example, the electric potential barrier may include a doped region positioned below and/or adjacent to one or more of the storage bins, the doped region including a p-doped barrier and/or an n-doped well configured to repel and/or attract charge carriers away from the storage bin(s). Some embodiments relate to an integrated device in which at least one storage bin is shaped and/or positioned relative to the photodetector to facilitate receipt of some charge carriers (e.g., fluorescent emission charge carriers) and to impede receipt of noise charge carriers traveling along secondary electrical paths (e.g., noise charge carriers). For example, the storage bin(s) may have a shallow depth, and/or may be positioned far from the photodetector.

It should be appreciated that integrated devices described herein may incorporate one or more optical and/or electrical rejection techniques herein alone or in combination.

II. Integrated Device Overview

Figures 1A, 5:
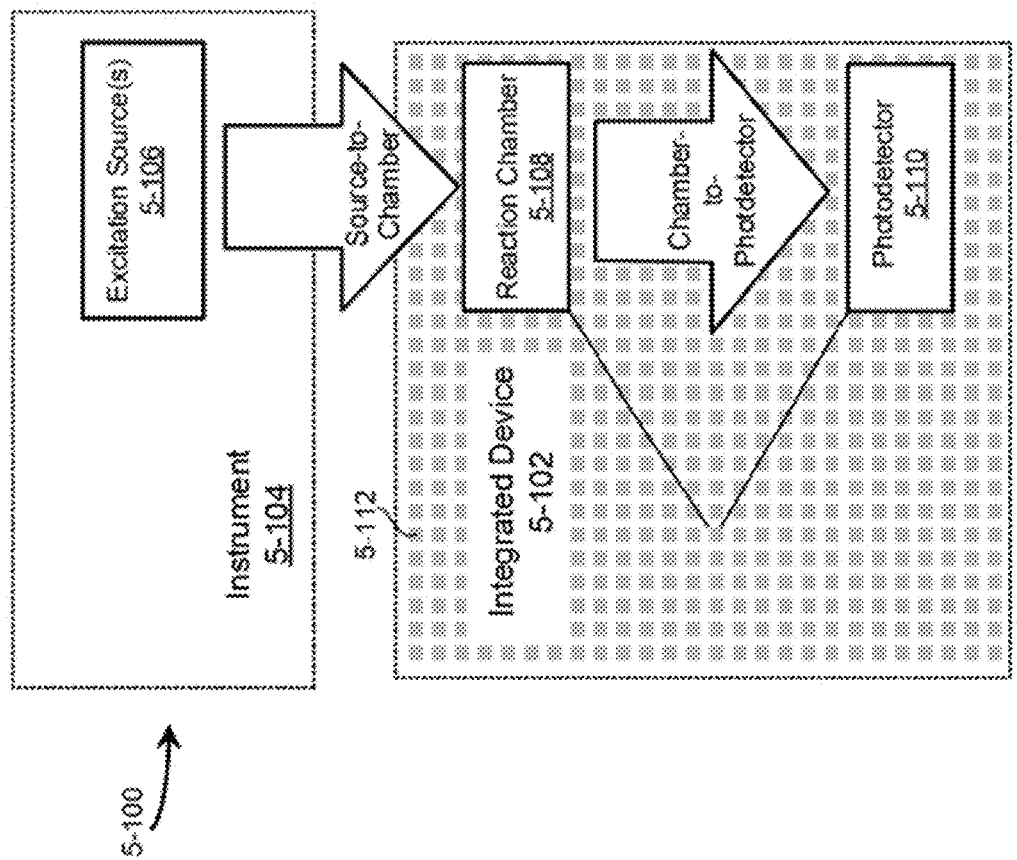
Figures 1B, 5:
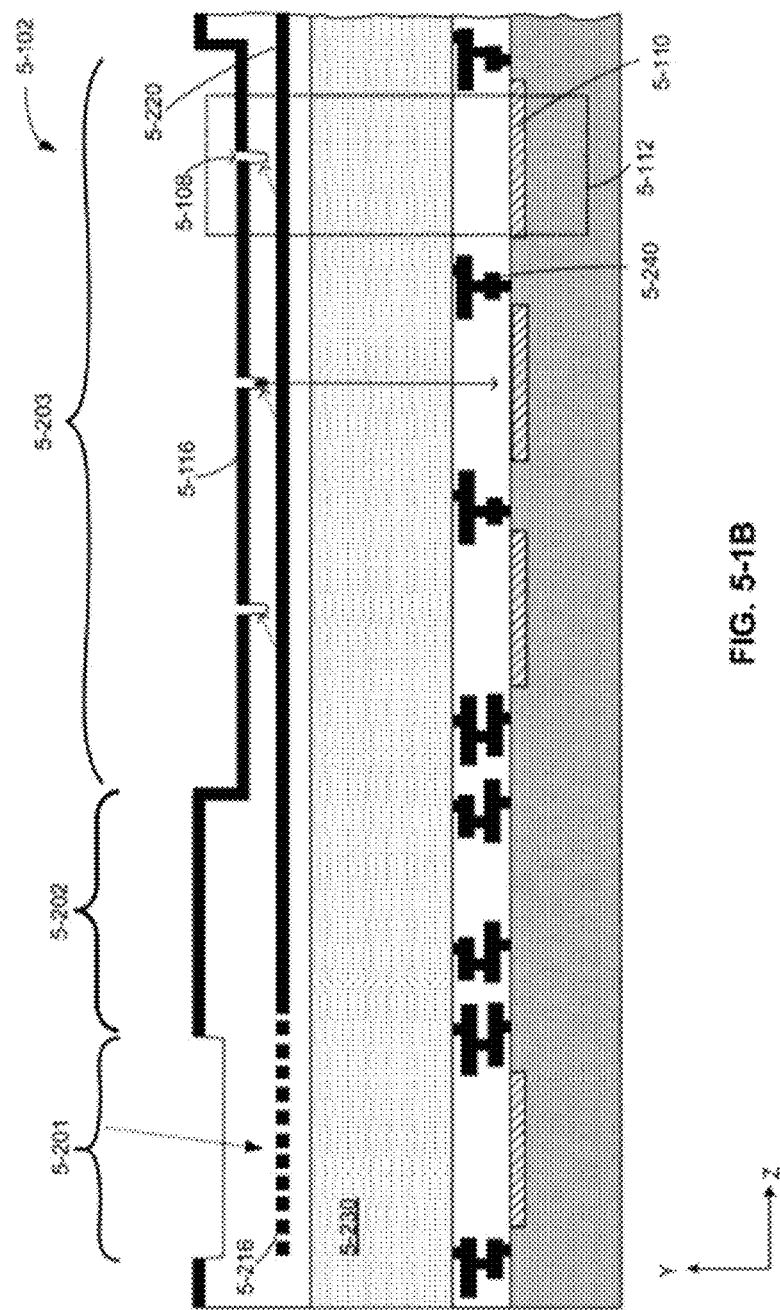
Figures 1C, 5:
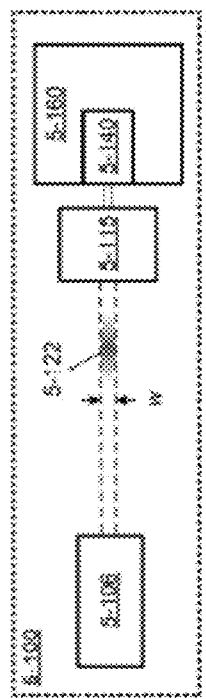
Figures 1D, 5:
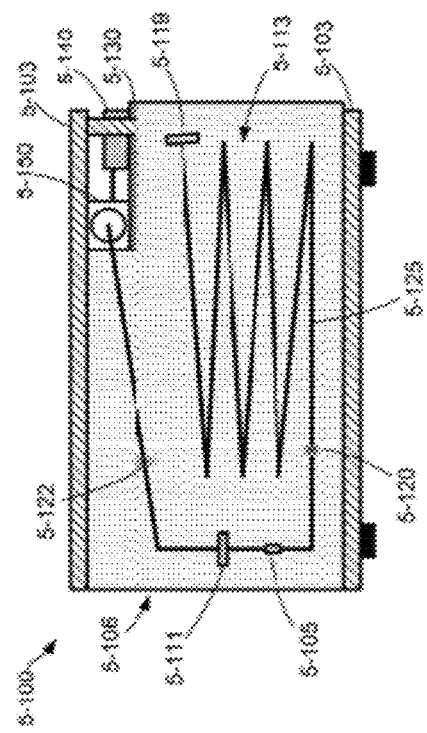
Figures 2, 5:
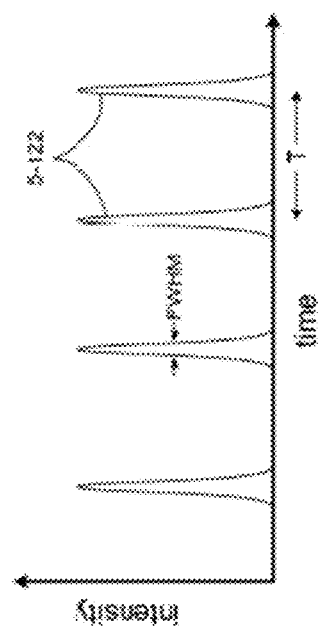
Figures 3, 5:
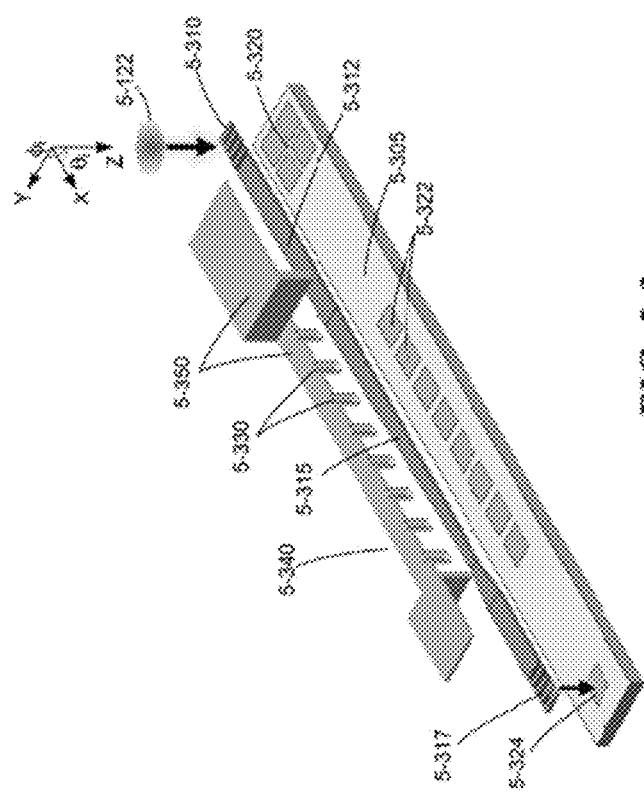
Figures 4, 5:
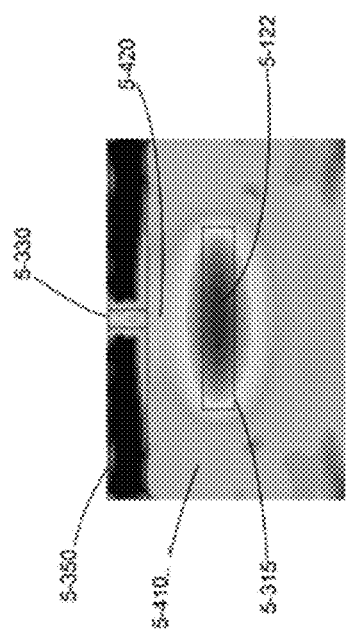
Figure 5:
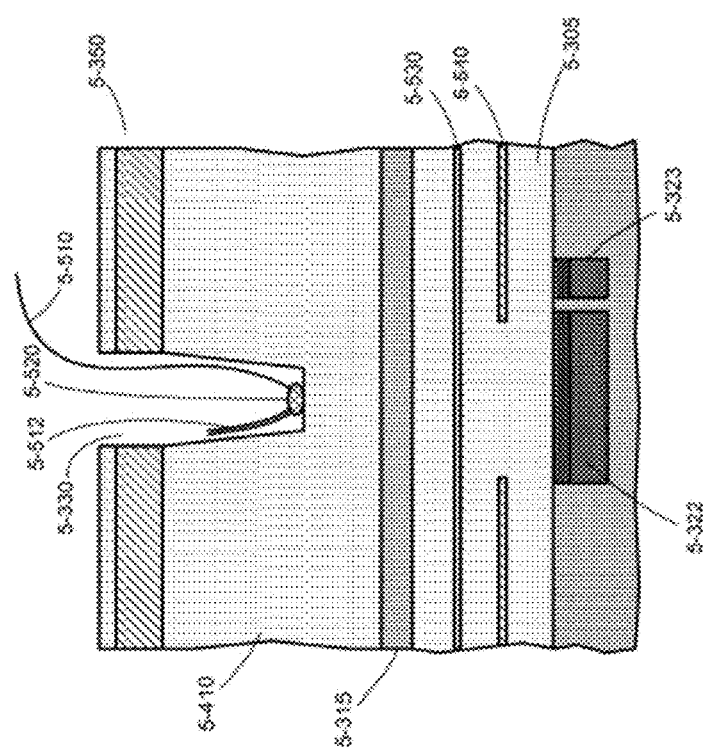
Figures 5, 6:
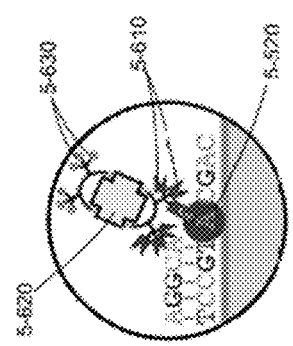
Figures 5, 6, 7:
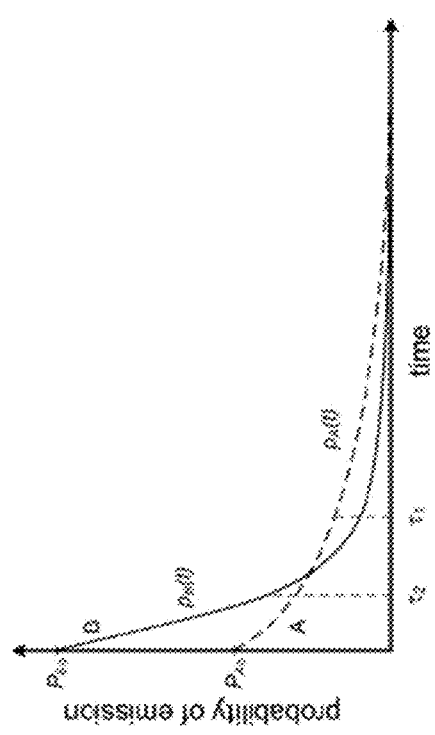
Figures 5, 6, 7, 8:
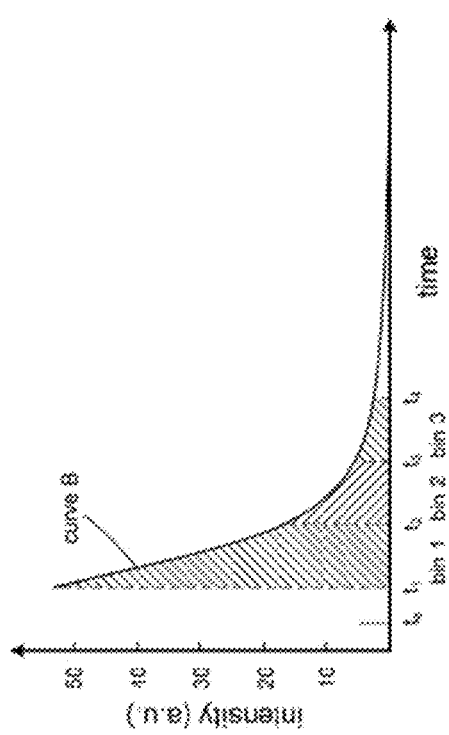
Figures 5, 6, 7, 8, 9:
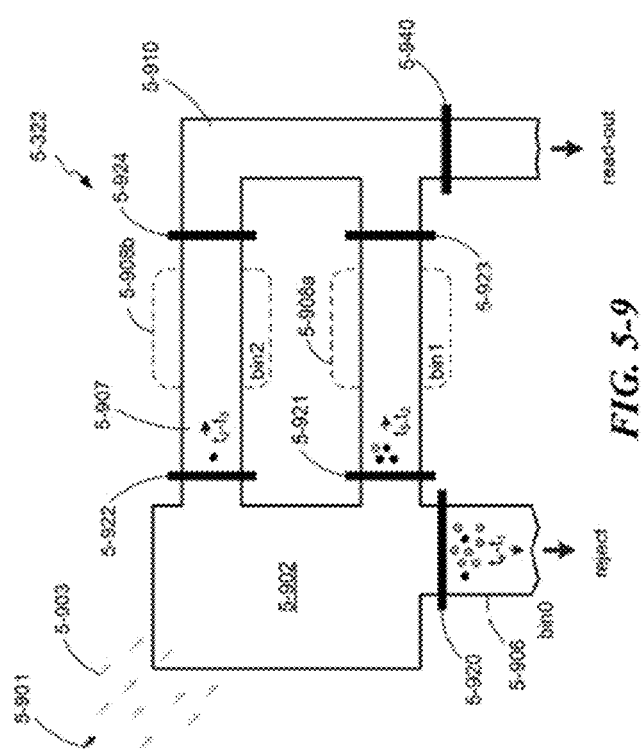
Figures 5, 6, 7, 8, 9, 10, 10A:
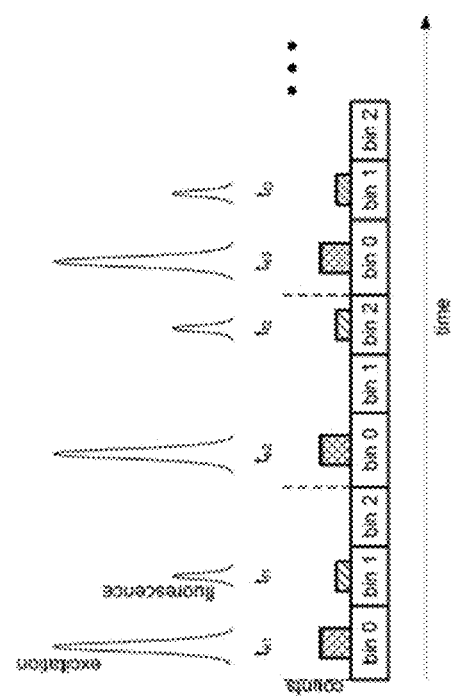
Figures 5, 6, 7, 8, 9, 10, 10B:
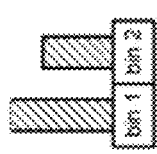
Figures 5, 6, 7, 8, 9, 10, 11, 11B:
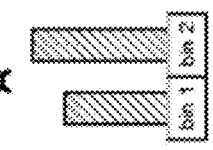
Figures 5, 6, 7, 8, 9, 10, 11, 11D:
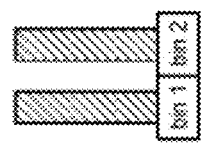
Figures 5, 6, 7, 8, 9, 10, 11, 11A:
Figures 5, 6, 7, 8, 9, 10, 11, 11C:
Figures 5, 6, 7, 8, 9, 10, 11, 12:
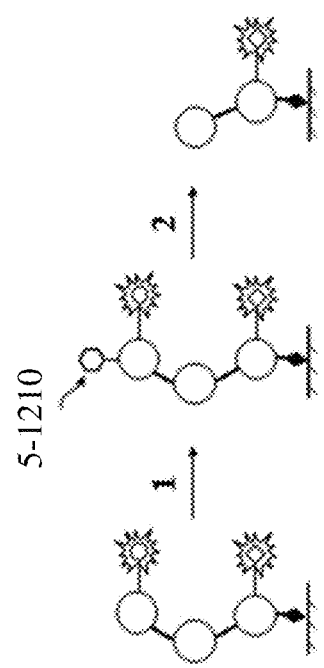
Figures 5, 6, 7, 8, 9, 10, 11, 12, 13:
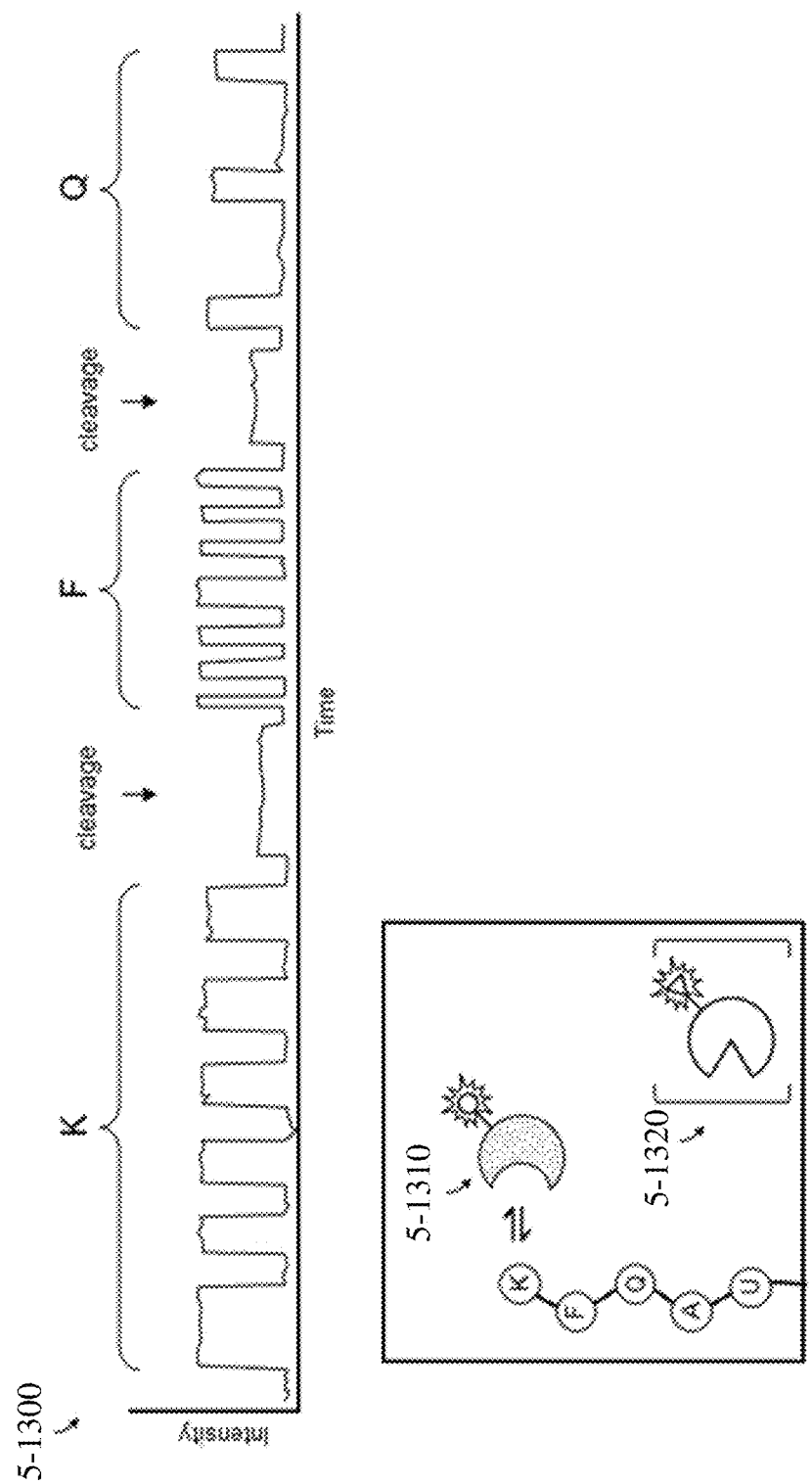

A cross-sectional schematic of integrated device 1-102 illustrating a row of pixels 1-112 is shown in FIG. 1-1A. Integrated device 1-102 may include coupling region 1-201, routing region 1-202, and pixel region 1-203. Pixel region 1-203 may include a plurality of pixels 1-112 having sample wells 1-108 positioned on a surface at a location separate from coupling region 1-201, which is where excitation light (shown as the dashed arrow) couples to integrated device 1-102. Sample wells 1-108 may be formed through metal layer(s) 1-106. One pixel 1-112, illustrated by the dotted rectangle, is a region of integrated device 1-102 that includes a sample well 1-108 and a photodetection region having one or more photodetectors 1-110.

FIG. 1-1A illustrates the path of excitation (shown in dashed lines) by coupling a beam of excitation light to coupling region 1-201 and to sample wells 1-108. The row of sample wells 1-108 shown in FIG. 1-1A may be positioned to optically couple with waveguide 1-220. Excitation light may illuminate a sample located within a sample well. The sample may reach an excited state in response to being illuminated by the excitation light. When a sample is in an excited state, the sample may emit emission light, which may be detected by one or more photodetectors associated with the sample well. FIG. 1-1A schematically illustrates the primary path of emission light (shown as the solid line) from a sample well 1-108 to photodetector(s) 1-110 of pixel 1-112, which may be disposed in or on substrate 1-105. The photodetector(s) 1-110 of pixel 1-112 may be configured and positioned to detect emission light from sample well 1-108. Examples of suitable photodetectors are described in U.S. patent application Ser. No. 14/821,656 titled "INTEGRATED DEVICE FOR TEMPORAL BINNING OF RECEIVED PHOTONS," which is incorporated by reference in its entirety. For an individual pixel 1-112, a sample well 1-108 and its respective photodetector(s) 1-110 may be aligned along a common axis (along the y-direction shown in FIG. 1-1A). In this manner, the photodetector(s) may overlap with the sample well within a pixel 1-112.

The directionality of the emission light from a sample well 1-108 may depend on the positioning of the sample in the sample well 1-108 relative to metal layer(s) 1-106 because metal layer(s) 1-106 may act to reflect emission light. In this manner, a distance between metal layer(s) 1-106 and a fluorescent marker positioned in a sample well 1-108 may impact the efficiency of photodetector(s) 1-110, that are in the same pixel as the sample well, to detect the light emitted by the fluorescent marker. The distance between metal layer(s) 1-106 and the bottom surface of a sample well 1-106, which is proximate to where a sample may be positioned during operation, may be in the range of 100 nm to 500 nm, or any value or range of values in that range. In some embodiments the distance between metal layer(s) 1-106 and the bottom surface of a sample well 1-106 is approximately 300 nm.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a sample well 1-106 and photodetector(s) may be in the range of 5 μm to 15 μm, or any value or range of values in that range. It should be appreciated that, in some embodiments, emission light may be provided through other means than an excitation light source and a sample well. Accordingly, some embodiments may not include sample well 1-108.

Photonic structure(s) 1-230 may be positioned between sample wells 1-108 and photodetectors 1-110 and configured to reduce or prevent excitation light from reaching photodetectors 1-110, which may otherwise contribute to signal noise in detecting emission light. As shown in FIG. 1-1A, the one or more photonic structures 1-230 may be positioned between waveguide 1-220 and photodetectors 1-110. Photonic structure(s) 1-230 may include one or more optical rejection photonic structures including a spectral filter, a polarization filter, and a spatial filter. Photonic structure(s) 1-230 may be positioned to align with individual sample wells 1-108 and their respective photodetector(s) 1-110 along a common axis. Metal layers 1-240, which may act as a circuitry for integrated device 1-102, may also act as a spatial filter, or polarization filter, in accordance with some embodiments. In such embodiments, one or more metal layers 1-240 may be positioned to block some or all excitation light from reaching photodetector(s) 1-110.

Coupling region 1-201 may include one or more optical components configured to couple excitation light from an external excitation source. Coupling region 1-201 may include grating coupler 1-216 positioned to receive some or all of a beam of excitation light. Examples of suitable grating couplers are described in U.S. Pat. Application 62/435,693 titled "OPTICAL COUPLER AND WAVEGUIDE SYSTEM," which is incorporated by reference in its entirety. Grating coupler 1-216 may couple excitation light to waveguide 1-220, which may be configured to propagate excitation light to the proximity of one or more sample wells 1-108. Alternatively, coupling region 1-201 may comprise other well-known structures for coupling light into a waveguide.

Components located off of the integrated device may be used to position and align the excitation source 1-106 to the integrated device. Such components may include optical components including lenses, mirrors, prisms, windows, apertures, attenuators, and/or optical fibers. Additional mechanical components may be included in the instrument to allow for control of one or more alignment components. Such mechanical components may include actuators, stepper motors, and/or knobs. Examples of suitable excitation sources and alignment mechanisms are described in U.S. patent application Ser. No. 15/161,088 titled "PULSED LASER AND SYSTEM," which is incorporated by reference in its entirety. Another example of a beam-steering module is described in U.S. Pat. Application 62/435,679 titled "COMPACT BEAM SHAPING AND STEERING ASSEMBLY," which is incorporated herein by reference.

A sample to be analyzed may be introduced into sample well 1-108 of pixel 1-112. The sample may be a biological sample or any other suitable sample, such as a chemical sample. The sample may include multiple molecules and the sample well may be configured to isolate a single molecule. In some instances, the dimensions of the sample well may act to confine a single molecule within the sample well, allowing measurements to be performed on the single molecule. Excitation light may be delivered into the sample well 1-108, so as to excite the sample or at least one fluorescent marker attached to the sample or otherwise associated with the sample while it is within an illumination area within the sample well 1-108.

In operation, parallel analyses of samples within the sample wells are carried out by exciting some or all of the samples within the wells using excitation light and detecting signals from sample emission with the photodetectors. Emission light from a sample may be detected by a corresponding photodetector and converted to at least one electrical signal. The electrical signals may be transmitted along conducting lines (e.g., metal layers 1-240) in the circuitry of the integrated device, which may be connected to an instrument interfaced with the integrated device. The electrical signals may be subsequently processed and/or analyzed. Processing or analyzing of electrical signals may occur on a suitable computing device either located on or off the instrument.

FIG. 1-1B illustrates a cross-sectional view of a pixel 1-112 of integrated device 1-102. Pixel 1-112 includes photodetection region PPD, which may be a pinned photodiode, and a storage bin SD0, which may be a storage diode. During operation of pixel 1-112, excitation light may illuminate sample well 1-108 causing primary path photons, including fluorescence emissions from a sample, to flow along a primary path to photodetection region PPD. When transfer gate ST0 induces a first electrical bias at the semiconductor region between photodetection region PPD and storage bin SD0, a primary electrical path may be formed in the semiconductor region. Charge carriers (e.g., photo-electrons) generated in photodetection region PPD by the primary optical path photons may flow along the primary electrical path to storage bin SD0. In some embodiments, the first electrical bias may be applied during a binning period during which charge carriers from the sample are selectively directed to storage bin SD0. Alternatively, when transfer gate ST0 provides a second electrical bias at the semiconductor region between photodetection region PPD and storage bin SD0, charge carriers from photodetection region PPD may be blocked from reaching storage bin SD0 along the primary electrical path. For example, in some embodiments, transfer gate REJ may provide a channel to drain D to draw noise charge carriers generated in photodetection region PPD by the excitation light away from photodetection region PPD and storage bin SD0, such as during a rejection period before fluorescent emission photons from the sample reach photodetection region PPD. In some embodiments, during a readout period, transfer gate ST0 may provide the second electrical bias and transfer gate TX0 may provide an electrical bias to cause charge carriers stored in storage bin SD0 to flow to the readout region FD, which may be a floating diffusion region, for processing. It should be appreciated that, in accordance with various embodiments, transfer gates described herein may include semiconductor material(s) and/or metal, and may include a gate of a field effect transistor (FET), a base of a bipolar junction transistor (BJT), and/or the like.

The inventors recognized that, unless blocked from reaching storage bin SD0, secondary optical path photons (e.g., from the excitation light) may generate noise charge carriers in storage bin SD0. Because the noise charge carriers may be virtually indistinguishable from fluorescent emission charge carriers, it may be impossible to extract a reading of the fluorescent emission charge carriers from the noise charge carriers. Accordingly, the inventors developed techniques for preventing secondary optical path photons from reaching storage bin SD0, described further herein including with reference to section III.

Figures 1, 1D:
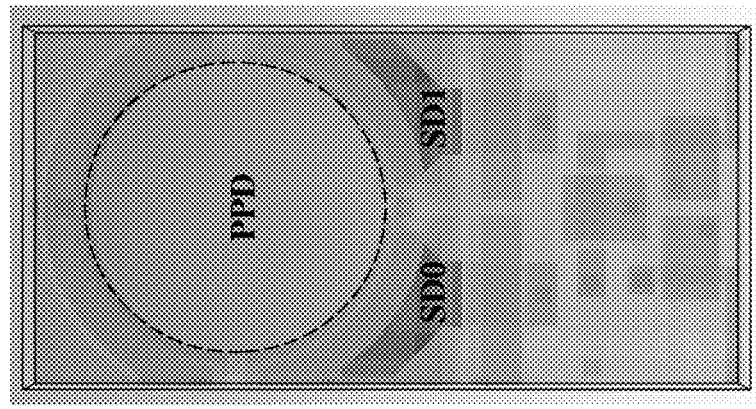
Figures 1, 1C:
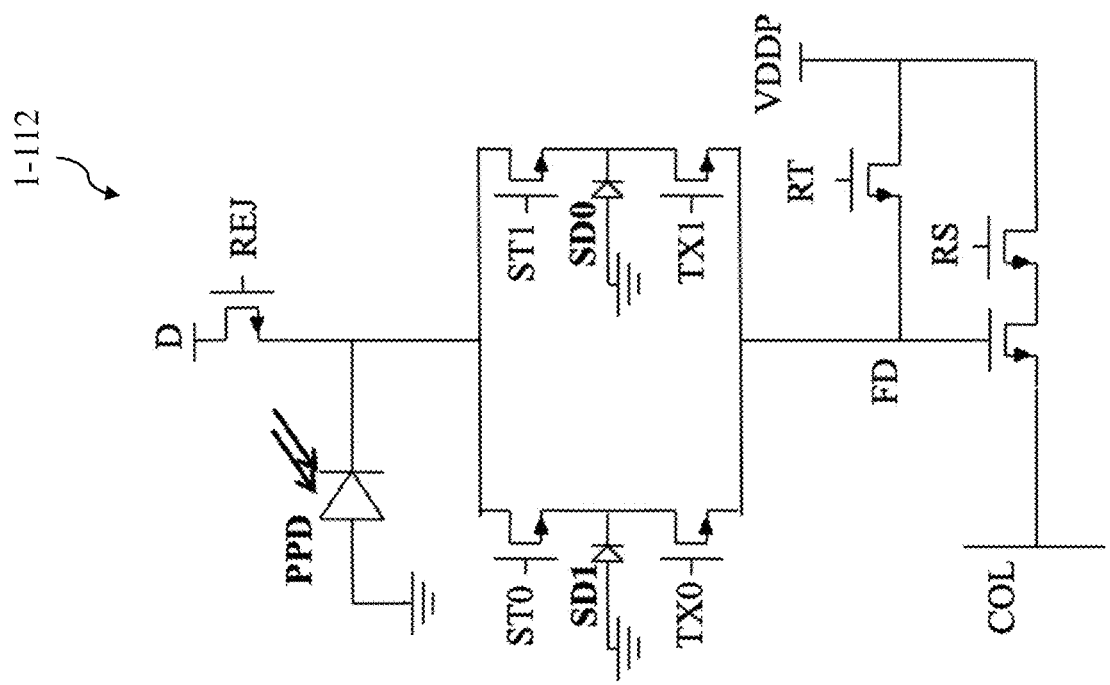

FIG. 1-1C is a circuit diagram of pixel 1-112 of FIG. 1-1B, according to some embodiments. In FIG. 1-1C, photodetection region PPD is coupled to multiple storage bins SD0 and SD1. Storage bin SD1 and transfer gate ST1 may be configured in the manner described for storage bin SD0 and transfer gate ST0. Pixel 1-112 may be configured such that only one of storage bins SD0 and SD1 receive charge carriers from photodetection region PPD at a given time. For example, storage bins SD0 and SD1 may have binning periods that are separated in time, with transfer gate ST0 enabling flow of charge carriers to storage bin SD0 during the binning period for storage bin SD0, and with transfer gate ST1 enabling flow of charge carriers to storage bin SD1 during the binning period for storage bin SD1 Likewise, pixel 1-112 may be configured such that only one of storage bins SD0 and SD1 may provide charge carriers to readout region FD. For example, storage bins SD0 and SD1 may have readout periods that are separated in time, with transfer gate TX0 enabling flow of charge carriers from storage bin SD0 during the readout period for storage bin SD0, and with transfer gate TX1 enabling flow of charge carriers from storage bin SD1 during the readout period for storage bin SD1.

FIG. 1-1D is a plan view of the pixel of FIGS. 1-1B and 1-1 illustrating the relative positioning of storage bins SD0 and SD1 relative to photodetection region PPD.

The inventors recognized that secondary electrical path charge carriers (e.g., photo-electrons) may flow to storage bins SD0 and SD1 from outside of storage bins SD0 and SD1. In some cases, fluorescent emission charge carriers received during the binning period for storage bin SD0 may flow to storage bin SD1 along one or more secondary electrical paths. Alternatively or additionally, noise charge carriers generated in pixel 1-112 outside of storage bins SD0 and SD1 (e.g., from the excitation light) may flow to storage bins SD0 and SD1 along the secondary electrical paths. Because the undesired charge carriers may be virtually indistinguishable from fluorescent emission charge carriers, it may be impossible to extract a reading of the correct fluorescent emission charge carriers from storage bins SD0 and SD1. Accordingly, the inventors developed techniques for blocking undesired charge carriers from reaching storage bins SD0 and SD1 along the secondary electrical paths. For example, techniques described herein may block fluorescent emission charge carriers intended for storage bin SD0 from reaching storage bin SD1 and/or noise charge carriers (e.g., photo electrons) generated by secondary path photons outside of storage bins SD0 and SD1 from reaching storage bins SD0 and SD1 along secondary electrical paths. Such techniques are described further herein including with reference to sections III and IV.

It should be appreciated that, in embodiments which do not include a sample well configured to receive light from an excitation source, secondary optical path photons may include any undesired photons which may reach pixel 1-112 in addition to desired emission photons. Likewise, secondary electrical path charge carriers may be generated (e.g., in photodetection region PPD) in response to the undesired photons reaching pixel 1-112.

III. Techniques for Optical Rejection

As described herein, the inventors have developed techniques for rejecting secondary optical path photons to prevent the photons from generating noise charge carriers in the storage bin(s), thereby impacting signal quality in the integrated device. Techniques described herein include implementing one or more contacts, walls, at least partially opaque layers, photonic element arrays, and/or optical waveguides positioned to block and/or divert secondary optical path photons from reaching the photodetection region and/or storage bin(s). Any or each pixel described herein may be included in an integrated device (e.g., integrated device 102). It should be appreciated that techniques for secondary optical path rejection may also be useful for secondary electrical path rejection.

Figures 1, 2:
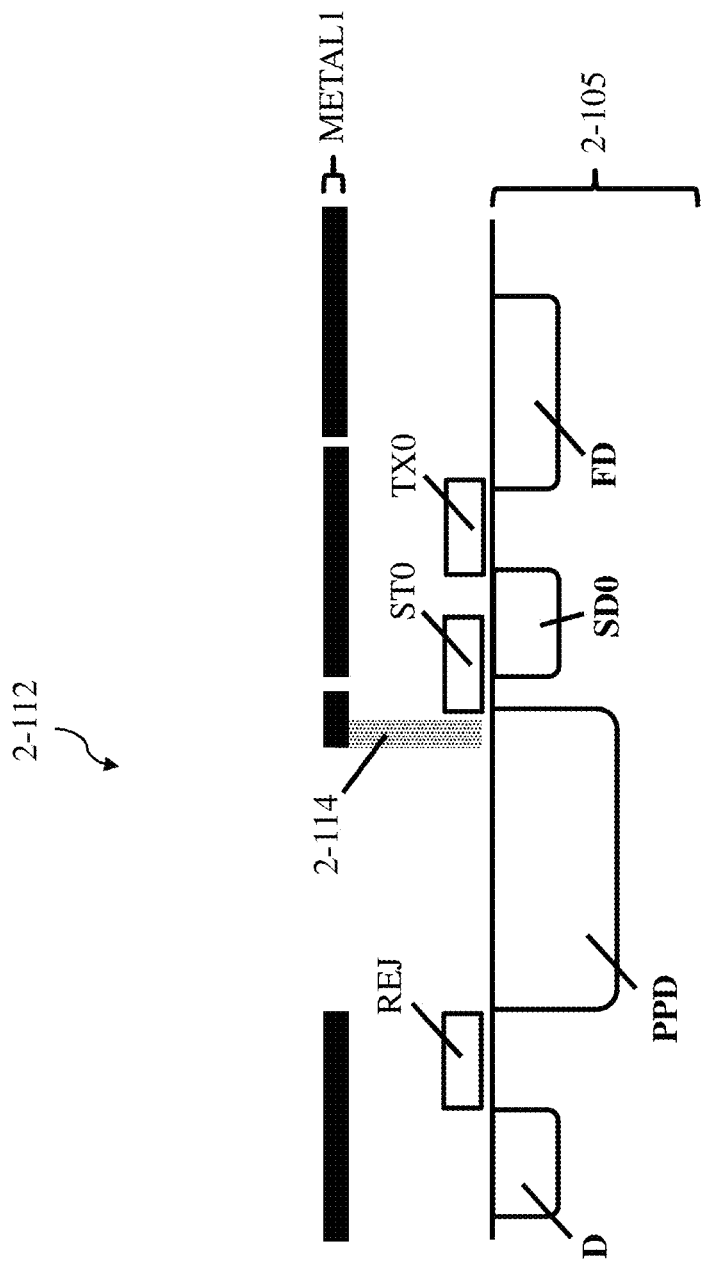

FIG. 2-1 is a schematic of pixel 2-112 including an optical barrier, the optical barrier including contact 2-114, according to some embodiments. In some embodiments, pixel 2-112 may be configured in the manner described for pixel 1-112 in connection with FIGS. 1-1A to 1-1D, such as including substrate 2-105, photodetection region PPD, drain D, storage bin SD0, readout region FD, transfer gates REJ, ST0, and TX0, and metal layer METAL1. As shown in FIG. 2-1, contact 2-114 is elongated from metal layer METAL1 to photodetection region PPD. Contact 2-114 may include an opaque material such as metal. In some embodiments, the contact may be formed using tungsten. Accordingly, contact 2-114 may be configured to block at least some secondary path photons incident on storage bin SD0. In some embodiments, contact 2-114 may have openings, such as to accommodate electrical routing in and/or around contact 2-114. As shown in FIG. 2-1, contact 2-114 extends toward but does not physically contact photodetection region PPD. In some embodiments, contact 2-114 may not electrically couple to the semiconductor region of the photodetection region PPD. For example, primary optical path coupling (e.g., from the sample well to photodetection region PPD) and primary electrical path coupling (e.g., from photodetection region PPD to storage bin SD0) may be isolated from one another. In some embodiments, a dielectric layer (e.g. film) may be disposed between contact 1-114 and photodetection region PPD to isolate electrical voltage at contact 2-114 from photodetection region PPD. In some embodiments, the dielectric layer may be an oxide gap (e.g., having a width of 20 nm or wider in a 0.18 um process node) positioned between the bottom of the contact and photodetection region PPD.

In some embodiments (e.g., FIGS. 2-3, 2-4A, and 2-1F), multiple contacts 2-114 may be positioned adjacent one another. In some embodiments, the contact may include a continuous strip of at least partially opaque material. In some embodiments, the contact may form a wall (e.g., FIGS. 2-4B to 2-1G). Although not shown in FIG. 2-1, pixel 2-112 may include a plurality of metal layers.

Figures 2, 2A:
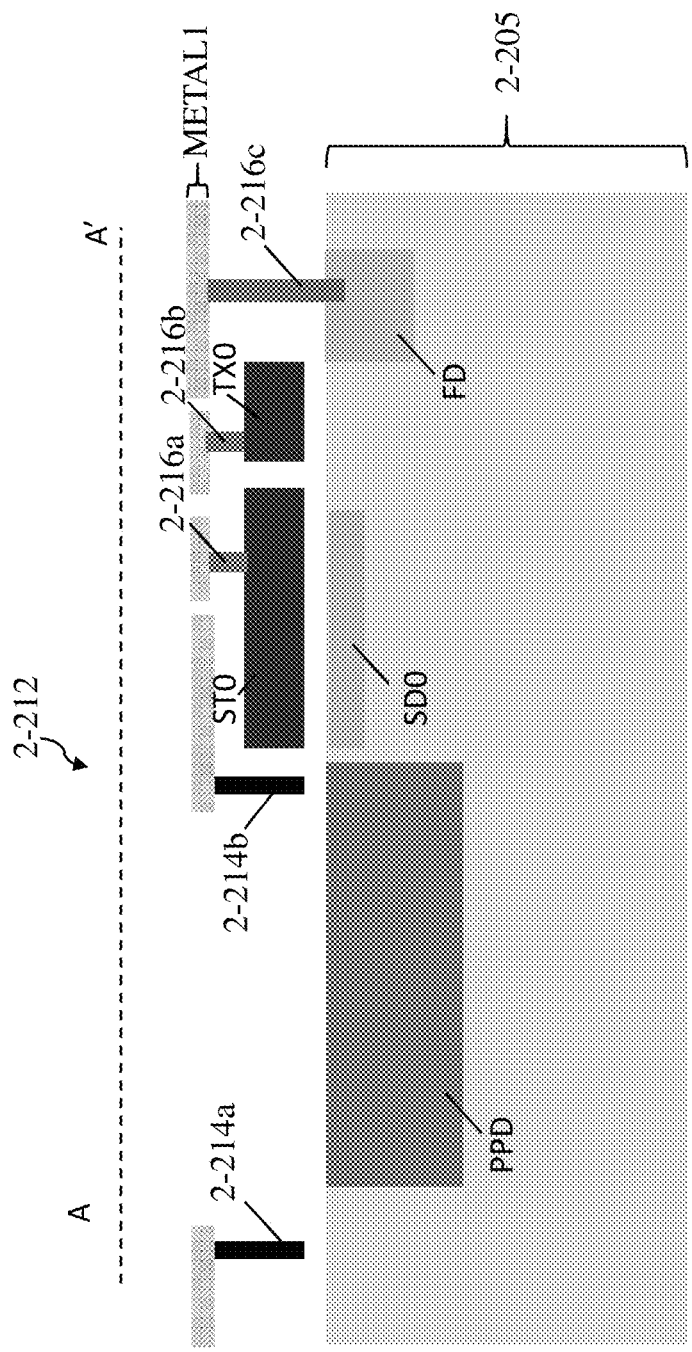
Figures 2, 2B:
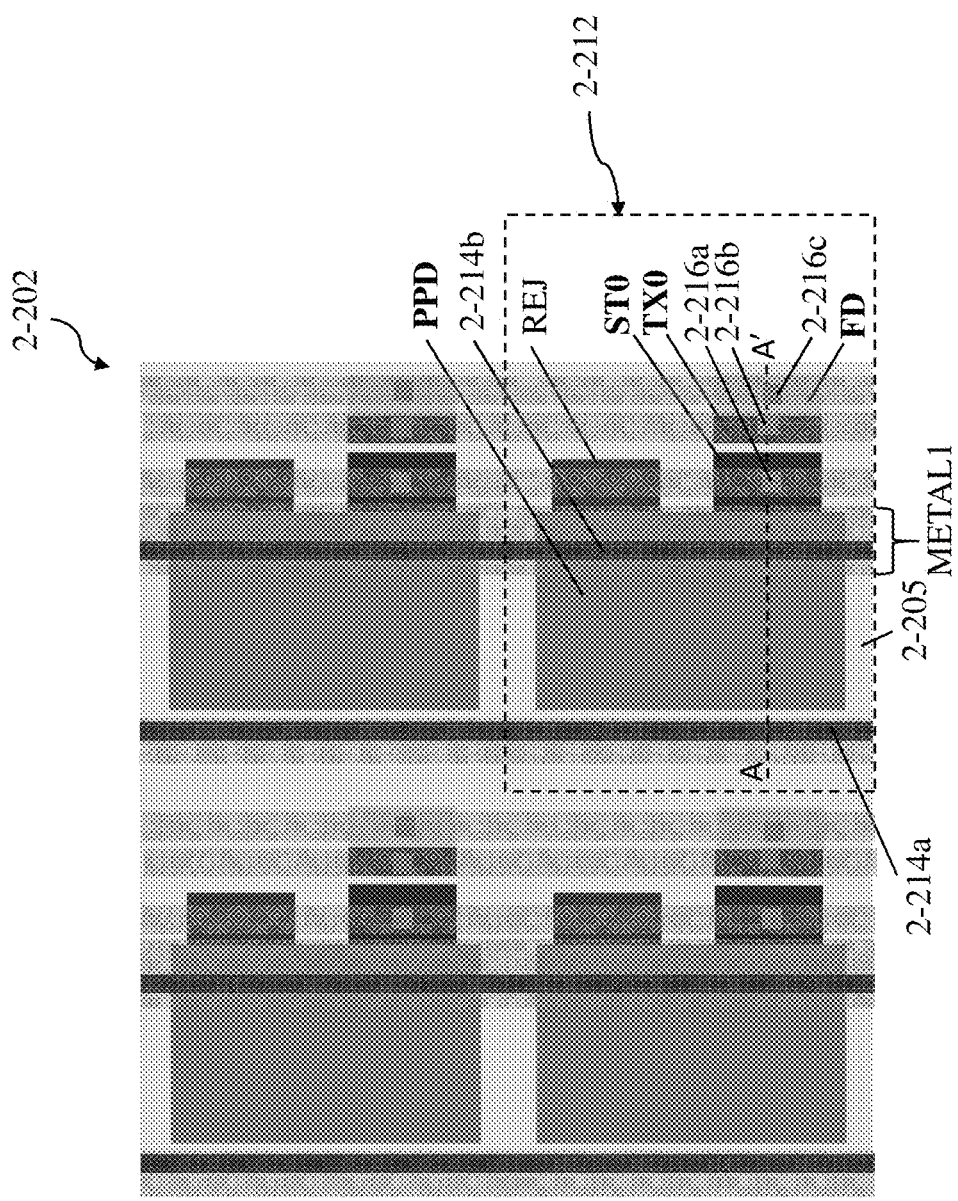

FIG. 2-2A is a schematic of pixel 2-212 including contacts 2-214a-b as an optical barrier, according to some embodiments. FIG. 2-2B is a top view of a portion of integrated device 2-202 having a plurality of pixels including pixel 2-212, according to some embodiments. FIG. 2-2A is taken along cross-section A-A' of pixel 2-212, as shown in FIG. 2-2B. In some embodiments, pixel 2-212 may be configured in the manner described for pixel 1-112 in connection with FIGS. 1-1A to 1-1D, such as including substrate 2-205, photodetection region PPD, storage bin SD0, readout region FD, transfer gates REJ, ST0, and TX0, and metal layer METAL1. Also shown in FIGS. 2-2A and 2-2B are contacts 2-214a and 2-214b, which may be separate contacts. For example, as shown in FIG. 2-2B, contacts 2-214a and 2-214b may be elongated across multiple pixels in a row or column of pixels. As described for contact 2-114 in connection with FIG. 2-1, contacts 2-214a and 2-214b may be elongated from metal layer METAL1 to substrate 2-205 without physically contacting substrate 2-205 or photodetection region PPD. For example, a dielectric layer (not shown) may be positioned between contacts 2-214a and 2-214b and substrate 2-205 or photodetection region PPD. Contacts 2-214a and 2-214b may be electrically isolated from substrate 2-205 or photodetection region PPD. In some embodiments, contacts 2-214a and 2-214b may be formed using an at least partially opaque material such as a metal (e.g., tungsten).

FIGS. 2-2A and 2-2B also show contacts 2-216a-c, which may be configured to electrically couple to transfer gates ST0 and TX0 and readout region FD, respectively. As shown in FIG. 2-2B, each contact 2-216a-c may be positioned only in pixel 2-212 (e.g., with other corresponding contacts in the other illustrated pixels). Also shown in FIGS. 2-2A and 2-2B, contacts 2-216a-c may physically contact transfer gates ST0 and TX0 and readout region FD, respectively. For example, contacts 2-216a-b may be configured to provide control signals (e.g., from a control circuit) for biasing transfer gates ST0 and TX0 to cause charge carriers to flow from photodetection region PPD to storage bin SD0 or from storage bin SD0 to readout region FD, respectively. In this example, contact 2-216c may be configured to provide charge carriers from readout region FD to other portions of the integrated device for processing. Techniques for manufacturing contacts 2-214a-b and contacts 2-216a-c are described further herein including with reference to FIGS. 6-1A to 6-1B and 6-2A to 6-2B. Although not shown in FIG. 2-2, pixel 2-212 may include a plurality of metal layers.

Figures 2, 3:
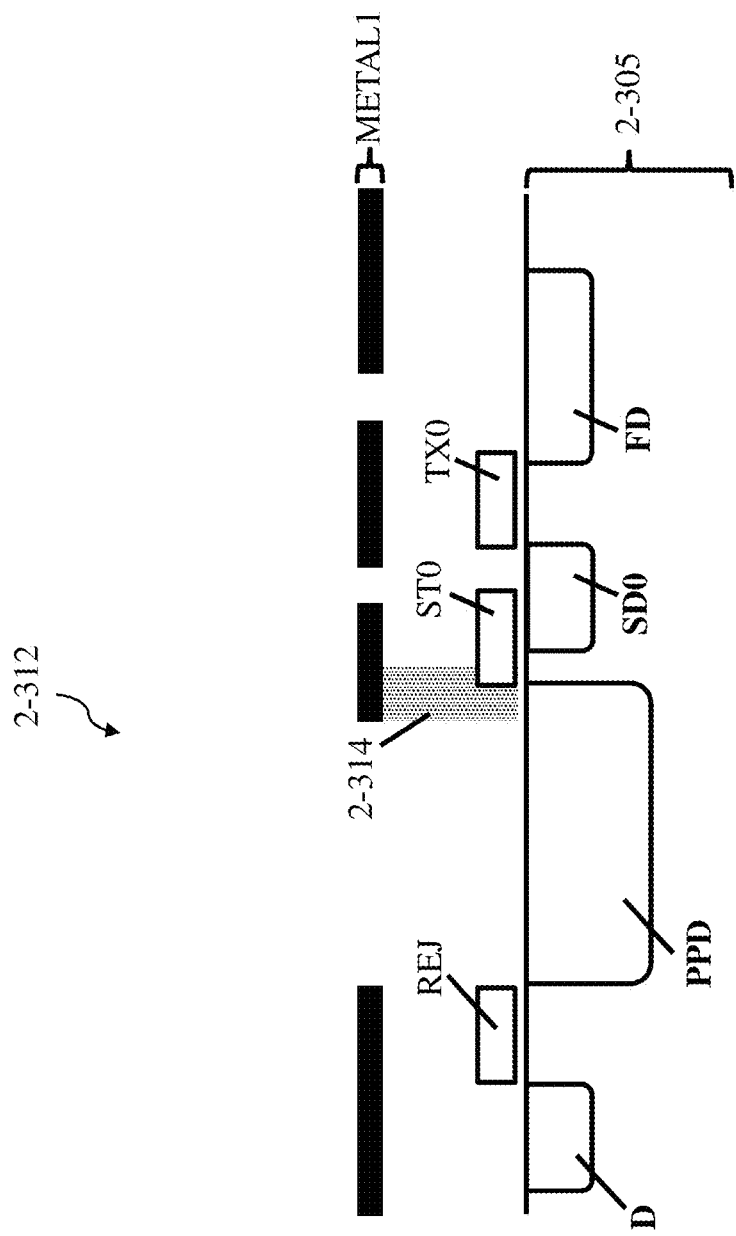

FIG. 2-3 is a schematic of pixel 2-312 including contact 2-314 as an optical barrier, where contact 2-314 is coupled to transfer gate ST0, according to some embodiments. In some embodiments, pixel 2-312 may be configured in the manner described for pixel 1-112 in connection with FIGS. 1-1A to 1-1D, such as including substrate 2-305, photodetection region PPD, drain D, storage bin SD0, readout region FD, transfer gates REJ, ST0, and TX0, and metal layer METAL1. In contrast to pixel 2-112, contact 2-314 is at least partially disposed around transfer gate ST0. In some embodiments, contact 2-314 may be electrically coupled to transfer gate ST0. In some embodiments, contact 2-314 may be electrically isolated from photodetection region PPD and/or the bulk semiconductor region of substrate 2-305. Similar to pixel 2-112, the contact of pixel 2-312 may include an opaque material and/or metal, such as tungsten. Accordingly, contact 2-314 of pixel 2-312 may provide optical rejection of secondary path photons incident on storage bin SD0. In some embodiments, multiple contacts 2-314 may be disposed on opposite sides of photodetection region PPD, such as with one contact 2-314 coupled to transfer gate ST0 and one contact 2-314 coupled to transfer gate REJ.

FIG. 2-4A is a schematic of pixel 2-412a including contact wall 2-414 and via walls 2-416a-c as an optical barrier, according to some embodiments. In FIG. 2-4A, contact wall 2-414 is disposed between transfer gates REJ and ST0 and metal layer METAL1. As shown in FIG. 2-4A, first portion 2-414a of contact wall 2-414 is elongated from transfer gate REJ to first metal layer METAL1, and second portion 2-414b of contact wall 2-414 is elongated from transfer gate ST0 to metal layer METAL1. In addition, pixel 2-412 includes via walls 2-416a, 2-416b, and 2-416c provided between adjacent metal layers, with via wall 2-416a elongated from fourth metal layer METAL4 to third metal layer METAL3, via wall 2-416b elongated from third metal layer METAL3 to second metal layer METAL2, and via wall 2-416c elongated from second metal layer METAL2 to first metal layer METAL1.

FIG. 2-4B is a perspective view of pixel 2-412b including contact wall 2-414 as an optical barrier, according to some embodiments. In some embodiments, pixel 2-412b may be configured in the manner described for pixel 2-412a in connection with FIG. 2-4A, such as including substrate 2-405, photodetection region PPD, storage bin SD0, transfer gate ST0, and metal layers METAL1 and METAL2. Pixel 2-412b further includes contacts 2-418 elongated between metal layer METAL1 and transfer gate ST0. In some embodiments, contacts 2-418 may be configured to electrically couple metal layer METAL1 and transfer gate ST0. As shown in FIG. 2-4B, contact wall 2-414 forms a cylindrical wall about photodetection region PPD. Accordingly, contact wall 2-414 may block secondary path photons incident on storage bin SD0 and secondary path photons incident on storage bins that may be disposed on other sides of photodetection region PPD. It should be appreciated that contact wall 2-414 may form a rectangular or octagonal wall rather than a cylindrical wall. Further, multiple contact walls 2-414 may be disposed around photodetection region PPD. In some embodiments, pixel 2-412b may include one or more via walls elongated between metal layers 1 and 2 and/or other metal layers.

FIG. 2-4C is a perspective view of pixel 2-412c including contact wall 2-414, via walls 2-416a-d, and contacts 418, according to some embodiments. In some embodiments, pixel 2-412b may be configured in the manner described for pixel 2-412a in connection with FIG. 2-4A, such as including storage bin ST0, substrate 2-405, and metal layers METAL1-4. In FIG. 2-4C, pixel 2-412 includes contact wall 2-414 elongated from a dielectric layer 2-422, disposed on the bulk semiconductor region of substrate 2-405, to metal layer METAL1. Pixel 2-412 further includes via wall 2-416a-d elongated between metal layers METAL1-4 as described for pixel 2-412b in connection with FIG. 2-4B. As shown in FIG. 2-4C, contact wall 2-414 and via walls 2-416a-d may wrap cylindrically about photodetection region PPD. Also shown in FIG. 2-4C are contacts 2-418 positioned between transfer gate ST0 and metal layer METAL1. In some embodiments, contacts 2-418 may be configured to electrically couple transfer gate ST0 to metal layer METAL1. It should be appreciated that contact wall 2-414 and/or via walls 2-416a-d may form rectangular or octagonal walls rather than cylindrical walls.

It should be appreciated that contacts described herein may be positioned above/below, adjacent to, and/or within transfer gates of the pixel. For example, in some embodiments, metal may be positioned within the transfer gates to block at least some secondary optical path photons from reaching the storage bins.

FIG. 2-5 is a schematic of pixel 2-512 including metal layer METAL0 as an optical barrier, according to some embodiments. In some embodiments, pixel 2-512 may be configured in the manner described for pixel 2-112 in connection with FIGS. 1-1A to 1-1D, such as including substrate 2-505, photodetection region PPD, drain D, storage bin SD0, readout region FD, transfer gates REJ, ST0, and TX0, and metal layer METAL1. As shown in FIG. 2-5, metal layer METAL0 is disposed around transfer gates ST0 and TX0. It should be appreciated that, in some embodiments, METAL0 may be disposed only around transfer gate ST0, or alternatively, only around transfer gate TX0.

Metal layer METAL0 may include any suitable metal such as tungsten. Accordingly, metal layer METAL0 may block at least some secondary path photons from reaching storage bin SD0. In some embodiments, metal layer METAL0 may be only partially disposed around transfer gate ST0 and/or transfer gate TX0. In some embodiments, metal layer METAL0 may be alternatively or additionally disposed around transfer gate REJ (e.g., shown in FIGS. 6-2A and 6-2B). In some embodiments, METAL0 may be mechanically and/or electrically coupled to a contact and/or via, such as to provide combined optical isolation. For example, the contact and/or via may be elongated from metal layer METAL1 to metal layer METAL 0. Although not shown in FIG. 2-5, pixel 2-512 may include a plurality of metal layers.

FIG. 2-6 is a schematic of pixel 2-612 including metal transfer gates ST0 and TX0 as an optical barrier, according to some embodiments. In some embodiments, pixel 2-612 may be configured in the manner described for pixel 2-112 in connection with FIGS. 1-1A to 1-1D, such as including substrate 2-605, photodetection region PPD, drain D, storage bin SD0, readout region FD, transfer gates REJ, ST0, and TX0, and metal layer METAL1. In contrast to FIGS. 2-1 to 2-2, which may use predominantly polysilicon transfer gates, transfer gates ST0 and TX0 are composed of metal. For example, transfer gate ST0 and/or TX0 may include between 75% to 99% metal, or 99% to 100% metal. Accordingly, transfer gates ST0 and TX0 may be at least partially opaque for blocking secondary path photons from reaching storage bin SD0. It should be appreciated that, in some embodiments, only one of transfer gates ST0 and TX0 include metal. In some embodiments, transfer gates ST0 and TX0 may contain different amounts of metal. Although not shown in FIG. 2-6, pixel 2-612 may include a plurality of metal layers.

FIG. 2-7 is a schematic of pixel 2-712 including at least partially opaque layers 2-714a and 2-714b as an optical barrier, according to some embodiments. In some embodiments, pixel 2-712 may be configured in the manner described for pixel 2-112 in connection with FIGS. 1-1A to 1-1D, such as including substrate 2-705, photodetection region PPD, drain D, storage bin SD0, readout region FD, transfer gates REJ, ST0, and TX0, and metal layer METAL1. In FIG. 2-7, transfer gate ST0 may include a semiconductor material such as polysilicon, and at least partially opaque layers 2-714a and 2-714b may include a silicide layer such as cobalt silicide, and/or titanium nitride. At least partially opaque layer 2-714a may fully cover transfer gate ST0 (e.g., on top and three sides), such as shown in FIG. 2-7, and/or may partially cover transfer gate ST0 (e.g., on a single surface). At least partially opaque layer 2-714b may partially cover transfer gate TX0, such as shown in FIG. 2-7, and/or may fully cover transfer gate TX0. Accordingly, at least partially opaque layers 2-714a and 2-714b may block at least some secondary path photons from reaching storage bin SD0. It should be appreciated that any number of transfer gate surfaces may be covered by one or multiple opaque layers. In some embodiments, only transfer gate ST0 or TX0 may be covered by an at least partially opaque layer. Although not shown in FIG. 2-7, pixel 2-712 may include a plurality of metal layers.

FIG. 2-8A is a plan view of pixel 2-812 having pillar array 2-816 as an optical barrier. FIG. 2-8B is a perspective view of pixel 2-812. In some embodiments, pixel 2-812 may be configured in the manner described for pixel 2-112 in connection with FIGS. 1-1A to 1-1D, such as including photodetection region PPD, substrate 2-805, and transfer gate ST0. In FIGS. 2-8A and 2-8B, pillars of pillar array 2-816 are arranged in periodic patterns within transfer gate ST0. Pillars 2-816 may include an optically transparent or opaque material. For example, pillar array 2-816 may be configured to provide a contrast in refractive index compared to a material of transfer gate ST0. In some embodiments, pillar array 2-816 may be arranged as a two-dimensional photonic crystal, which may block propagation of light inside transfer gate ST0 and reject photons incident along one or more secondary optical paths. Also shown in FIGS. 2-8A and 2-8B are contact wall 2-814a, which is disposed cylindrically about photodetection region PPD, and contacts 2-814b, which may be elongated between a metal layer (not shown) and transfer gate ST0. In some embodiments, contacts 2-814b may be configured to electrically couple the metal layer to transfer gate ST0. In some embodiments, a bulk semiconductor region of substrate 2-805 below transfer gate ST0 may include an array of pillars arranged in a pattern configured to block photons due to light that may diffract at an edge of transfer gate ST0. For example, photons of the diffracted light may propagate towards storage bin SD0 along a secondary optical path. In some embodiments, an interface at the edge of transfer gate ST0 may include a passivation structure, such as to limit dark current. It should be appreciated that any number of pillars may be used.

FIG. 2-9A is a plan view of pixel 2-912 having line array 2-916 as an optical barrier, according to some embodiments. FIG. 2-9B is a perspective view of pixel 2-912, according to some embodiments. In some embodiments, pixel 2-912 may be configured in the manner described for pixel 2-812 in connection with FIGS. 2-8A and 2-8B, such as including photodetection region PPD, substrate 2-905, and transfer gate ST0. In FIGS. 2-9A and 2-9B, lines of line array 2-916 are arranged in periodic patterns within transfer gate ST0. Line array 2-916 may include a transparent or opaque material and create a contrast in refractive index with material of transfer gate ST0. In some embodiments, line array 2-916 may be arranged in a one-dimensional photonic crystal, which may block propagation of light inside transfer gate ST0 and reject photons incident along one or more secondary optical paths. Thus, line array 2-916 may be configured to block at least some secondary path photons from reaching storage bins SD0 and/or SD1, as described herein for pillars array 2-816. Also shown in FIGS. 2-9A and 2-9B are contact wall 2-914a, which is disposed cylindrically about photodetection region PPD, and contacts 2-914b, which may be elongated between a metal layer (not shown) and transfer gate ST0. In some embodiments, an array of lines may be included in a bulk semiconductor region of substrate 2-905 below transfer gate ST0, as described for the pillars in connection with FIG. 2-8A. It should be appreciated that any number of lines may be used.

FIG. 2-10A is a plan view of pixel 2-1012 having optical waveguide 2-1014 as an optical barrier, according to some embodiments. FIG. 2-10B is a perspective view of pixel 2-1012 according to some embodiments. In some embodiments, pixel 2-1012 may be configured in the manner described for pixel 2-112 in connection with FIGS. 1-1A to 1-1D, such as including substrate 2-1005, transfer gate ST0, and metal layers METAL1-4. In FIGS. 2-10A and 2-10B, optical waveguide 1014 is positioned above photodetection region PPD (not shown). For example, optical waveguide 1014 may be positioned in an aperture (e.g., surrounded by metal layers METAL1-4). Optical waveguide 1014 may have a higher (or lower) refractive index compared to the surrounding dielectric. Consequently, optical waveguide 1014 may direct light to photodetection region PPD and reduce the number of secondary optical path photons propagating towards storage bins SD0 and/or SD1 (not shown). Thus, optical waveguide 1014 may block at least some secondary optical path photons from reaching storage bins of pixel 2-1012, In some embodiments, optical waveguide 1014 may have a cylindrical geometry extending from a surface of photodetection region PPD to a metal layer (e.g., METAL4). In some embodiments, optical waveguide 1014 may have an oval cross section and/or have a height different from that of pixel 2-1012. It should be appreciated that any form of optical waveguide may be used, such as having a rectangular cross section, for example.

FIG. 2-10C is a graph 2-1000 of isolation ratio between a storage bin of pixel 2-1012 (e.g., SD0 and/or SD1) to photodetection region PPD versus refractive index of optical waveguide 1014, according to some embodiments. As shown in FIG. 2-10C, when the refractive index of optical waveguide 1014 is between 1.75 and 1.9 or 1.95, an isolation ratio higher than 10,000 may be achieved.

IV. Techniques for Electrical Rejection

As described herein, the inventors have developed techniques for rejecting secondary electrical path charge carriers from reaching the storage bin(s) and impacting signal quality. Techniques described herein include implementing one or more semiconductor wells or barriers in a pixel and/or resizing and/or reshaping the storage bin(s) to reduce attraction and increase attenuation of secondary electrical path charge carriers to the storage bin(s). Any or each pixel described herein may be included in an integrated device (e.g., integrated device 102). It should be appreciated that techniques for secondary electrical path rejection may also be useful for secondary optical path rejection.

FIG. 3-1 is a schematic view of pixel 3-112 including doped semiconductor well W as an electrical barrier, according to some embodiments. In some embodiments, pixel 3-112 may be configured in the manner described for pixel 1-112 in connection with FIGS. 1-1A to 1-1D, such as including substrate 3-105, photodetection region PPD, drain D, storage bin SD0, readout region FD, and transfer gates REJ, ST0, and TX0. In FIG. 3-1, doped semiconductor well W is positioned below storage bin SD0. In some embodiments, doped semiconductor well W may have a same conductivity type as photodetection region PPD and storage bin SD0. For example, photodetection region PPD, storage bin SD0, and doped semiconductor well W may be n-doped. In this example, substrate 3-105 may be lightly p-doped. Undesired charge carriers positioned below storage bin SD0 may be more attracted to an electric field provided by the doping concentration of doped semiconductor well W than to storage bin SD0, resulting in fewer undesired charge carriers entering storage bin SD0 along secondary electrical paths. It should be appreciated that doped semiconductor well W is considered to be below storage bin SD0 when doped semiconductor well W is positioned on an opposite side of storage bin SD0 from transfer gate ST0. Further, in embodiments with multiple storage bins, a doped semiconductor well may be positioned below each storage bin, or below some of the storage bins. In some embodiments, a single doped semiconductor well may be positioned below multiple storage bins. In some embodiments, substrate 3-105 may be lightly n-doped and photodetection region PPD, storage bin SD0, and doped semiconductor well W may be p-doped. Although not shown in FIG. 3-1, pixel 3-112 may include one or more metal layers.

FIG. 3-2 is a schematic view of pixel 3-212 including doped semiconductor barrier B as an electrical barrier, according to some embodiments. In some embodiments, pixel 3-212 may be configured in the manner described for pixel 1-112 in connection with FIGS. 1-1A to 1-1D, such as including substrate 3-205, photodetection region PPD, drain D, storage bin SD0, readout region FD, and transfer gates REJ, ST0, and TX0. In FIG. 3-2, doped semiconductor barrier B is positioned below storage bin SD0. In some embodiments, doped semiconductor barrier may have a different conductivity type from photodetection region PPD and storage bin SD0. For example, photodetection region PPD and storage bin SD0 may be n-doped and doped semiconductor barrier B may be p-doped. In this example, substrate 3-205 may be lightly p-doped. In some embodiments, doped semiconductor barrier B may have a high doping concentration compared to bulk semiconductor regions of substrate 3-205 positioned around storage bin SD0 and/or doped semiconductor barrier B. Undesired photo-electrons may be blocked from reaching storage bin SD0 when barrier B is positioned in the path of the charge carriers due to the electrical field provided by the doping concentration of doped semiconductor barrier B, resulting in fewer undesired charge carriers entering storage bin SD0 along secondary electrical paths. It should be appreciated that, as described for semiconductor well W, doped semiconductor barrier B is considered to be below storage bin SD0 when doped semiconductor barrier B is positioned on an opposite side of storage bin SD0 from transfer gate ST0. Further, in embodiments with multiple storage bins, a doped semiconductor barrier may be positioned below each storage bin, or below some of the storage bins. In some embodiments, a single doped semiconductor barrier may be positioned below multiple storage bins. In some embodiments, substrate 3-205 may be lightly n-doped, photodetection region PPD and storage bin SD0 may be p-doped, and doped semiconductor barrier B may be n-doped. Although not shown in FIG. 3-2, pixel 3-212 may include one or more metal layers.

FIG. 3-3A is a plan view of pixel 3-312a including doped semiconductor wells W0 and W1 as an electrical barrier, according to some embodiments. In some embodiments, pixel 3-312a may be configured in the manner described for pixel 1-112 in connection with FIGS. 1-1A to 1-1D, such as including photodetection region PPD and storage bins SD0 and SD1. In FIG. 3-3A, doped semiconductor well W0 is positioned adjacent storage bin SD0 and doped semiconductor well W1 is positioned adjacent storage bin SD1. Doped semiconductor wells W0 and W1 may be configured in the manner described for doped semiconductor well W in connection with FIG. 3-1, except that wells W0 and W1 may be positioned adjacent storage bins SD0 and SD1 rather than or in addition to being positioned below storage bins SD0 and/or SD1. For example, doped semiconductor wells W0 and W1 may be configured to attract undesired charge carriers along secondary paths from storage bin SD0 to storage bin SD1. Accordingly, fewer undesired charge carriers may enter storage bins SD0 and SD1 from the adjacent sides. It should be appreciated that doped semiconductor wells W0 and/or W1 may be included in pixels having only a single storage bin.

FIG. 3-3B is a plan view of pixel 3-312b including doped semiconductor wells $W0_1$, $W0_2$, $W1_1$, and $W1_2$ as an electrical barrier, according to some embodiments. In some embodiments, pixel 3-312b may be configured in the manner described for pixel 1-112 in connection with FIGS. 1-1A to 1-1D, such as including photodetection region PPD and storage bins SD0 and SD1. In FIG. 3-3B, doped semiconductor wells $W0_1$ and $W0_2$ are positioned adjacent storage bin SD0 and doped semiconductor wells $W1_1$ and $W1_2$ are positioned adjacent storage bin SD1. Doped semiconductor wells $W0_1$, $W0_2$, $W1_1$, and $W1_2$ may be configured in the manner described for doped semiconductor wells W0 and W1 in connection with FIG. 3-3A, except that wells $W0_1$, $W0_2$, $W1_1$, and $W1_2$ may be positioned on multiple sides of each storage bin SD0 and SD1. For example, doped semiconductor wells $W0_1$, $W0_2$, $W1_1$, and $W1_2$ may attract undesired charge carriers incident on storage bins SD0 and Sd1 from multiple sides. Accordingly, fewer undesired charge carriers may enter storage bins SD0 and SD1 from the adjacent sides. It should be appreciated that doped semiconductor wells $W0_1$, $W0_2$, $W1_1$, and/or $W1_2$ may be included in pixels having only a single storage bin.

Figures 2, 3, 4, 4A:
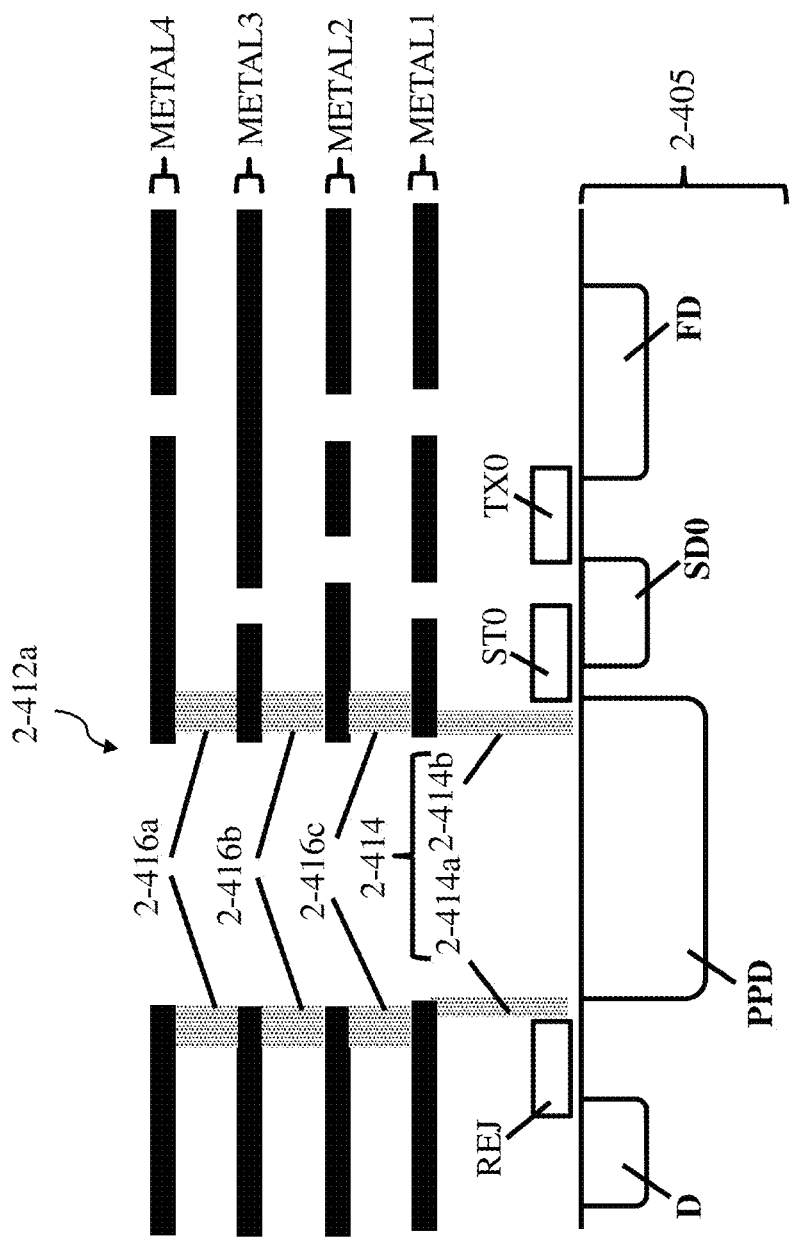

FIG. 3-4A is a plan view of pixel 3-412a including doped semiconductor barriers B0 and B1 as an electrical barrier, according to some embodiments. In some embodiments, pixel 3-412a may be configured in the manner described for pixel 1-112 in connection with FIGS. 1-1A to 1-1D, such as including photodetection region PPD and storage bins SD0 and SD1. In FIG. 3-4A, doped semiconductor barrier B0 is positioned adjacent storage bin SD0 and doped semiconductor barrier B1 is positioned adjacent storage bin SD1. Doped semiconductor barriers B0 and B1 may be configured in the manner described for doped semiconductor barrier B in connection with FIG. 3-2, except that barriers B0 and B1 may be positioned adjacent storage bins SD0 and SD1 rather than or in addition to being positioned below storage bins SD0 and SD1. For example, doped semiconductor barriers B0 and B1 may be configured to block undesired charge carriers along secondary paths from storage bin SD0 to storage bin SD1. Accordingly, fewer undesired charge carriers may enter storage bins SD0 and SD1 from the adjacent sides. It should be appreciated that doped semiconductor barriers B0 and/or B1 may be included in pixels having only a single storage bin.

Figures 2, 3, 4, 4B:
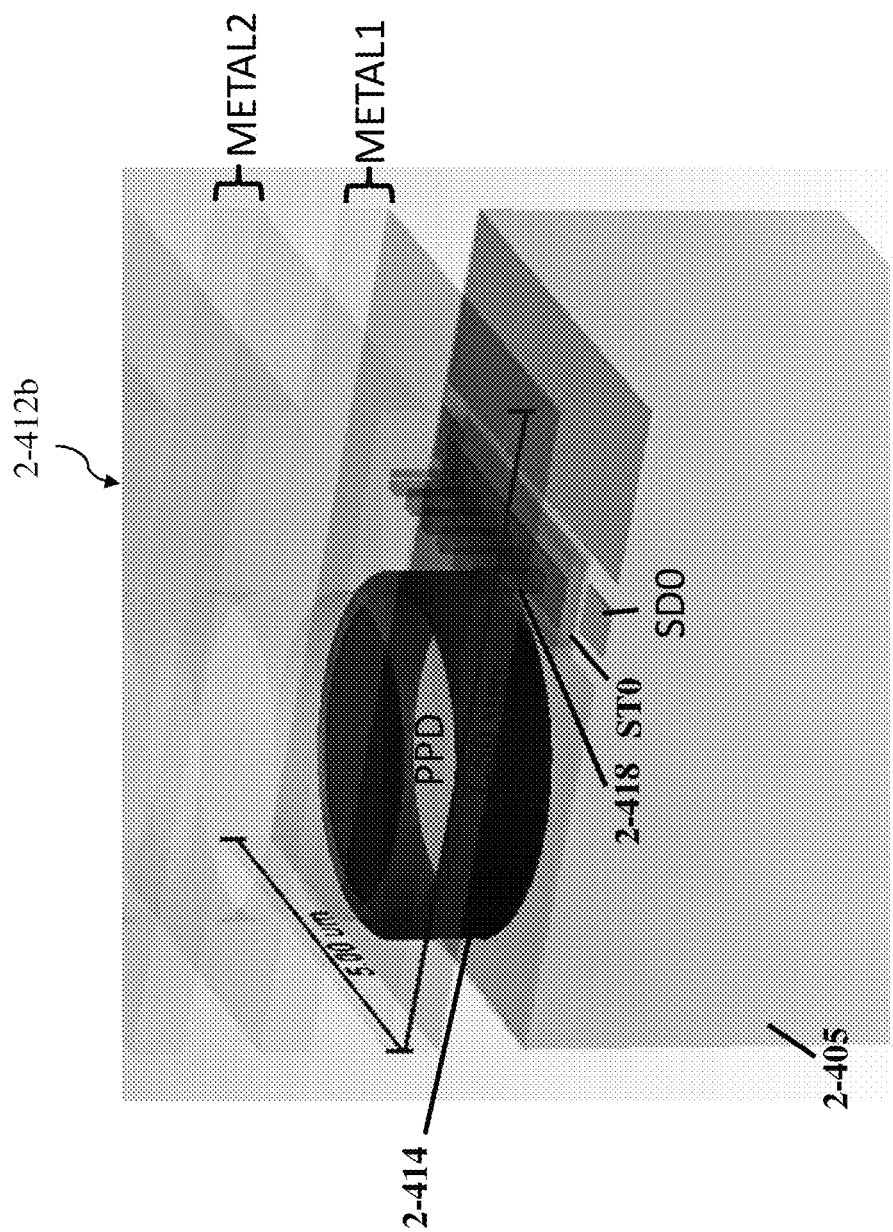

FIG. 3-4B is a plan view of pixel 3-412b including doped semiconductor barriers $B0_1$, $B0_2$, $B1_1$, and $B1_2$ as an electrical barrier, according to some embodiments. In some embodiments, pixel 3-412b may be configured in the manner described for pixel 1-112 in connection with FIGS. 1-1A to 1-1D, such as including photodetection region PPD and storage bins SD0 and SD1. In FIG. 3-4B, doped semiconductor barriers $B0_1$ and $B0_2$ are positioned adjacent storage bin SD0 and doped semiconductor barriers $B1_1$ and $B1_2$ are positioned adjacent storage bin SD1. Doped semiconductor barriers $B0_1$, $B0_2$, $B1_1$, and $B1_2$ may be configured in the manner described for doped semiconductor barriers B0 and B1 in connection with FIG. 3-4A, except that doped semiconductor barriers $B0_1$, $B0_2$, $B1_1$, and $B1_2$ may be positioned on multiple sides of each storage bin SD0 and SD1. For example, doped semiconductor barriers $B0_1$, $B0_2$, $B1_1$, and $B1_2$ may block undesired charge carriers incident on storage bins SD0 and Sd1 from multiple sides. Accordingly, fewer undesired charge carriers may enter storage bins SD0 and SD1 from the adjacent sides. It should be appreciated that doped semiconductor barriers $B0_1$, $B0_2$, $B1_1$, and $B1_2$ may be included in pixels having only a single storage bin.

Figures 2, 3, 4, 4C:
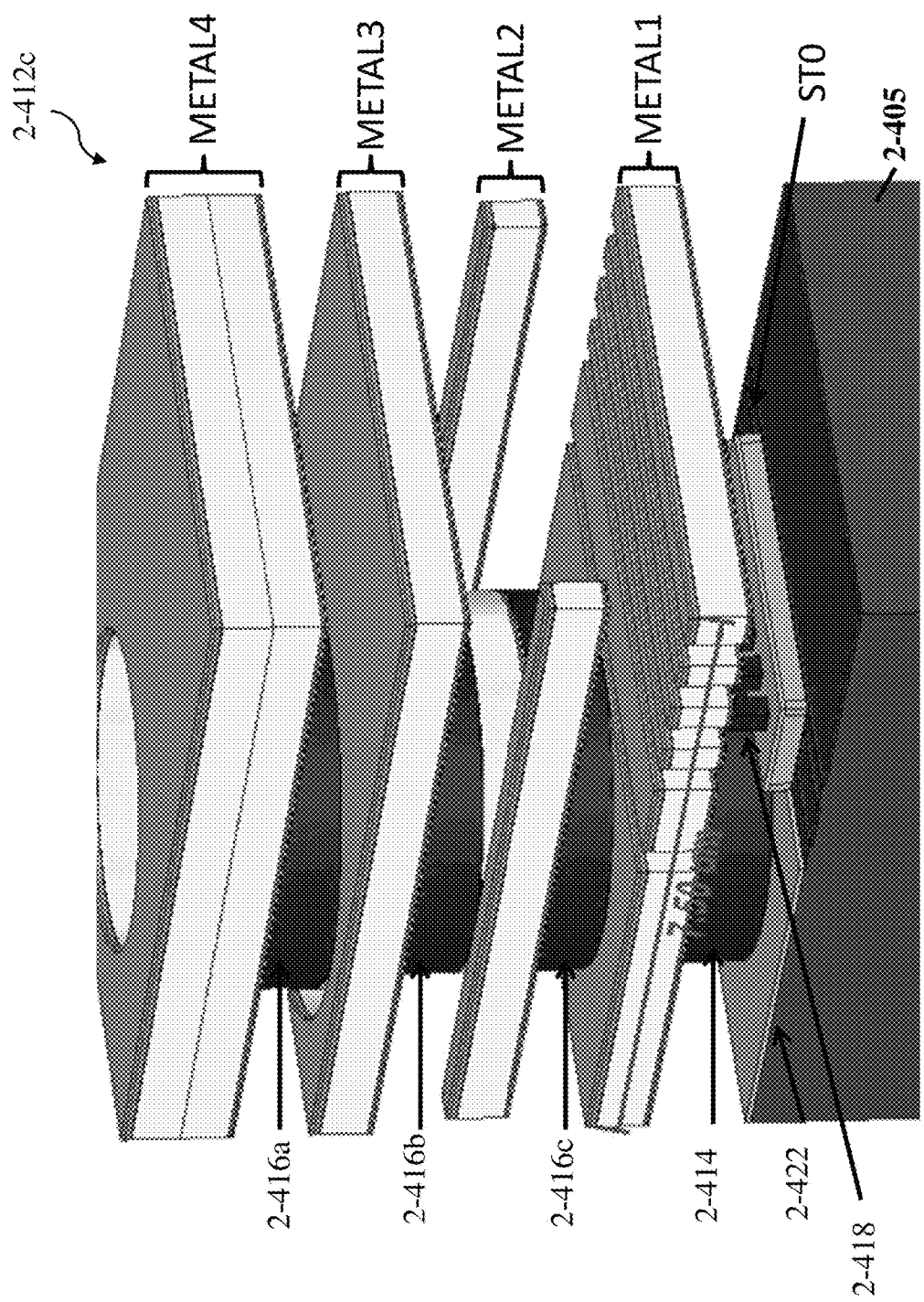
Figures 2, 3, 4, 5:
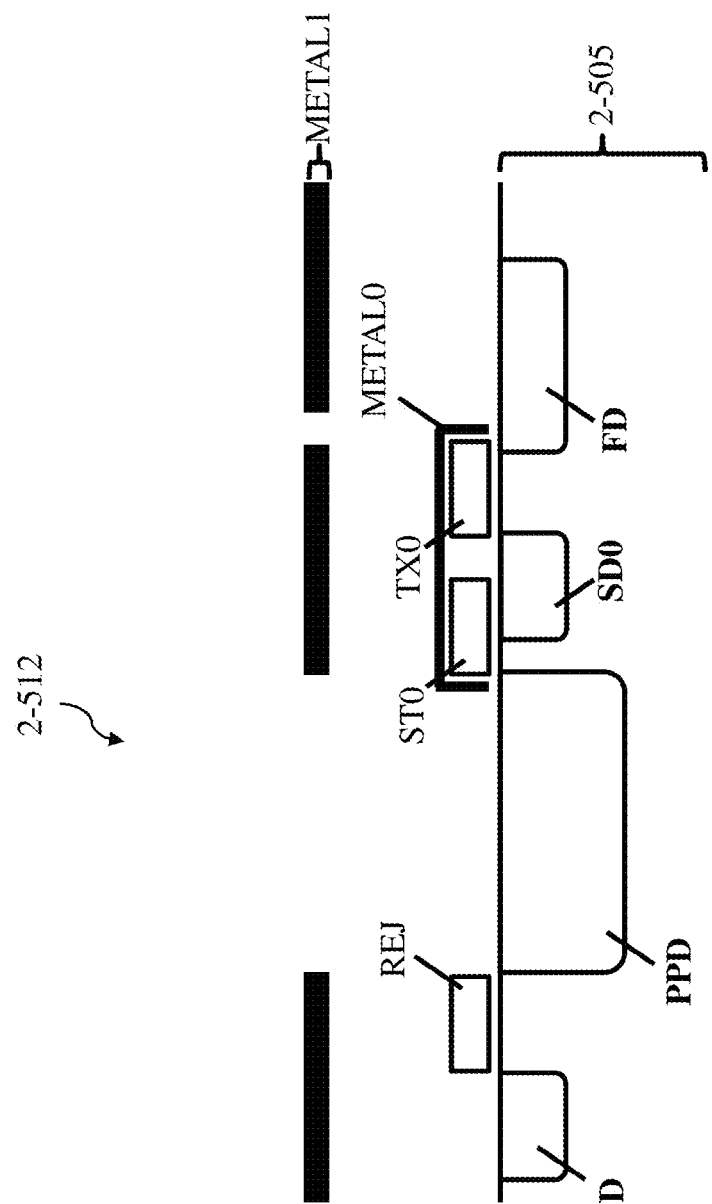

It should be appreciated that optical and electrical rejection techniques may be implemented alone or in combination, such as shown in FIG. 3-5.

FIG. 3-5 is a schematic view of pixel 3-512 including doped semiconductor barrier B as an electrical barrier, according to some embodiments. In some embodiments, pixel 3-512 may be configured in the manner described for pixel 1-112 in connection with FIGS. 1-1A to 1-1D, such as including substrate 3-505, photodetection region PPD, storage bin SD0, readout region FD, transfer gates ST0 and TX0, and metal layer METAL1. Also shown in FIG. 3-5, are contact walls 3-514a and 3-514b and contacts 3-516a-c, which may be configured in the manner described for contact walls 2-214a-b and contacts 2-216a-c, respectively, in connection with FIGS. 2-2A and 2-2B. In some embodiments, doped semiconductor barrier B may be configured in the manner described in connection with FIG. 3-2. Although only metal layer METAL1 is shown, it should be appreciated that pixel 3-512 may include a plurality of metal layers.

The inventors have also developed techniques for configuring the storage bins relative to the photodetection region to impede secondary optical path photons and/or secondary electrical path (e.g., noise) charge carriers from reaching the storage bins. The storage bins may be shaped to perform such impeding and/or located relative to the photodetection region to perform such impeding. In some embodiments, storage bins may be positioned to increase the potential barrier charge carriers encounter en route to the storage bins. For example, the inventors recognized that by positioning the storage bins farther from the photodetection region, the potential barrier may be increased to a level acceptable for fluorescent emission charge carriers but sufficient to impede noise charge carriers. In some embodiments, the primary electrical path for desired charge carriers may be a straight line from the photodetection region to the storage bins, whereas secondary electrical paths for undesired charge carriers may be diagonal lines from the bulk semiconductor region adjacent and/or below the primary path. Accordingly, the secondary electrical paths may be longer than the primary electrical path such that positioning the storage bins farther from the photodetection region results in more attenuation of the secondary electrical paths than the primary electrical path. Thus, undesired charge carriers may be attenuated without losing desired charge carriers. Moreover, in some embodiments, the primary optical path from the sample to the photodetection region may be a straight line, whereas secondary optical paths to the storage bins may be diagonal paths that are longer than the primary optical path. Accordingly, positioning the storage bins farther from the photodetection region may cause fewer secondary optical path photons to reach the storage bins, for example, due to path obstruction and/or attenuation. Thus, some techniques described herein may provide both optical and electrical secondary path rejection, rather than just optical or electrical rejection. In some embodiments, a doping concentration of the storage bins may be configured to impede noise charge carriers from reaching the storage bins. For example, the inventors recognized that the doping concentration of the storage bins may be decreased to reduce the attraction of noise charge carriers towards the storage bins.

FIG. 4-1 is a graph 4-100 of electric potential versus positioning within portions of two pixels, where first curve 4-102 is the electric potential within a portion of the first pixel and second curve 4-104 is the electric potential within a portion of the second pixel, according to some embodiments. As shown in FIG. 4-1, first curve 4-102 shows the electric potential of a pixel having storage bin SD0a and photodetection region PPD. The doping profiles of photodetection region PPD and storage bin SD0a may be configured to cause concave-up regions of first curve 4-102. For example, photodetection region PPD and storage bin SD0 may have relatively high doping concentrations and opposite conductivity types from surrounding bulk regions of the pixel substrate. In FIG. 4-1, potential barrier La is positioned between photodetection region PPD and storage bin SD0a, shown as a concave-down region of first curve 4-102. In some embodiments, potential barrier La may be created by the difference in doping concentration between storage bin SD0a and the pixel region in which potential barrier La is disposed. Second curve 4-104 shows the electric potential of a pixel having storage bin SD0b and photodetection region PPD. The doping profiles of photodetection region PPD and storage bin SD0b may be configured to cause concave-up regions of second curve 4-104. For example, photodetection region PPD and storage bin SD0b may have relatively high doping concentrations and opposite conductivity types from surrounding bulk regions of the pixel substrate. In FIG. 4-1, potential barrier Lb is positioned between photodetection region PPD and storage bin SD0b, shown as a concave-down region of second curve 4-102. In some embodiments, potential barrier Lb may be created by the difference in doping concentration between storage bin SD0b and the pixel region in which potential barrier Lb is disposed.

In FIG. 4-1, photodetection region PPD is positioned at approximately the same location in both pixels, whereas storage bin SD0b is spaced farther from photodetection region PPD than is storage bin SD0a. The spacings between photodetection region PPD and storage bins SD0a and SD0b are shown in FIG. 4-2.

FIG. 4-2 is a graph 4-200 of relative isolation versus storage bin to photodetection region spacing for the pixels of FIG. 4-1, according to some embodiments. As shown in FIGS. 4-1 and 4-2, storage bin SD0b is positioned farther from photodetection region PPD than storage bin SD0a. In FIG. 4-2, storage bin SD0a is spaced between 1.5 and 2 microns from photodetection region PPD, and storage bin SD0b is spaced between 2.25 and 2.5 microns from photodetection region PPD. In some embodiments, the larger spacing from photodetection region PPD to storage bin SD0b than to storage bin SD0a creates potential barrier Lb, which may be configured to attract fewer secondary electrical path charge carriers from photodetection region PPD to storage bin SD0b. Moreover, because storage bin SD0b may be positioned farther from photodetection region PPD than is storage bin SD0a, secondary electrical path charge carriers propagating inside the bulk semiconductor region may travel farther to reach storage bin SD0b than to reach storage bin SD0a. As a result, loss (e.g., due to attenuation) for such charge carriers in the bulk semiconductor region may be higher, reducing the number of charge carriers that reach storage bin SD0b. Likewise, for secondary optical path photons that propagate in the space between the bulk semiconductor region and the first metal layer, the increased distance to reach storage bin SD0b results in higher absorption along the secondary optical path, such that fewer secondary optical path photons may reach storage bin SD0b. It should be appreciated that distances shown in FIG. 4-2 are exemplary and other distances may be implemented.

FIG. 4-3 is a schematic view of pixel 4-312 having storage bin SD0c with reduced depth, according to some embodiments. In some embodiments, pixel 4-312 may be configured in the manner described for pixel 1-112 in connection with FIGS. 1-1A to 1-1D, such as including substrate 4-305, photodetection region PPD, drain D, storage bin SD0c, readout region FD, and transfer gates REJ, ST0, and TX0. In FIG. 4-3, doped semiconductor region S is positioned below storage bin SD0c. In some embodiments, doped semiconductor region S may have an opposite conductivity type from photodetection region PPD and storage bin SD0c. For example, photodetection region PPD and storage bin SD0c may be n-doped regions and doped semiconductor region S may be a p-doped region such that storage bin SD0c has a shallower depth with respect to transfer gate ST0 than without doped semiconductor region S. In this example, substrate 4-305 may be lightly p-doped. The potential difference between storage bin SD0c and doped semiconductor region S may create a barrier for secondary electrical path charge carriers and/or secondary optical path photons incident on storage bin SD0c. Accordingly, fewer undesired charge carriers may be generated in storage bin SD0c, and/or fewer secondary optical path photons may reach storage bin SD0c. In some embodiments, an n-doped semiconductor region may be positioned below semiconductor region S to attract undesired charge carriers away from storage bin SD0c, resulting in fewer charge carriers reaching storage bin SD0c along secondary electrical paths. It should be appreciated that, in some embodiments, photodetection region PPD and storage bin SD0c may be p-doped, doped semiconductor region S may be n-doped, and substrate 4-305 may be lightly n-doped. Although not shown in FIG. 4-3, pixel 4-312 may include one or more metal layers.

FIG. 4-4 is a graph 4-400 of electric potential versus depth in two pixels, where first curve 4-402 is the electric potential of a pixel without doped semiconductor region S and second curve 4-404 is the electric potential of pixel 4-312 including doped semiconductor region S, according to some embodiments. Storage bin SD0a of the first pixel and storage bin SD0c of pixel 4-312 are indicated by concave-up regions of first and second curves 4-402 and 4-404. As shown in FIG. 4-4, the depth of storage bin SD0c is less than the depth of storage bin SD0a. Thus, secondary electrical charge carriers incident on storage bin SD0c from below (e.g., diagonally from the bottom of photodetection region PPD, etc.) may have to traverse a longer distance to reach storage bin SD0c than they would to reach storage bin SD0a. In FIG. 4-4, doped semiconductor region S is indicated by the deep-side shoulder of storage bin SD0c having a higher electric potential than the portion of storage bin SD0a located at the same depth.

V. Methods of Manufacture

The inventors have also developed techniques for manufacturing integrated devices, as described further herein. It should be appreciated that, other than where specified, typical complementary metal oxide semiconductor (CMOS) processes may be used to produce the devices.

Figures 2, 3, 4, 5, 6:
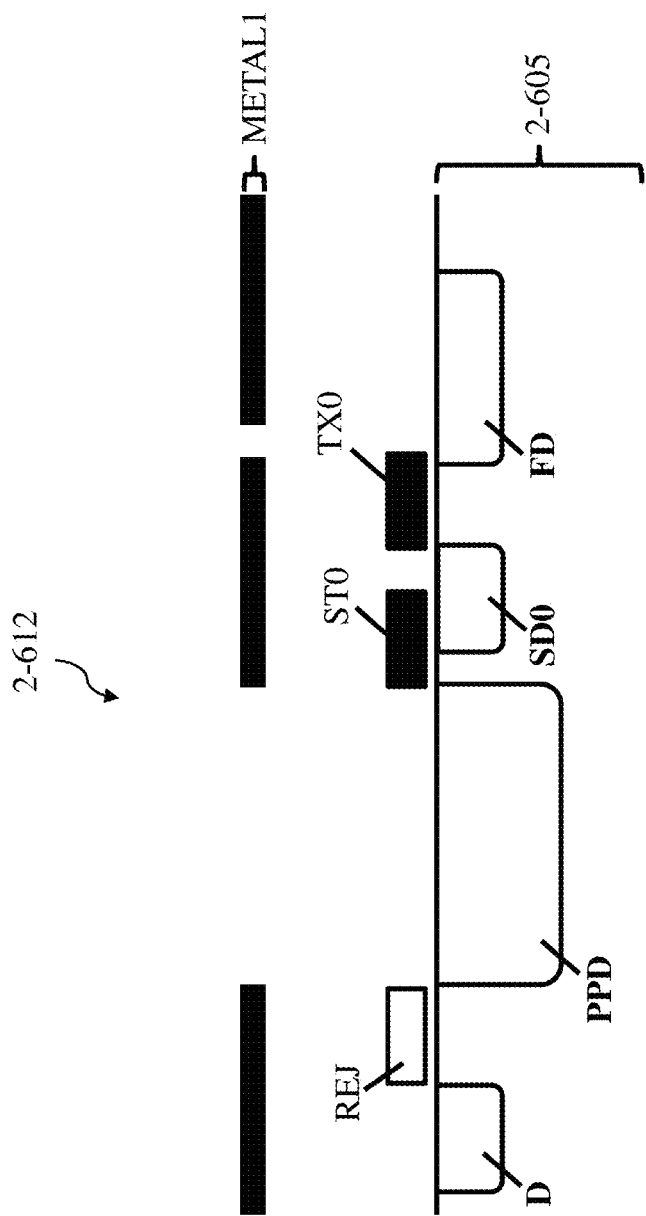

FIGS. 6-1A to 6-1E are diagrams of steps 6-150 to 6-160 of an exemplary method for constructing contacts 2-214a-b and 2-216a-c of pixel 2-212 of FIGS. 2-2A and 2-2B, according to some embodiments. In FIGS. 6-1A to 6-1E, contact 6-114, which may be contact 2-214a or 2-214b of pixel 2-212, and contact 6-116, which may be contact 2-216a, 2-216b, or 2-216c of pixel 2-212, are each deposited on a bulk semiconductor region of substrate 6-105. At step 6-152 shown in FIG. 6-1A, the bulk semiconductor region has thereupon multi-layer dielectric film stack 6-172, which may be a contact etch stop layer (CESL), and an inter-layer dielectric (ILD) layer 6-174. For example, the bulk semiconductor region of substrate 6-105 may include lightly doped Silicon and dielectric film stack 6-172 may include silicon oxide ($SiO_2$) and/or Silicon Oxy-Nitride (SiON). At step 6-154 shown in FIG. 6-1B, first portion 6-176a of ILD layer 6-174 and dielectric film stack 6-172 may be removed (e.g., etched), leaving at least some of dielectric film stack 6-172 atop the bulk semiconductor region of substrate 6-105. At step 6-156 shown in FIG. 6-1C, photoresist (PR) layer 6-178 may be placed over the location where first portion 6-176a was removed during step 6-154, and second portion 6-176b of ILD layer 6-174 and dielectric film stack 6-172 may be further removed subsequently (e.g., etched). Removing second portion 6-176b may include removing all of oxide layer 6-172a of dielectric film stack 6-172 such that the bulk semiconductor region of substrate 6-105 is exposed. At step 6-158 shown in FIG. 6-1D, PR layer 6-178 may be removed. At step 6-160 shown in FIG. 6-1E, a conductive metal may be deposited in each of the locations from which first portion 6-176a and second portion 6-176b were removed to form contacts 6-114 and 6-116, respectively. For example, each contact 6-114 and 6-116 may include metal such as tungsten, titanium, titanium nitride, aluminum, aluminum/copper, nickel, or a layered combination of them. Because the first location from which first portion 6-176a was removed includes at least some of dielectric film stack 6-172 between contact 6-114 and the bulk semiconductor region of substrate 6-105, contact 6-114 may be electrically isolated from the bulk semiconductor region of substrate 6-105. In contrast, because the bulk semiconductor region of substrate 6-105 is exposed at the second location from which second portion 6-176b was removed, contact 6-116 may be electrically coupled to the bulk semiconductor region of substrate 6-105 below.

It should be appreciated that the etching and metal deposit steps described in connection with FIGS. 6-1A to 6-1E may be performed in any order. For example, etching and depositing contact 6-116 may be performed prior to etching and depositing contact 6-114, etching space for contact 6-116 may be performed prior to etching space for contact 6-114, and/or depositing contact 6-116 may be performed prior to depositing contact 6-114, according to various embodiments. In some embodiments, contacts 6-114 and 6-116 may be deposited in different steps. In some embodiments, contact 6-114 may be formed using an at least partially opaque material and/or electrically insulative material.

FIGS. 6-2A to 6-2E are diagrams of steps 6-252 to 2-260 of an alternative exemplary method for constructing contacts 2-214a-b and 2-216a-c of pixel 2-212 of FIGS. 2-2A and 2-2B, according to some embodiments. At steps 6-252 and 6-254 shown in FIGS. 6-2A and 6-2B, respectively, the bulk semiconductor region of substrate 6-205 includes dielectric stack 6-272 and ILD layer 6-274, which may be configured in the manner described for substrate 6-105, dielectric stack 6-172, and ILD layer 2-174 in connection with FIG. 6-1A. In some embodiments, steps 6-252 and 6-254 may be performed in the manner described for steps 6-152 and 6-154 in connection with FIGS. 6-1A and 6-1B, respectively with first portion 6-276a being removed from dielectric stack 6-272 and ILD layer 6-274. However, at step 6-256 shown in FIG. 6-2C, contact 6-214 may be deposited in the location from which first portion 6-276a was removed in step 6-154b. In some embodiments, contact 6-214 may include metal. Alternatively or additionally, contact 6-214 may include an optically opaque material. For example, contact 6-214 may not be electrically conductive. In some embodiments, a top surface of contact 6-214 may be polished. Also at step 6-256, an additional dielectric layer (e.g., sacrificial layer) 6-280 may be deposited on top of contact 6-214 (e.g., on the polished surface) to accommodate the PR layer 6-278, shown in FIG. 6-2D. At step 6-258 shown in FIG. 6-2D, PR layer 6-278 may be placed and patterned for removing (e.g., etching) second portion 6-276b of ILD layer 6-274 and dielectric film stack 6-272. The bulk semiconductor region of substrate 6-205 may be exposed upon removing second portion 6-287b of ILD layer 6-274 and dielectric film stack 6-272 to enable electrical coupling with the bulk semiconductor region of substrate 6-205. At step 6-260 shown in FIG. 6-2E, PR layer 6-278 may be removed and contact 6-216 may be deposited in the location from which second portion 6-176b was removed. Accordingly, contact 6-216 may be electrically coupled to the bulk semiconductor region of substrate 6-205.

It should be appreciated that the etching and metal deposit steps described in connection with FIGS. 6-2A to 6-2E may be performed in any order. For example, etching and depositing contact 6-216 may be performed prior to etching and depositing contact 6-214, etching space for contact 6-216 may be performed prior to etching space for contact 6-214, and/or depositing contact 6-216 may be performed prior to depositing contact 6-214, according to various embodiments.

FIGS. 6-3A to 6-3D are diagrams of an exemplary method for constructing metal layer METAL0 of pixel 2-512 of FIG. 2-5, according to some embodiments. At step 6-352 shown in FIG. 6-3A, transfer gates TX, ST0, and REJ have dielectric film stack 6-372 and ILD layer 6-374 thereupon, which may be configured in the manner described for dielectric film stack 6-172 and ILD layer 6-174 in connection with FIG. 6-1A. For example, the dielectric film stack may include silicon oxide and SiON. At step 6-354 shown in FIG. 6-3B, first portion of ILD 6-374 may be removed (e.g., etched). For example, first portion 6-376a may be positioned above transfer gates TX and ST0. At step 6-356 shown in FIG. 6-3C, metal layer METAL0 may be deposited in the location from which first portion 6-376a of ILD layer 6-374 was removed. At step 6-358 shown in FIG. 6-3D, second portion 6-376b of ILD layer 6-374 may be removed and contact 6-316 may be deposited over transfer gate REJ. In some embodiments, contact 6-316 may be configured in the manner described for contact 6-116 in connection with FIGS. 6-1A to 6-1E. Second portion 6-376b may include at least some of the SiON above transfer gate REJ.

It should be appreciated that the etching and metal deposit steps described in connection with FIGS. 6-3A to 6-3D may be performed in any order. For example, etching and depositing metal layer METAL0 may be performed prior to etching and depositing contact 6-316, etching space for contact 6-316 may be performed prior to etching space for metal layer METAL0, and/or depositing contact 6-316 may be performed prior to depositing metal layer METAL0, according to various embodiments.

FIGS. 6-4A to 6-4C are diagrams of an alternative exemplary method for constructing metal layer METAL0 of pixel 2-512 of FIG. 2-5, according to some embodiments. At step 6-452 shown in FIG. 6-3A, transfer gates TX, ST0, and REJ have dielectric film stack 6-472 thereupon. For example, dielectric film stack 6-472 may include insulative film including SiON. At step 6-454 shown in FIG. 6-4B, metal layer METAL0 may be deposited over at least one of control terminals TX, ST0, and REJ and/or photodetection region PPD. At step 6-456 shown in FIG. 6-4C, at least some of metal layer METAL0 may be removed (e.g., etched), such as above control terminals TX, ST0, and/or REJ, and/or above photodetection region PD, readout region FD, and/or drain region D. In some embodiments, some of metal layer METAL0 may be left above readout region FD and/or photodetection region PD, such as shown in FIG. 6-4C. At step 6-458, contact 6-416 may be deposited. In some embodiments, contact 6-416 may be configured in the manner described for contact 6-116 in connection with FIGS. 6-1A to 6-1E. In some embodiments, ILD layer 6-474 may be deposited over the portions of metal layer METAL0 that were not removed at step 6-456, and contact 6-416 may be deposited above control terminals TX, ST0, and/or REJ, with ILD layer 6-474 deposited above metal layer METAL0. In some embodiments, ILD layer 6-474 may not be deposited above portions of metal layer METAL0 positioned above control terminal REJ.

It should be appreciated that the etching and metal deposit steps described in connection with FIGS. 6-4A to 6-4D may be performed in any order. For example, etching and depositing metal layer METAL0 may be performed prior to etching and depositing contact 6-416, etching space for contact 6-416 may be performed prior to etching space for metal layer METAL0, and/or depositing contact 6-416 may be performed prior to depositing metal layer METAL0, according to various embodiments.

VI. DNA and/or RNA Sequencing Applications

An analytic system described herein may include an integrated device and an instrument configured to interface with the integrated device. The integrated device may include an array of pixels, where a pixel includes a reaction chamber and at least one photodetector. A surface of the integrated device may have a plurality of reaction chambers, where a reaction chamber is configured to receive a sample from a suspension placed on the surface of the integrated device. A suspension may contain multiple samples of a same type, and in some embodiments, different types of samples. In this regard, the phrase "sample of interest" as used herein can refer to a plurality of samples of a same type that are dispersed in a suspension, for example. Similarly, the phrase "molecule of interest" as used herein can refer to a plurality of molecules of a same type that are dispersed in a suspension. The plurality of reaction chambers may have a suitable size and shape such that at least a portion of the reaction chambers receive one sample from a suspension. In some embodiments, the number of samples within a reaction chamber may be distributed among the reaction chambers such that some reaction chambers contain one sample with others contain zero, two or more samples.

In some embodiments, a suspension may contain multiple single-stranded DNA templates, and individual reaction chambers on a surface of an integrated device may be sized and shaped to receive a sequencing template. Sequencing templates may be distributed among the reaction chambers of the integrated device such that at least a portion of the reaction chambers of the integrated device contain a sequencing template. The suspension may also contain labeled nucleotides which then enter in the reaction chamber and may allow for identification of a nucleotide as it is incorporated into a strand of DNA complementary to the single-stranded DNA template in the reaction chamber. In some embodiments, the suspension may contain sequencing templates and labeled nucleotides may be subsequently introduced to a reaction chamber as nucleotides are incorporated into a complementary strand within the reaction chamber. In this manner, timing of incorporation of nucleotides may be controlled by when labeled nucleotides are introduced to the reaction chambers of an integrated device.

Excitation light is provided from an excitation source located separate from the pixel array of the integrated device. The excitation light is directed at least in part by elements of the integrated device towards one or more pixels to illuminate an illumination region within the reaction chamber. A marker may then emit emission light when located within the illumination region and in response to being illuminated by excitation light. In some embodiments, one or more excitation sources are part of the instrument of the system where components of the instrument and the integrated device are configured to direct the excitation light towards one or more pixels.

Emission light emitted from a reaction chamber (e.g., by a fluorescent label) may then be detected by one or more photodetectors within a pixel of the integrated device. Characteristics of the detected emission light may provide an indication for identifying the marker associated with the emission light. Such characteristics may include any suitable type of characteristic, including an arrival time of photons detected by a photodetector, an amount of photons accumulated over time by a photodetector, and/or a distribution of photons across two or more photodetectors. In some embodiments, a photodetector may have a configuration that allows for the detection of one or more timing characteristics associated with emission light (e.g., fluorescence lifetime). The photodetector may detect a distribution of photon arrival times after a pulse of excitation light propagates through the integrated device, and the distribution of arrival times may provide an indication of a timing characteristic of the emission light (e.g., a proxy for fluorescence lifetime). In some embodiments, the one or more photodetectors provide an indication of the probability of emission light emitted by the marker (e.g., fluorescence intensity). In some embodiments, a plurality of photodetectors may be sized and arranged to capture a spatial distribution of the emission light. Output signals from the one or more photodetectors may then be used to distinguish a marker from among a plurality of markers, where the plurality of markers may be used to identify a sample or its structure. In some embodiments, a sample may be excited by multiple excitation energies, and emission light and/or timing characteristics of the emission light from the reaction chamber in response to the multiple excitation energies may distinguish a marker from a plurality of markers.

A schematic overview of the system 5-100 is illustrated in FIG. 5-1A. The system comprises both an integrated device 5-102 that interfaces with an instrument 5-104. In some embodiments, instrument 5-104 may include one or more excitation sources 5-106 integrated as part of instrument 5-104. In some embodiments, an excitation source may be external to both instrument 5-104 and integrated device 5-102, and instrument 5-104 may be configured to receive excitation light from the excitation source and direct excitation light to the integrated device. The integrated device may interface with the instrument using any suitable socket for receiving the integrated device and holding it in precise optical alignment with the excitation source. The excitation source 5-106 may be configured to provide excitation light to the integrated device 5-102. As illustrated schematically in FIG. 5-1A, the integrated device 5-102 has a plurality of pixels 5-112, where at least a portion of pixels may perform independent analysis of a sample of interest. Such pixels 5-112 may be referred to as "passive source pixels" since a pixel receives excitation light from a source 5-106 separate from the pixel, where excitation light from the source excites some or all of the pixels 5-112. Excitation source 5-106 may be any suitable light source. Examples of suitable excitation sources are described in U.S. patent application Ser. No. 14/821,688, filed Aug. 7, 2015, titled "INTEGRATED DEVICE FOR PROBING, DETECTING AND ANALYZING MOLECULES," which is incorporated by reference in its entirety. In some embodiments, excitation source 5-106 includes multiple excitation sources that are combined to deliver excitation light to integrated device 5-102. The multiple excitation sources may be configured to produce multiple excitation energies or wavelengths.

A pixel 5-112 has a reaction chamber 5-108 configured to receive a single sample of interest and a photodetector 5-110 for detecting emission light emitted from the reaction chamber in response to illuminating the sample and at least a portion of the reaction chamber 5-108 with excitation light provided by the excitation source 5-106. In some embodiments, reaction chamber 5-108 may retain the sample in proximity to a surface of integrated device 5-102, which may ease delivery of excitation light to the sample and detection of emission light from the sample or a reaction component (e.g., a labeled nucleotide).

Optical elements for coupling excitation light from excitation light source 5-106 to integrated device 5-102 and guiding excitation light to the reaction chamber 5-108 are located both on integrated device 5-102 and the instrument 5-104. Source-to-chamber optical elements may comprise one or more grating couplers located on integrated device 5-102 to couple excitation light to the integrated device and waveguides to deliver excitation light from instrument 5-104 to reaction chambers in pixels 5-112. One or more optical splitter elements may be positioned between a grating coupler and the waveguides. The optical splitter may couple excitation light from the grating coupler and deliver excitation light to at least one of the waveguides. In some embodiments, the optical splitter may have a configuration that allows for delivery of excitation light to be substantially uniform across all the waveguides such that each of the waveguides receives a substantially similar amount of excitation light. Such embodiments may improve performance of the integrated device by improving the uniformity of excitation light received by reaction chambers of the integrated device.

Reaction chamber 5-108, a portion of the excitation source-to-chamber optics, and the reaction chamber-to-photodetector optics are located on integrated device 5-102. Excitation source 5-106 and a portion of the source-to-chamber components are located in instrument 5-104. In some embodiments, a single component may play a role in both coupling excitation light to reaction chamber 5-108 and delivering emission light from reaction chamber 5-108 to photodetector 5-110. Examples of suitable components, for coupling excitation light to a reaction chamber and/or directing emission light to a photodetector, to include in an integrated device are described in U.S. patent application Ser. No. 14/821,688, filed Aug. 7, 2015, titled "INTEGRATED DEVICE FOR PROBING, DETECTING AND ANALYZING MOLECULES," and U.S. patent application Ser. No. 14/543,865, filed Nov. 17, 2014, titled "INTEGRATED DEVICE WITH EXTERNAL LIGHT SOURCE FOR PROBING, DETECTING, AND ANALYZING MOLECULES," both of which are incorporated by reference in their entirety.

Pixel 5-112 is associated with its own individual reaction chamber 5-108 and at least one photodetector 5-110. The plurality of pixels of integrated device 5-102 may be arranged to have any suitable shape, size, and/or dimensions. Integrated device 5-102 may have any suitable number of pixels. The number of pixels in integrated device 2-102 may be in the range of approximately 10,000 pixels to 1,000,000 pixels or any value or range of values within that range. In some embodiments, the pixels may be arranged in an array of 512 pixels by 512 pixels. Integrated device 5-102 may interface with instrument 5-104 in any suitable manner. In some embodiments, instrument 5-104 may have an interface that detachably couples to integrated device 5-102 such that a user may attach integrated device 5-102 to instrument 5-104 for use of integrated device 5-102 to analyze at least one sample of interest in a suspension and remove integrated device 5-102 from instrument 5-104 to allow for another integrated device to be attached. The interface of instrument 5-104 may position integrated device 5-102 to couple with circuitry of instrument 5-104 to allow for readout signals from one or more photodetectors to be transmitted to instrument 5-104. Integrated device 5-102 and instrument 5-104 may include multi-channel, high-speed communication links for handling data associated with large pixel arrays (e.g., more than 10,000 pixels).

A cross-sectional schematic of integrated device 5-102 illustrating a row of pixels 5-112 is shown in FIG. 5-1B. Integrated device 5-102 may include coupling region 5-201, routing region 5-202, and pixel region 5-203. Pixel region 5-203 may include a plurality of pixels 5-112 having reaction chambers 5-108 positioned on a surface at a location separate from coupling region 5-201, which is where excitation light (shown as the dashed arrow) couples to integrated device 5-102. Reaction chambers 5-108 may be formed through metal layer(s) 5-116. One pixel 5-112, illustrated by the dotted rectangle, is a region of integrated device 5-102 that includes a reaction chamber 5-108 and a photodetection region having one or more photodetectors 5-110.

FIG. 5-1B illustrates the path of excitation (shown in dashed lines) by coupling a beam of excitation light to coupling region 5-201 and to reaction chambers 5-108. The row of reaction chambers 5-108 shown in FIG. 5-1B may be positioned to optically couple with waveguide 5-220. Excitation light may illuminate a sample located within a reaction chamber. The sample or a reaction component (e.g., fluorescent label) may reach an excited state in response to being illuminated by the excitation light. When in an excited state, the sample or reaction component may emit emission light, which may be detected by one or more photodetectors associated with the reaction chamber. FIG. 5-1B schematically illustrates the path of emission light (shown as the solid line) from a reaction chamber 5-108 to photodetector(s) 5-110 of pixel 5-112. The photodetector(s) 5-110 of pixel 5-112 may be configured and positioned to detect emission light from reaction chamber 5-108. Examples of suitable photodetectors are described in U.S. patent application Ser. No. 14/821,656, filed Aug. 7, 2015, titled "INTEGRATED DEVICE FOR TEMPORAL BINNING OF RECEIVED PHOTONS," which is incorporated by reference in its entirety. For an individual pixel 5-112, a reaction chamber 5-108 and its respective photodetector(s) 5-110 may be aligned along a common axis (along the y-direction shown in FIG. 5-1B). In this manner, the photodetector(s) may overlap with the reaction chamber within a pixel 5-112.

The directionality of the emission light from a reaction chamber 5-108 may depend on the positioning of the sample in the reaction chamber 5-108 relative to metal layer(s) 5-116 because metal layer(s) 5-116 may act to reflect emission light. In this manner, a distance between metal layer(s) 5-116 and a fluorescent marker positioned in a reaction chamber 5-108 may impact the efficiency of photodetector(s) 5-110, that are in the same pixel as the reaction chamber, to detect the light emitted by the fluorescent marker. The distance between metal layer(s) 5-116 and the bottom surface of a reaction chamber 5-106, which is proximate to where a sample may be positioned during operation, may be in the range of 100 nm to 500 nm, or any value or range of values in that range. In some embodiments the distance between metal layer(s) 5-116 and the bottom surface of a reaction chamber 5-108 is approximately 300 nm.

The distance between the sample and the photodetector(s) may also impact efficiency in detecting emission light. By decreasing the distance light has to travel between the sample and the photodetector(s), detection efficiency of emission light may be improved. In addition, smaller distances between the sample and the photodetector(s) may allow for pixels that occupy a smaller area footprint of the integrated device, which can allow for a higher number of pixels to be included in the integrated device. The distance between the bottom surface of a reaction chamber 5-108 and photodetector(s) may be in the range of 1 μm to 15 μm, or any value or range of values in that range.

Photonic structure(s) 5-230 may be positioned between reaction chambers 5-108 and photodetectors 5-110 and configured to reduce or prevent excitation light from reaching photodetectors 5-110, which may otherwise contribute to signal noise in detecting emission light. As shown in FIG. 5-1B, the one or more photonic structures 5-230 may be positioned between waveguide 5-220 and photodetectors 5-110. Photonic structure(s) 5-230 may include one or more optical rejection photonic structures including a spectral filter, a polarization filter, and a spatial filter. Photonic structure(s) 5-230 may be positioned to align with individual reaction chambers 5-108 and their respective photodetector(s) 5-110 along a common axis. Metal layers 5-240, which may act as a circuitry for integrated device 5-102, may also act as a spatial filter, in accordance with some embodiments. In such embodiments, one or more metal layers 5-240 may be positioned to block some or all excitation light from reaching photodetector(s) 5-110.

Coupling region 5-201 may include one or more optical components configured to couple excitation light from an external excitation source. Coupling region 5-201 may include grating coupler 5-216 positioned to receive some or all of a beam of excitation light. Examples of suitable grating couplers are described in U.S. patent application Ser. No. 15/844,403, filed Dec. 15, 2017, titled "OPTICAL COUPLER AND WAVEGUIDE SYSTEM," which is incorporated by reference in its entirety. Grating coupler 5-216 may couple excitation light to waveguide 5-220, which may be configured to propagate excitation light to the proximity of one or more reaction chambers 5-108. Alternatively, coupling region 5-201 may comprise other well-known structures for coupling light into a waveguide.

Components located off of the integrated device may be used to position and align the excitation source 5-106 to the integrated device. Such components may include optical components including lenses, mirrors, prisms, windows, apertures, attenuators, and/or optical fibers. Additional mechanical components may be included in the instrument to allow for control of one or more alignment components. Such mechanical components may include actuators, stepper motors, and/or knobs. Examples of suitable excitation sources and alignment mechanisms are described in U.S. patent application Ser. No. 15/161,088, filed May 20, 2016, titled "PULSED LASER AND SYSTEM," which is incorporated by reference in its entirety. Another example of a beam-steering module is described in U.S. patent application Ser. No. 15/842,720, filed Dec. 14, 2017, titled "COMPACT BEAM SHAPING AND STEERING ASSEMBLY," which is incorporated herein by reference.

A sample to be analyzed may be introduced into reaction chamber 5-108 of pixel 5-112. The sample may be a biological sample or any other suitable sample, such as a chemical sample. In some cases, the suspension may include multiple molecules of interest and the reaction chamber may be configured to isolate a single molecule. In some instances, the dimensions of the reaction chamber may act to confine a single molecule within the reaction chamber, allowing measurements to be performed on the single molecule. Excitation light may be delivered into the reaction chamber 5-108, so as to excite the sample or at least one fluorescent marker attached to the sample or otherwise associated with the sample while it is within an illumination area within the reaction chamber 5-108.

In operation, parallel analyses of samples within the reaction chambers are carried out by exciting some or all of the samples within the reaction chambers using excitation light and detecting signals with the photodetectors that are representative of emission light from the reaction chambers. Emission light from a sample or reaction component (e.g., fluorescent label) may be detected by a corresponding photodetector and converted to at least one electrical signal. The electrical signals may be transmitted along conducting lines (e.g., metal layers 5-240) in the circuitry of the integrated device, which may be connected to an instrument interfaced with the integrated device. The electrical signals may be subsequently processed and/or analyzed. Processing or analyzing of electrical signals may occur on a suitable computing device either located on or off the instrument.

Instrument 5-104 may include a user interface for controlling operation of instrument 5-104 and/or integrated device 5-102. The user interface may be configured to allow a user to input information into the instrument, such as commands and/or settings used to control the functioning of the instrument. In some embodiments, the user interface may include buttons, switches, dials, and a microphone for voice commands. The user interface may allow a user to receive feedback on the performance of the instrument and/or integrated device, such as proper alignment and/or information obtained by readout signals from the photodetectors on the integrated device. In some embodiments, the user interface may provide feedback using a speaker to provide audible feedback. In some embodiments, the user interface may include indicator lights and/or a display screen for providing visual feedback to a user.

In some embodiments, instrument 5-104 may include a computer interface configured to connect with a computing device. Computer interface may be a USB interface, a FireWire interface, or any other suitable computer interface. Computing device may be any general purpose computer, such as a laptop or desktop computer. In some embodiments, computing device may be a server (e.g., cloud-based server) accessible over a wireless network via a suitable computer interface. The computer interface may facilitate communication of information between instrument 5-104 and the computing device. Input information for controlling and/or configuring the instrument 5-104 may be provided to the computing device and transmitted to instrument 5-104 via the computer interface. Output information generated by instrument 5-104 may be received by the computing device via the computer interface. Output information may include feedback about performance of instrument 5-104, performance of integrated device 5-112, and/or data generated from the readout signals of photodetector 5-110.

In some embodiments, instrument 5-104 may include a processing device configured to analyze data received from one or more photodetectors of integrated device 5-102 and/or transmit control signals to excitation source(s) 2-106. In some embodiments, the processing device may comprise a general purpose processor, a specially-adapted processor (e.g., a central processing unit (CPU) such as one or more microprocessor or microcontroller cores, a field-programmable gate array (FPGA), an application-specific integrated circuit (ASIC), a custom integrated circuit, a digital signal processor (DSP), or a combination thereof.) In some embodiments, the processing of data from one or more photodetectors may be performed by both a processing device of instrument 5-104 and an external computing device. In other embodiments, an external computing device may be omitted and processing of data from one or more photodetectors may be performed solely by a processing device of integrated device 5-102.

Referring to FIG. 5-1C, a portable, advanced analytic instrument 5-100 can comprise one or more pulsed optical sources 5-106 mounted as a replaceable module within, or otherwise coupled to, the instrument 5-100. The portable analytic instrument 5-100 can include an optical coupling system 5-115 and an analytic system 5-160. The optical coupling system 5-115 can include some combination of optical components (which may include, for example, none, one from among, or more than one component from among the following components: lens, mirror, optical filter, attenuator, beam-steering component, beam shaping component) and be configured to operate on and/or couple output optical pulses 5-122 from the pulsed optical source 5-106 to the analytic system 5-160. The analytic system 5-160 can include a plurality of components that are arranged to direct the optical pulses to at least one reaction chamber for sample analysis, receive one or more optical signals (e.g., fluorescence, backscattered radiation) from the at least one reaction chamber, and produce one or more electrical signals representative of the received optical signals. In some embodiments, the analytic system 5-160 can include one or more photodetectors and may also include signal-processing electronics (e.g., one or more microcontrollers, one or more field-programmable gate arrays, one or more microprocessors, one or more digital signal processors, logic gates, etc.) configured to process the electrical signals from the photodetectors. The analytic system 5-160 can also include data transmission hardware configured to transmit and receive data to and from external devices (e.g., one or more external devices on a network to which the instrument 5-100 can connect via one or more data communications links). In some embodiments, the analytic system 5-160 can be configured to receive a bio-optoelectronic chip 5-140, which holds one or more samples to be analyzed.

FIG. 5-1D depicts a further detailed example of a portable analytical instrument 5-100 that includes a compact pulsed optical source 5-108. In this example, the pulsed optical source 5-108 comprises a compact, passively mode-locked laser module 5-113. A passively mode-locked laser can produce optical pulses autonomously, without the application of an external pulsed signal. In some implementations, the module can be mounted to an instrument chassis or frame 5-103, and may be located inside an outer casing of the instrument. According to some embodiments, a pulsed optical source 5-106 can include additional components that can be used to operate the optical source and operate on an output beam from the optical source 5-106. A mode-locked laser 5-113 may comprise an element (e.g., saturable absorber, acousto-optic modulator, Kerr lens) in a laser cavity, or coupled to the laser cavity, that induces phase locking of the laser's longitudinal frequency modes. The laser cavity can be defined in part by cavity end mirrors 5-111, 5-119. Such locking of the frequency modes results in pulsed operation of the laser (e.g., an intracavity pulse 5-120 bounces back-and-forth between the cavity end mirrors) and produces a stream of output optical pulses 5-122 from one end mirror 5-111 which is partially transmitting.

In some cases, the analytic instrument 5-100 is configured to receive a removable, packaged, bio-optoelectronic or optoelectronic chip 5-140 (also referred to as a "disposable chip"). The disposable chip can include a bio-optoelectronic chip, for example, that comprises a plurality of reaction chambers, integrated optical components arranged to deliver optical excitation energy to the reaction chambers, and integrated photodetectors arranged to detect fluorescent emission from the reaction chambers. In some implementations, the chip 5-140 can be disposable after a single use, whereas in other implementations the chip 5-140 can be reused two or more times. When the chip 5-140 is received by the instrument 5-100, it can be in electrical and optical communication with the pulsed optical source 5-106 and with apparatus in the analytic system 5-160. Electrical communication may be made through electrical contacts on the chip package, for example.

In some embodiments and referring to FIG. 5-1D, the disposable chip 5-140 can be mounted (e.g., via a socket connection) on an electronic circuit board 5-130, such as a printed circuit board (PCB) that can include additional instrument electronics. For example, the PCB 5-130 can include circuitry configured to provide electrical power, one or more clock signals, and control signals to the optoelectronic chip 5-140, and signal-processing circuitry arranged to receive signals representative of fluorescent emission detected from the reaction chambers. Data returned from the optoelectronic chip can be processed in part or entirely by electronics on the instrument 5-100, although data may be transmitted via a network connection to one or more remote data processors, in some implementations. The PCB 5-130 can also include circuitry configured to receive feedback signals from the chip relating to optical coupling and power levels of the optical pulses 5-122 coupled into waveguides of the optoelectronic chip 5-140. The feedback signals can be provided to one or both of the pulsed optical source 5-106 and optical system 5-115 to control one or more parameters of the output beam of optical pulses 5-122. In some cases, the PCB 5-130 can provide or route power to the pulsed optical source 5-106 for operating the optical source and related circuitry in the optical source 5-106.

According to some embodiments, the pulsed optical source 5-106 comprises a compact mode-locked laser module 5-113. The mode-locked laser can comprise a gain medium 5-105 (which can be solid-state material in some embodiments), an output coupler 5-111, and a laser-cavity end mirror 5-119. The mode-locked laser's optical cavity can be bound by the output coupler 5-111 and end mirror 5-119. An optical axis 5-125 of the laser cavity can have one or more folds (turns) to increase the length of the laser cavity and provide a desired pulse repetition rate. The pulse repetition rate is determined by the length of the laser cavity (e.g., the time for an optical pulse to make a round-trip within the laser cavity).

In some embodiments, there can be additional optical elements (not shown in FIG. 5-1D) in the laser cavity for beam shaping, wavelength selection, and/or pulse forming. In some cases, the end mirror 5-119 comprises a saturable-absorber mirror (SAM) that induces passive mode locking of longitudinal cavity modes and results in pulsed operation of the mode-locked laser. The mode-locked laser module 5-113 can further include a pump source (e.g., a laser diode, not shown in FIG. 5-1D) for exciting the gain medium 5-105. Further details of a mode-locked laser module 5-113 can be found in U.S. patent application Ser. No. 15/844,469, titled "Compact Mode-Locked Laser Module," filed Dec. 15, 2017, each application of which is incorporated herein by reference.

When the laser 5-113 is mode locked, an intracavity pulse 5-120 can circulate between the end mirror 5-119 and the output coupler 5-111, and a portion of the intracavity pulse can be transmitted through the output coupler 5-111 as an output pulse 5-122. Accordingly, a train of output pulses 5-122, as depicted in the graph of FIG. 5-2, can be detected at the output coupler as the intracavity pulse 5-120 bounces back-and-forth between the output coupler 5-111 and end mirror 5-119 in the laser cavity.

FIG. 5-2 depicts temporal intensity profiles of the output pulses 5-122, though the illustration is not to scale. In some embodiments, the peak intensity values of the emitted pulses may be approximately equal, and the profiles may have a Gaussian temporal profile, though other profiles such as a $sech^2$ profile may be possible. In some cases, the pulses may not have symmetric temporal profiles and may have other temporal shapes. The duration of each pulse may be characterized by a full-width-half-maximum (FWHM) value, as indicated in FIG. 5-2. According to some embodiments of a mode-locked laser, ultrashort optical pulses can have FWHM values less than 100 picoseconds (ps). In some cases, the FWHM values can be between approximately 5 ps and approximately 30 ps.

The output pulses 5-122 can be separated by regular intervals T. For example, T can be determined by a round-trip travel time between the output coupler 5-111 and cavity end mirror 5-119. According to some embodiments, the pulse-separation interval T can be between about 1 ns and about 30 ns. In some cases, the pulse-separation interval T can be between about 5 ns and about 20 ns, corresponding to a laser-cavity length (an approximate length of the optical axis 5-125 within the laser cavity) between about 0.7 meter and about 3 meters. In embodiments, the pulse-separation interval corresponds to a round trip travel time in the laser cavity, so that a cavity length of 3 meters (round-trip distance of 6 meters) provides a pulse-separation interval T of approximately 20 ns.

According to some embodiments, a desired pulse-separation interval T and laser-cavity length can be determined by a combination of the number of reaction chambers on the chip 5-140, fluorescent emission characteristics, and the speed of data-handling circuitry for reading data from the optoelectronic chip 5-140. In embodiments, different fluorophores can be distinguished by their different fluorescent decay rates or characteristic lifetimes. Accordingly, there needs to be a sufficient pulse-separation interval T to collect adequate statistics for the selected fluorophores to distinguish between their different decay rates. Additionally, if the pulse-separation interval T is too short, the data handling circuitry cannot keep up with the large amount of data being collected by the large number of reaction chambers. Pulse-separation interval T between about 5 ns and about 20 ns is suitable for fluorophores that have decay rates up to about 2 ns and for handling data from between about 60,000 and 10,000,000 reaction chambers.

According to some implementations, a beam-steering module 5-150 can receive output pulses from the pulsed optical source 5-106 and is configured to adjust at least the position and incident angles of the optical pulses onto an optical coupler (e.g., grating coupler) of the optoelectronic chip 5-140. In some cases, the output pulses 5-122 from the pulsed optical source 5-106 can be operated on by a beam-steering module 5-150 to additionally or alternatively change a beam shape and/or beam rotation at an optical coupler on the optoelectronic chip 5-140. In some implementations, the beam-steering module 5-150 can further provide focusing and/or polarization adjustments of the beam of output pulses onto the optical coupler. One example of a beam-steering module is described in U.S. patent application Ser. No. 15/161,088 titled "Pulsed Laser and Bioanalytic System," filed May 20, 2016, which is incorporated herein by reference. Another example of a beam-steering module is described in a separate U.S. patent application No. 62/435,679, filed Dec. 16, 2016 and titled "Compact Beam Shaping and Steering Assembly," which is incorporated herein by reference.

Referring to FIG. 5-3, the output pulses 5-122 from a pulsed optical source can be coupled into one or more optical waveguides 5-312 on a bio-optoelectronic chip 5-140, for example. In some embodiments, the optical pulses can be coupled to one or more waveguides via a grating coupler 5-310, though coupling to an end of one or more optical waveguides on the optoelectronic chip can be used in some embodiments. According to some embodiments, a quad detector 5-320 can be located on a semiconductor substrate 5-305 (e.g., a silicon substrate) for aiding in alignment of the beam of optical pulses 5-122 to a grating coupler 5-310. The one or more waveguides 5-312 and reaction chambers or reaction chambers 5-330 can be integrated on the same semiconductor substrate with intervening dielectric layers (e.g., silicon dioxide layers) between the substrate, waveguide, reaction chambers, and photodetectors 5-322.

Each waveguide 5-312 can include a tapered portion 5-315 below the reaction chambers 5-330 to equalize optical power coupled to the reaction chambers along the waveguide. The reducing taper can force more optical energy outside the waveguide's core, increasing coupling to the reaction chambers and compensating for optical losses along the waveguide, including losses for light coupling into the reaction chambers. A second grating coupler 5-317 can be located at an end of each waveguide to direct optical energy to an integrated photodiode 5-324. The integrated photodiode can detect an amount of power coupled down a waveguide and provide a detected signal to feedback circuitry that controls the beam-steering module 5-150, for example.

The reaction chambers 5-330 or reaction chambers 5-330 can be aligned with the tapered portion 5-315 of the waveguide and recessed in a tub 5-340. There can be photodetectors 5-322 located on the semiconductor substrate 5-305 for each reaction chamber 5-330. In some embodiments, a semiconductor absorber (shown in FIG. 5-5 as an optical filter 5-530) may be located between the waveguide and a photodetector 5-322 at each pixel. A metal coating and/or multilayer coating 5-350 can be formed around the reaction chambers and above the waveguide to prevent optical excitation of fluorophores that are not in the reaction chambers (e.g., dispersed in a solution above the reaction chambers). The metal coating and/or multilayer coating 5-350 may be raised beyond edges of the tub 5-340 to reduce absorptive losses of the optical energy in the waveguide 5-312 at the input and output ends of each waveguide.

There can be a plurality of rows of waveguides, reaction chambers, and time-binning photodetectors on the optoelectronic chip 5-140. For example, there can be 128 rows, each having 512 reaction chambers, for a total of 65,536 reaction chambers in some implementations. Other implementations may include fewer or more reaction chambers, and may include other layout configurations. Optical power from the pulsed optical source 5-106 can be distributed to the multiple waveguides via one or more star couplers or multi-mode interference couplers, or by any other means, located between an optical coupler 5-310 to the chip 5-140 and the plurality of waveguides 5-312.

FIG. 5-4 illustrates optical energy coupling from an optical pulse 5-122 within a tapered portion of waveguide 5-315 to a reaction chamber 5-330. The drawing has been produced from an electromagnetic field simulation of the optical wave that accounts for waveguide dimensions, reaction chamber dimensions, the different materials' optical properties, and the distance of the tapered portion of waveguide 5-315 from the reaction chamber 5-330. The waveguide can be formed from silicon nitride in a surrounding medium 5-410 of silicon dioxide, for example. The waveguide, surrounding medium, and reaction chamber can be formed by microfabrication processes described in U.S. application Ser. No. 14/821,688, filed Aug. 7, 2015, titled "Integrated Device for Probing, Detecting and Analyzing Molecules." According to some embodiments, an evanescent optical field 5-420 couples optical energy transported by the waveguide to the reaction chamber 5-330.

A non-limiting example of a biological reaction taking place in a reaction chamber 5-330 is depicted in FIG. 5-5. The example depicts sequential incorporation of nucleotides or nucleotide analogs into a growing strand that is complementary to a target nucleic acid. The sequential incorporation can take place in a reaction chamber 5-330, and can be detected by an advanced analytic instrument to sequence DNA. The reaction chamber can have a depth between about 150 nm and about 250 nm and a diameter between about 80 nm and about 160 nm. A metallization layer 5-540 (e.g., a metallization for an electrical reference potential) can be patterned above a photodetector 5-322 to provide an aperture or iris that blocks stray light from adjacent reaction chambers and other unwanted light sources. According to some embodiments, polymerase 5-520 can be located within the reaction chamber 5-330 (e.g., attached to a base of the chamber). The polymerase can take up a target nucleic acid 5-510 (e.g., a portion of nucleic acid derived from DNA), and sequence a growing strand of complementary nucleic acid to produce a growing strand of DNA 5-512. Nucleotides or nucleotide analogs labeled with different fluorophores can be dispersed in a solution above and within the reaction chamber.

When a labeled nucleotide or nucleotide analog 5-610 is incorporated into a growing strand of complementary nucleic acid, as depicted in FIG. 5-6, one or more attached fluorophores 5-630 can be repeatedly excited by pulses of optical energy coupled into the reaction chamber 5-330 from the waveguide 5-315. In some embodiments, the fluorophore or fluorophores 5-630 can be attached to one or more nucleotides or nucleotide analogs 5-610 with any suitable linker 5-620. An incorporation event may last for a period of time up to about 100 ms. During this time, pulses of fluorescent emission resulting from excitation of the fluorophore(s) by pulses from the mode-locked laser can be detected with a time-binning photodetector 5-322, for example. In some embodiments, there can be one or more additional integrated electronic devices 5-323 at each pixel for signal handling (e.g., amplification, read-out, routing, signal preprocessing, etc.). According to some embodiments, each pixel can include at least one optical filter 5-530 (e.g., a semiconductor absorber) that passes fluorescent emission and reduces transmission of radiation from the excitation pulse. Some implementations may not use the optical filter 5-530. By attaching fluorophores with different emission characteristics (e.g., fluorescent decay rates, intensity, fluorescent wavelength) to the different nucleotides (A,C,G,T), detecting and distinguishing the different emission characteristics while the strand of DNA 5-512 incorporates a nucleic acid and enables determination of the genetic sequence of the growing strand of DNA.

Figures 2, 3, 4, 5, 6, 7:
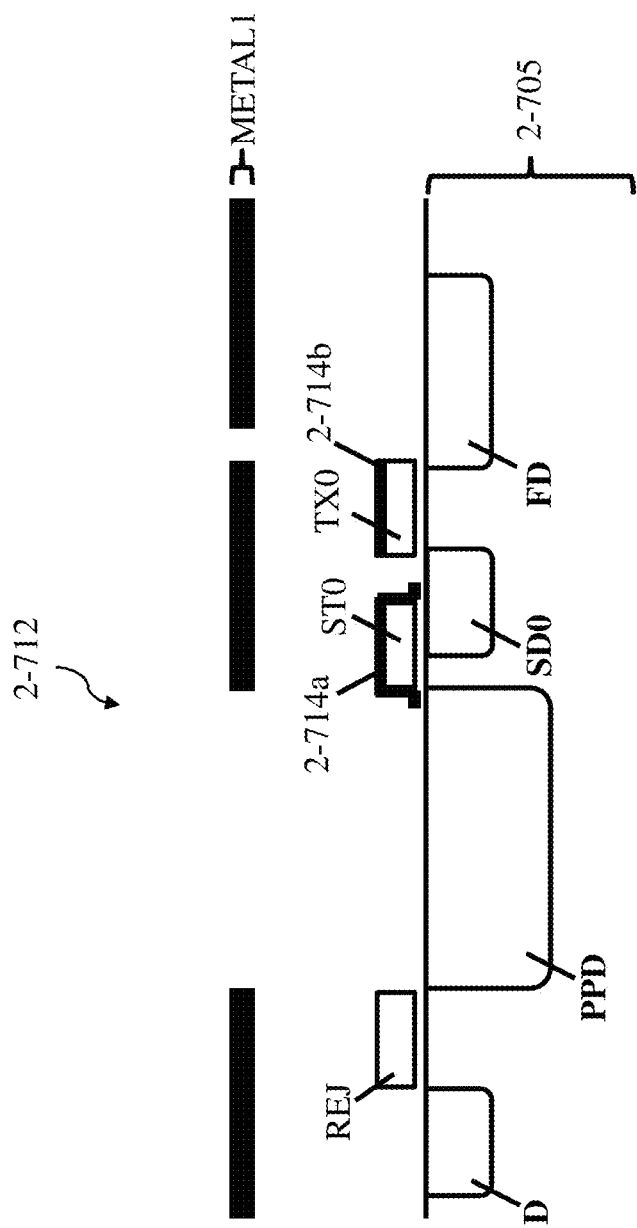
Figures 2, 3, 4, 5, 6, 7, 8, 8A:
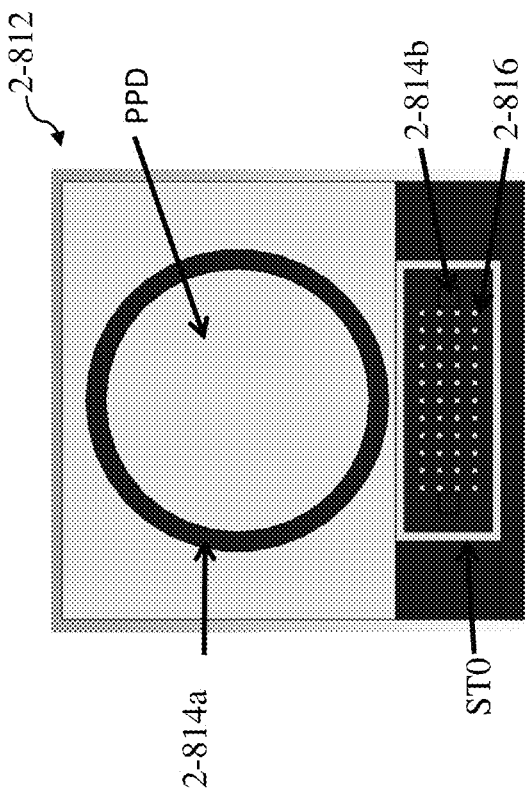
Figures 2, 3, 4, 5, 6, 7, 8, 8B:
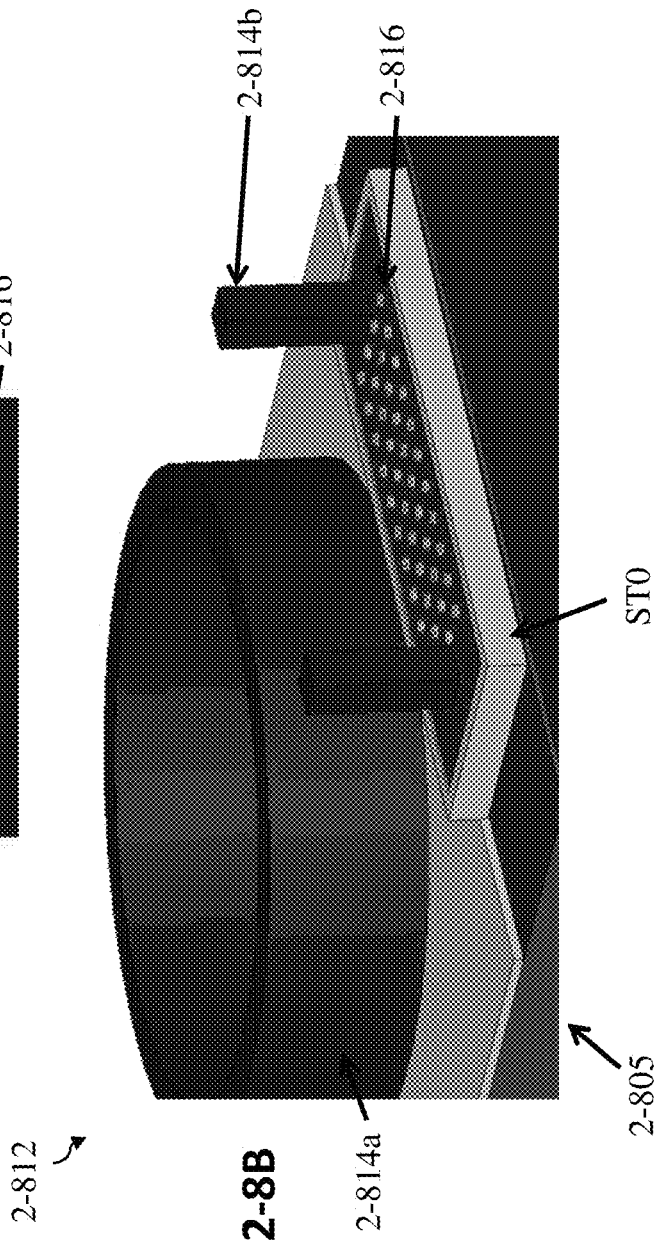
Figures 2, 3, 4, 5, 6, 7, 8, 9, 9A:
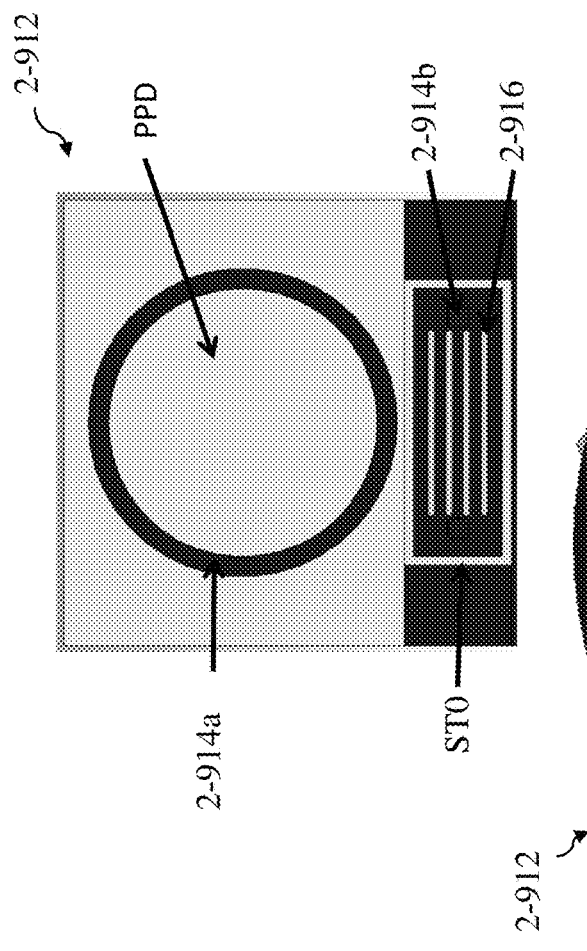
Figures 2, 3, 4, 5, 6, 7, 8, 9, 9B:
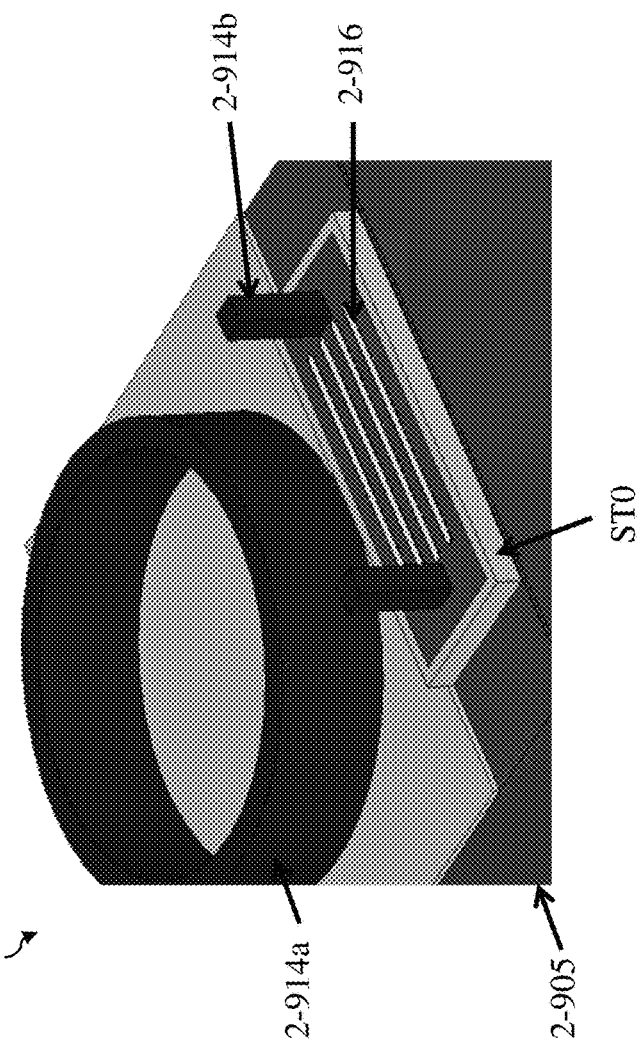
Figures 2, 3, 4, 5, 6, 7, 8, 9, 10, 10A:
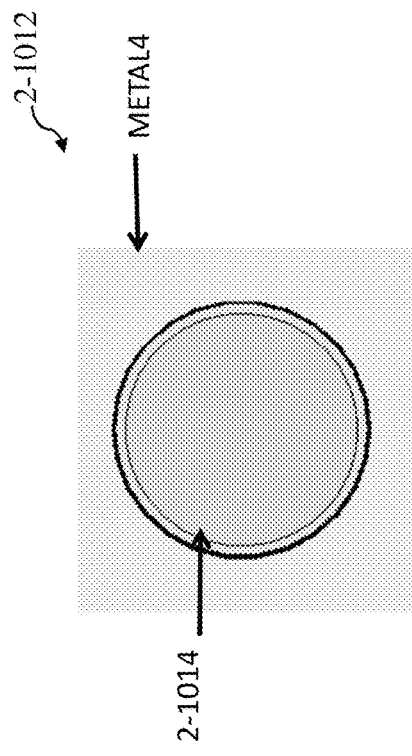
Figures 2, 3, 4, 5, 6, 7, 8, 9, 10, 10B:
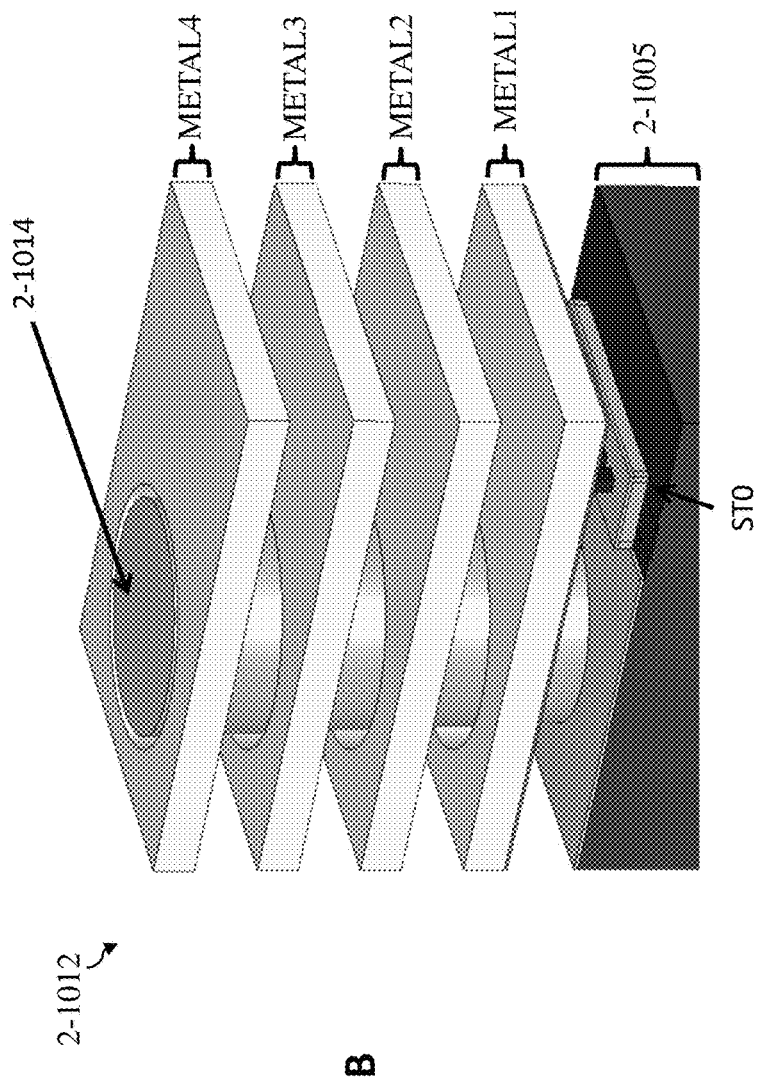
Figures 2, 3, 4, 5, 6, 7, 8, 9, 10, 10C:
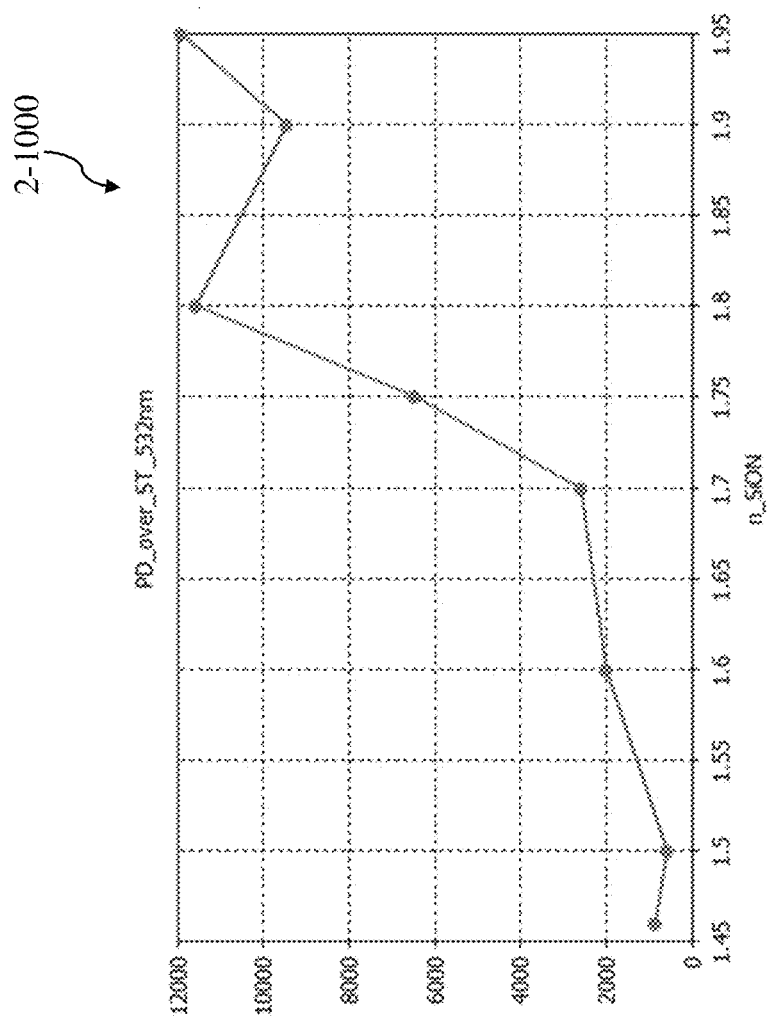
Figures 1, 3:
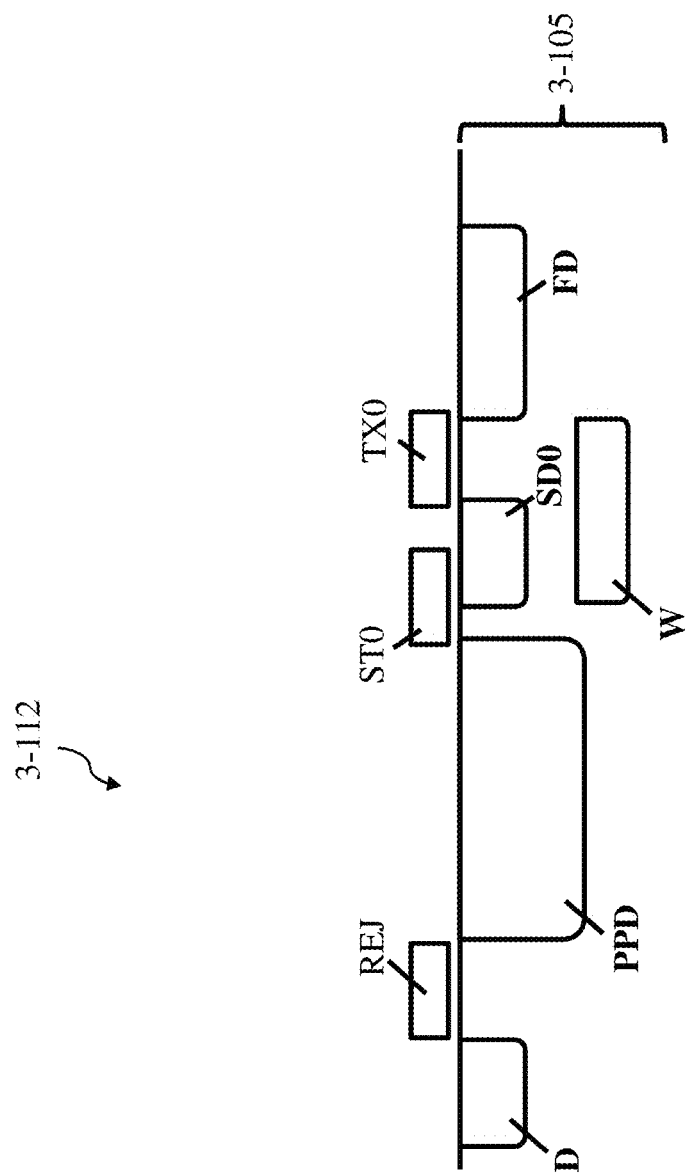
Figures 2, 3:
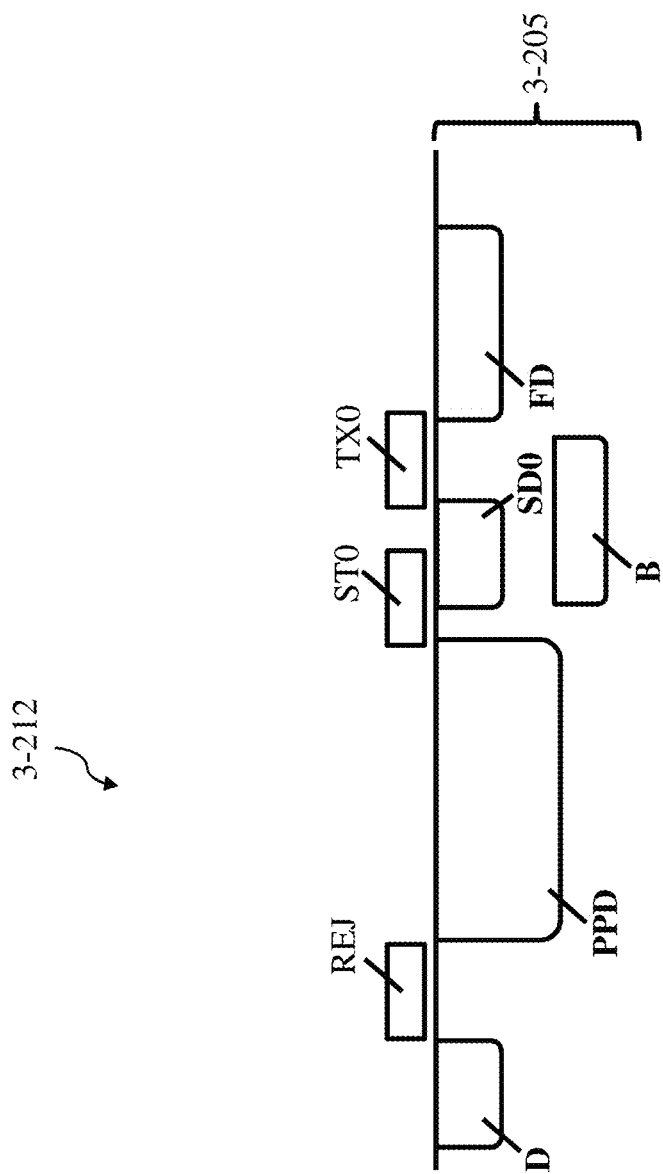
Figures 3, 4, 4A, 4B:
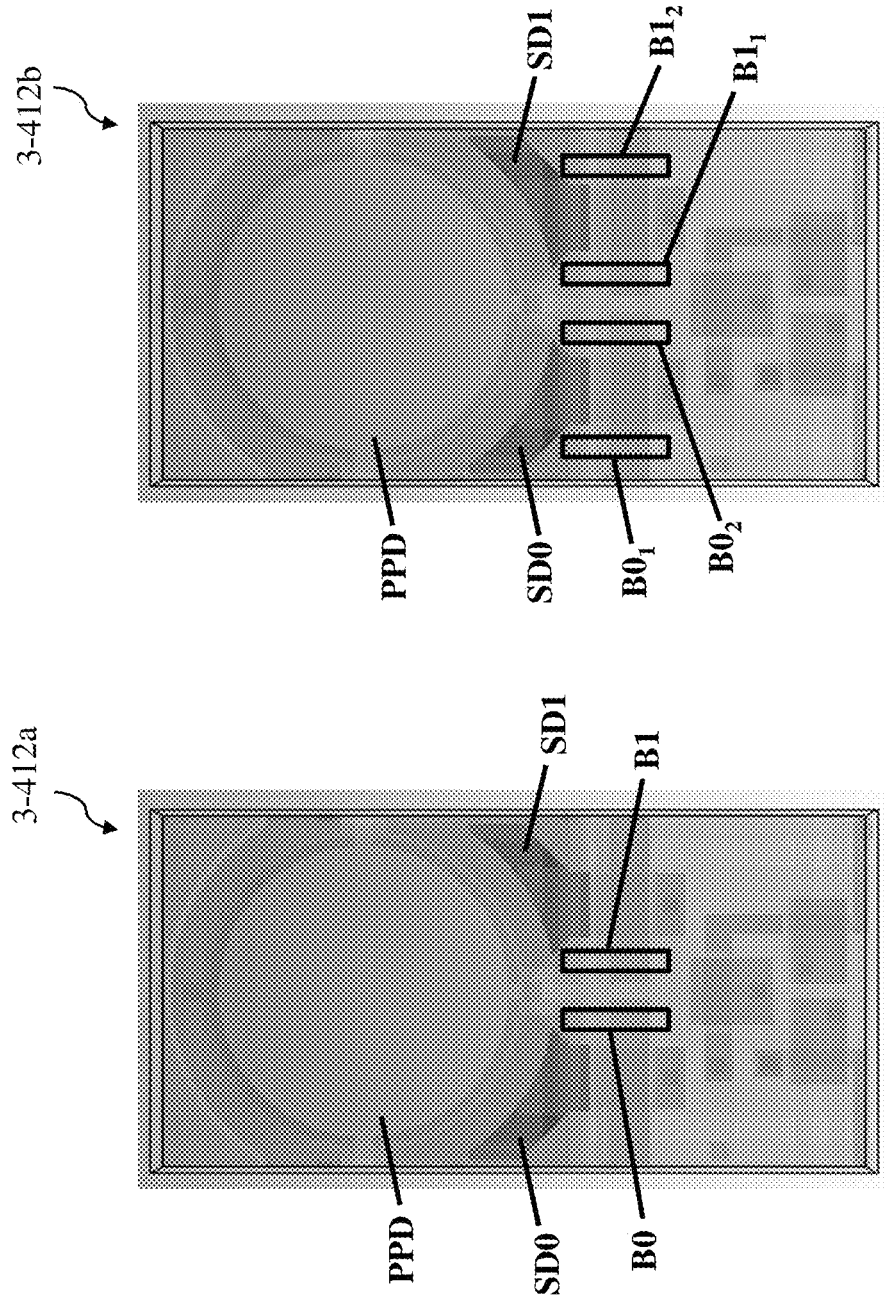
Figures 3, 4, 5:
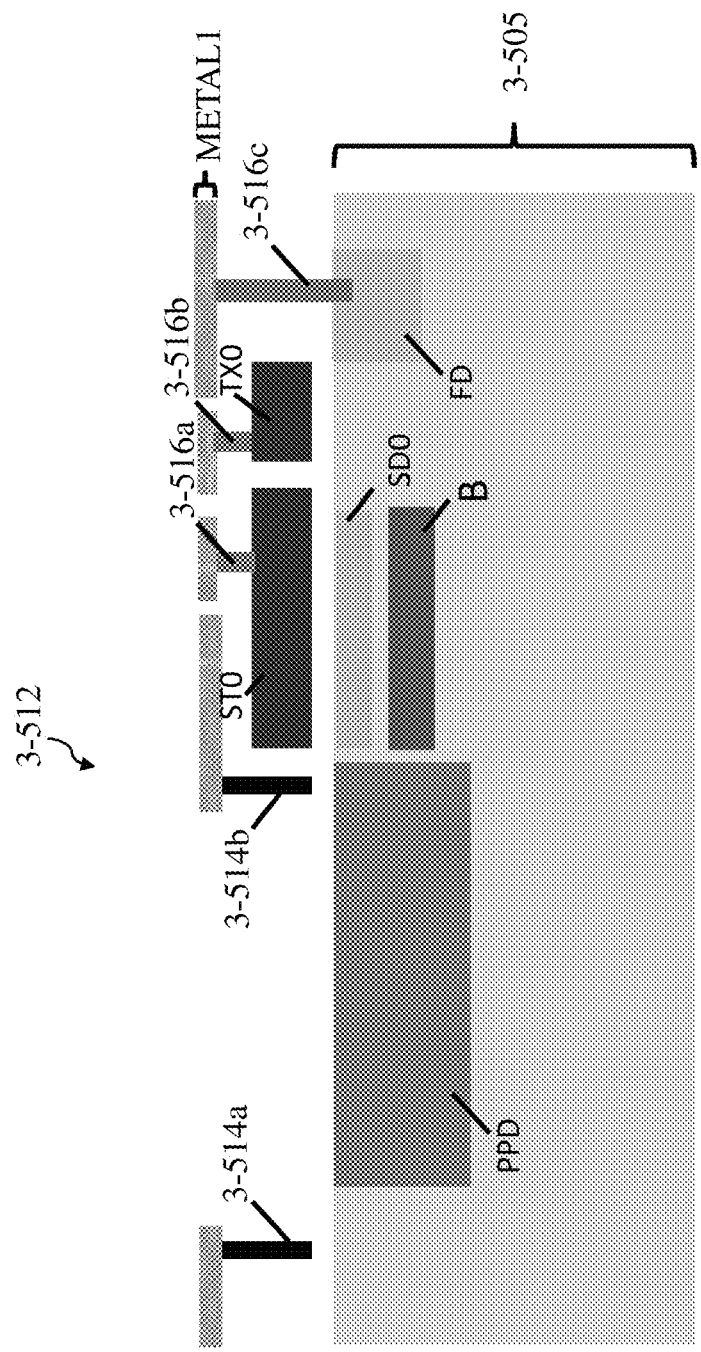
Figures 1, 2, 4:
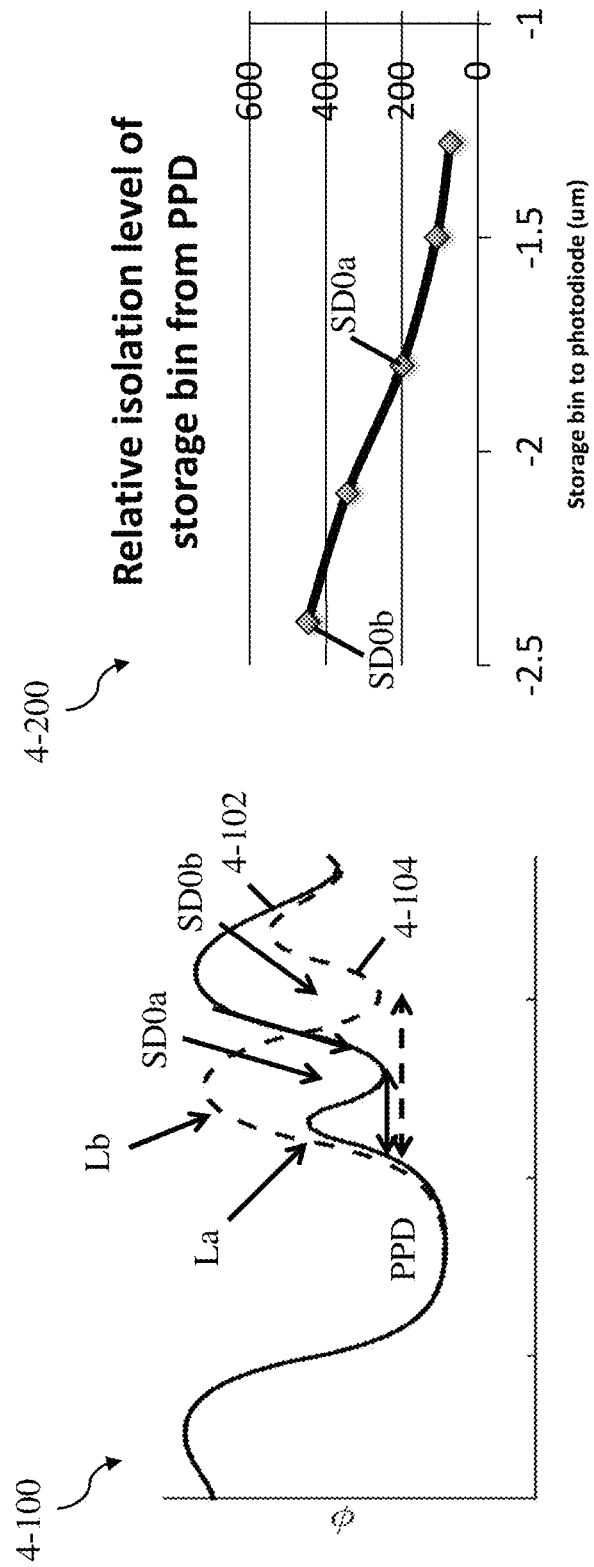
Figures 3, 4:
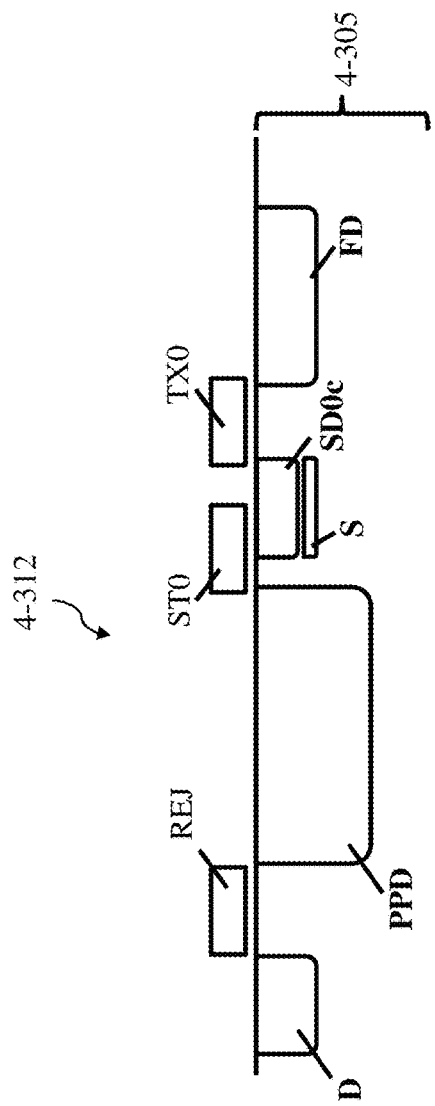
Figure 4:
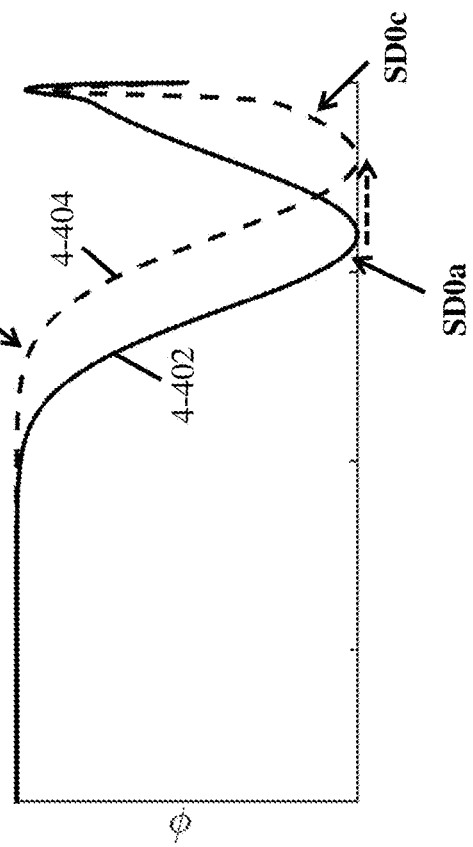

According to some embodiments, an advanced analytic instrument 5-100 that is configured to analyze samples based on fluorescent emission characteristics can detect differences in fluorescent lifetimes and/or intensities between different fluorescent molecules, and/or differences between lifetimes and/or intensities of the same fluorescent molecules in different environments. By way of explanation, FIG. 5-7 plots two different fluorescent emission probability curves (A and B), which can be representative of fluorescent emission from two different fluorescent molecules, for example. With reference to curve A (dashed line), after being excited by a short or ultrashort optical pulse, a probability $p_A(t)$ of a fluorescent emission from a first molecule may decay with time, as depicted. In some cases, the decrease in the probability of a photon being emitted over time can be represented by an exponential decay function $p_A(t) = P_{Ao}e^{-t/\tau_1}$, where $P_{Ao}$ is an initial emission probability and $\tau_1$ is a temporal parameter associated with the first fluorescent molecule that characterizes the emission decay probability. Ti may be referred to as the "fluorescence lifetime," "emission lifetime," or "lifetime" of the first fluorescent molecule. In some cases, the value of $\tau_1$ can be altered by a local environment of the fluorescent molecule. Other fluorescent molecules can have different emission characteristics than that shown in curve A. For example, another fluorescent molecule can have a decay profile that differs from a single exponential decay, and its lifetime can be characterized by a half-life value or some other metric.

A second fluorescent molecule may have a decay profile $p_B(t)$ that is exponential, but has a measurably different lifetime $\tau_2$, as depicted for curve B in FIG. 5-7. In the example shown, the lifetime for the second fluorescent molecule of curve B is shorter than the lifetime for curve A, and the probability of emission $p_B(t)$ is higher sooner after excitation of the second molecule than for curve A. Different fluorescent molecules can have lifetimes or half-life values ranging from about 0.1 ns to about 20 ns, in some embodiments.

Differences in fluorescent emission lifetimes can be used to discern between the presence or absence of different fluorescent molecules and/or to discern between different environments or conditions to which a fluorescent molecule is subjected. In some cases, discerning fluorescent molecules based on lifetime (rather than emission wavelength, for example) can simplify aspects of an analytical instrument 5-100. As an example, wavelength-discriminating optics (such as wavelength filters, dedicated detectors for each wavelength, dedicated pulsed optical sources at different wavelengths, and/or diffractive optics) can be reduced in number or eliminated when discerning fluorescent molecules based on lifetime. In some cases, a single pulsed optical source operating at a single characteristic wavelength can be used to excite different fluorescent molecules that emit within a same wavelength region of the optical spectrum but have measurably different lifetimes. An analytic system that uses a single pulsed optical source, rather than multiple sources operating at different wavelengths, to excite and discern different fluorescent molecules emitting in a same wavelength region can be less complex to operate and maintain, more compact, and can be manufactured at lower cost.

Although analytic systems based on fluorescent lifetime analysis can have certain benefits, the amount of information obtained by an analytic system and/or detection accuracy can be increased by allowing for additional detection techniques. For example, some analytic systems 5-160 can additionally be configured to discern one or more properties of a sample based on fluorescent wavelength and/or fluorescent intensity.

Referring again to FIG. 5-7, according to some embodiments, different fluorescent lifetimes can be distinguished with a photodetector that is configured to time-bin fluorescent emission events following excitation of a fluorescent molecule. The time binning can occur during a single charge-accumulation cycle for the photodetector. A charge-accumulation cycle is an interval between read-out events during which photo-generated carriers are accumulated in bins of the time-binning photodetector. The concept of determining fluorescent lifetime by time-binning of emission events is introduced graphically in FIG. 5-8. At time $t_e$ just prior to $t_1$, a fluorescent molecule or ensemble of fluorescent molecules of a same type (e.g., the type corresponding to curve B of FIG. 5-7) is (are) excited by a short or ultrashort optical pulse. For a large ensemble of molecules, the intensity of emission can have a time profile similar to curve B, as depicted in FIG. 5-8.

For a single molecule or a small number of molecules, however, the emission of fluorescent photons occurs according to the statistics of curve B in FIG. 5-7, for this example. A time-binning photodetector 5-322 can accumulate carriers generated from emission events into discrete time bins. Three bins are indicated in FIG. 5-8, though fewer bins or more bins may be used in embodiments. The bins are temporally resolved with respect to the excitation time $t_e$ of the fluorescent molecule(s). For example, a first bin can accumulate carriers produced during an interval between times $t_1$ and $t_2$, occurring after the excitation event at time $t_e$. A second bin can accumulate carriers produced during an interval between times $t_2$ and $t_3$, and a third bin can accumulate carriers produced during an interval between times $t_3$ and Li. When a large number of emission events are summed, carriers accumulated in the time bins can approximate the decaying intensity curve shown in FIG. 5-8, and the binned signals can be used to distinguish between different fluorescent molecules or different environments in which a fluorescent molecule is located.

Examples of a time-binning photodetector 5-322 are described in U.S. patent application Ser. No. 14/821,656, filed Aug. 7, 2015, titled "Integrated Device for Temporal Binning of Received Photons" and in U.S. patent application Ser. No. 15/852,571, filed Dec. 22, 2017, titled "Integrated Photodetector with Direct Binning Pixel," which are both incorporated herein by reference in their entirety. For explanation purposes, a non-limiting embodiment of a time-binning photodetector is depicted in FIG. 5-9. A single time-binning photodetector 5-322 can comprise a photon-absorption/carrier-generation region 5-902, a carrier-discharge channel 5-906, and a plurality of carrier-storage bins 5-908a, 5-908b all formed on a semiconductor substrate. Carrier-transport channels 5-907 can connect between the photon-absorption/carrier-generation region 5-902 and carrier-storage bins 5-908a, 5-908b. In the illustrated example, two carrier-storage bins are shown, but there may be more or fewer. There can be a read-out channel 5-910 connected to the carrier-storage bins. The photon-absorption/carrier-generation region 5-902, carrier-discharge channel 5-906, carrier-storage bins 5-908a, 5-908b, and read-out channel 5-910 can be formed by doping the semiconductor locally and/or forming adjacent insulating regions to provide photodetection capability, confinement, and transport of carriers. A time-binning photodetector 5-322 can also include a plurality of electrodes 5-920, 5-921, 5-922, 5-923, 5-924 formed on the substrate that are configured to generate electric fields in the device for transporting carriers through the device.

In operation, a portion of an excitation pulse 5-122 from a pulsed optical source 5-106 (e.g., a mode-locked laser) is delivered to a reaction chamber 5-330 over the time-binning photodetector 5-322. Initially, some excitation radiation photons 5-901 may arrive at the photon-absorption/carrier-generation region 5-902 and produce carriers (shown as light-shaded circles). There can also be some fluorescent emission photons 5-903 that arrive with the excitation radiation photons 5-901 and produce corresponding carriers (shown as dark-shaded circles). Initially, the number of carriers produced by the excitation radiation can be too large compared to the number of carriers produced by the fluorescent emission. The initial carriers produced during a time interval $|t_e-t_1|$ can be rejected by gating them into a carrier-discharge channel 5-906 with a first transfer gate 5-920, for example.

At a later times mostly fluorescent emission photons 5-903 arrive at the photon-absorption/carrier-generation region 5-902 and produce carriers (indicated a dark-shaded circles) that provide useful and detectable signal that is representative of fluorescent emission from the reaction chamber 5-330. According to some detection methods, a second electrode 5-921 and third electrode 5-923 can be gated at a later time to direct carriers produced at a later time (e.g., during a second time interval $|t_1-t_2|$) to a first carrier-storage bin 5-908a. Subsequently, a fourth electrode 5-922 and fifth electrode 5-924 can be gated at a later time (e.g., during a third time interval $|t_2-t_3|$) to direct carriers to a second carrier-storage bin 5-908b. Charge accumulation can continue in this manner after excitation pulses for a large number of excitation pulses to accumulate an appreciable number of carriers and signal level in each carrier-storage bin 5-908a, 5-908b. At a later time, the signal can be read out from the bins. In some implementations, the time intervals corresponding to each storage bin are at the sub-nanosecond time scale, though longer time scales can be used in some embodiments (e.g., in embodiments where fluorophores have longer decay times).

The process of generating and time-binning carriers after an excitation event (e.g., excitation pulse from a pulsed optical source) can occur once after a single excitation pulse or be repeated multiple times after multiple excitation pulses during a single charge-accumulation cycle for the time-binning photodetector 5-322. After charge accumulation is complete, carriers can be read out of the storage bins via the read-out channel 5-910. For example, an appropriate biasing sequence can be applied to electrodes 5-923, 5-924 and at least to electrode 5-940 to remove carriers from the storage bins 5-908a, 5-908b. The charge accumulation and read-out processes can occur in a massively parallel operation on the optoelectronic chip 5-140 resulting in frames of data.

Although the described example in connection with FIG. 5-9 includes multiple charge storage bins 5-908a, 5-908b in some cases a single charge storage bin may be used instead. For example, only bin1 may be present in a time-binning photodetector 5-322. In such a case, a single storage bins 5-908a can be operated in a variable time-gated manner to look at different time intervals after different excitation events. For example, after pulses in a first series of excitation pulses, electrodes for the storage bin 5-908a can be gated to collect carriers generated during a first time interval (e.g., during the second time interval $|t_1-t_2|$), and the accumulated signal can be read out after a first predetermined number of pulses. After pulses in a subsequent series of excitation pulses at the same reaction chamber, the same electrodes for the storage bin 5-908a can be gated to collect carriers generated during a different interval (e.g., during the third time interval $|t_2-t_3|$), and the accumulated signal can be read out after a second predetermined number of pulses. Carriers could be collected during later time intervals in a similar manner if needed. In this manner, signal levels corresponding to fluorescent emission during different time periods after arrival of an excitation pulse at a reaction chamber can be produced using a single carrier-storage bin.

Regardless of how charge accumulation is carried out for different time intervals after excitation, signals that are read out can provide a histogram of bins that are representative of the fluorescent emission decay characteristics, for example. An example process is illustrated in FIG. 5-10A and FIG. 5-10B, for which two charge-storage bins are used to acquire fluorescent emission from the reaction chambers. The histogram's bins can indicate a number of photons detected during each time interval after excitation of the fluorophore(s) in a reaction chamber 5-330. In some embodiments, signals for the bins will be accumulated following a large number of excitation pulses, as depicted in FIG. 5-10A. The excitation pulses can occur at times $t_{e1}, t_{e2}, t_{e3}, \ldots t_{eN}$ which are separated by the pulse interval time T. In some cases, there can be between $10^5$ and $10^7$ excitation pulses 5-122 (or portions thereof) applied to a reaction chamber during an accumulation of signals in the electron-storage bins for a single event being observed in the reaction chamber (e.g., a single nucleotide incorporation event in DNA analysis). In some embodiments, one bin (bin 0) can be configured to detect an amplitude of excitation energy delivered with each optical pulse, and may be used as a reference signal (e.g., to normalize data). In other cases, the excitation pulse amplitude may be stable, determined one or more times during signal acquisition, and not determined after each excitation pulse so that there is no bin0 signal acquisition after each excitation pulse. In such cases, carriers produced by an excitation pulse can be rejected and dumped from the photon-absorption/carrier-generation region 5-902 as described above in connection with FIG. 5-9.

In some implementations, only a single photon may be emitted from a fluorophore following an excitation event, as depicted in FIG. 5-10A. After a first excitation event at time $t_{e1}$, the emitted photon at time $t_{f1}$ may occur within a first time interval (e.g., between times $t_1$ and $t_2$), so that the resulting electron signal is accumulated in the first electron-storage bin (contributes to bin 1). In a subsequent excitation event at time $t_{e2}$, the emitted photon at time $t_{f2}$ may occur within a second time interval (e.g., between times $t_2$ and $t_3$), so that the resulting electron signal contributes to bin 2. After a next excitation event at time $t_{e3}$, a photon may emit at a time $t_{f3}$ occurring within the first time interval.

In some implementations, there may not be a fluorescent photon emitted and/or detected after each excitation pulse received at a reaction chamber 5-330. In some cases, there can be as few as one fluorescent photon that is detected at a reaction chamber for every 10,000 excitation pulses delivered to the reaction chamber. One advantage of implementing a mode-locked laser 5-113 as the pulsed excitation source 5-106 is that a mode-locked laser can produce short optical pulses having high intensity and quick turn-off times at high pulse-repetition rates (e.g., between 50 MHz and 250 MHz). With such high pulse-repetition rates, the number of excitation pulses within a 10 millisecond charge-accumulation interval can be 50,000 to 250,000, so that detectable signal can be accumulated.

After a large number of excitation events and carrier accumulations, the carrier-storage bins of the time-binning photodetector 5-322 can be read out to provide a multi-valued signal (e.g., a histogram of two or more values, an N-dimensional vector, etc.) for a reaction chamber. The signal values for each bin can depend upon the decay rate of the fluorophore. For example and referring again to FIG. 5-8, a fluorophore having a decay curve B will have a higher ratio of signal in bin 1 to bin 2 than a fluorophore having a decay curve A. The values from the bins can be analyzed and compared against calibration values, and/or each other, to determine the particular fluorophore present. For a sequencing application, identifying the fluorophore can determine the nucleotide or nucleotide analog that is being incorporated into a growing strand of DNA, for example. For other applications, identifying the fluorophore can determine an identity of a molecule or specimen of interest, which may be linked to the fluorophore.

To further aid in understanding the signal analysis, the accumulated, multi-bin values can be plotted as a histogram, as depicted in FIG. 5-10B for example, or can be recorded as a vector or location in N-dimensional space. Calibration runs can be performed separately to acquire calibration values for the multi-valued signals (e.g., calibration histograms) for four different fluorophores linked to the four nucleotides or nucleotide analogs. As an example, the calibration histograms may appear as depicted in FIG. 5-11A (fluorescent label associated with the T nucleotide), FIG. 5-11B (fluorescent label associated with the A nucleotide), FIG. 5-11C (fluorescent label associated with the C nucleotide), and FIG. 5-11D (fluorescent label associated with the G nucleotide). A comparison of the measured multi-valued signal (corresponding to the histogram of FIG. 5-10B) to the calibration multi-valued signals can determine the identity "T" (FIG. 5-11A) of the nucleotide or nucleotide analog being incorporated into the growing strand of DNA.

In some implementations, fluorescent intensity can be used additionally or alternatively to distinguish between different fluorophores. For example, some fluorophores may emit at significantly different intensities or have a significant difference in their probabilities of excitation (e.g., at least a difference of about 35%) even though their decay rates may be similar. By referencing binned signals (bins 5-3) to measured excitation energy and/or other acquired signals, it can be possible to distinguish different fluorophores based on intensity levels.

In some embodiments, different numbers of fluorophores of the same type can be linked to different nucleotides or nucleotide analogs, so that the nucleotides can be identified based on fluorophore intensity. For example, two fluorophores can be linked to a first nucleotide (e.g., "C") or nucleotide analog and four or more fluorophores can be linked to a second nucleotide (e.g., "T") or nucleotide analog. Because of the different numbers of fluorophores, there may be different excitation and fluorophore emission probabilities associated with the different nucleotides. For example, there may be more emission events for the "T" nucleotide or nucleotide analog during a signal accumulation interval, so that the apparent intensity of the bins is significantly higher than for the "C" nucleotide or nucleotide analog.

Distinguishing nucleotides or any other biological or chemical specimens based on fluorophore decay rates and/or fluorophore intensities enables a simplification of the optical excitation and detection systems in an analytical instrument 5-100. For example, optical excitation can be performed with a single-wavelength source (e.g., a source producing one characteristic wavelength rather than multiple sources or a source operating at multiple different characteristic wavelengths). Additionally, wavelength-discriminating optics and filters may not be needed in the detection system to distinguish between fluorophores of different wavelengths. Also, a single photodetector can be used for each reaction chamber to detect emission from different fluorophores.

The phrase "characteristic wavelength" or "wavelength" is used to refer to a central or predominant wavelength within a limited bandwidth of radiation (e.g., a central or peak wavelength within a 20 nm bandwidth output by a pulsed optical source). In some cases, "characteristic wavelength" or "wavelength" may be used to refer to a peak wavelength within a total bandwidth of radiation output by a source.

Fluorophores having emission wavelengths in a range between about 560 nm and about 900 nm can provide adequate amounts of fluorescence to be detected by a time-binning photodetector (which can be fabricated on a silicon wafer using CMOS processes). These fluorophores can be linked to biological molecules of interest, such as nucleotides or nucleotide analogs for genetic sequencing applications. Fluorescent emission in this wavelength range can be detected with higher responsivity in a silicon-based photodetector than fluorescence at longer wavelengths. Additionally, fluorophores and associated linkers in this wavelength range may not interfere with incorporation of the nucleotides or nucleotide analogs into growing strands of DNA. In some implementations, fluorophores having emission wavelengths in a range between about 560 nm and about 660 nm can be optically excited with a single-wavelength source. An example fluorophore in this range is Alexa Fluor 647, available from Thermo Fisher Scientific Inc. of Waltham, Mass. Excitation energy at shorter wavelengths (e.g., between about 500 nm and about 650 nm) may be used to excite fluorophores that emit at wavelengths between about 560 nm and about 900 nm. In some embodiments, the time-binning photodetectors can efficiently detect longer-wavelength emission from the reaction chambers, e.g., by incorporating other materials, such as Ge, into the photodetectors' active regions.

VII. Protein Sequencing Applications

Some aspects of the present disclosure may be useful for protein sequencing. For example, some aspects of the present disclosure are useful for determining amino acid sequence information from polypeptides (e.g., for sequencing one or more polypeptides). In some embodiments, amino acid sequence information can be determined for single polypeptide molecules. In some embodiments, one or more amino acids of a polypeptide are labeled (e.g., directly or indirectly) and the relative positions of the labeled amino acids in the polypeptide are determined. In some embodiments, the relative positions of amino acids in a protein are determined using a series of amino acid labeling and cleavage steps.

In some embodiments, the identity of a terminal amino acid (e.g., an N-terminal or a C-terminal amino acid) is assessed, after which the terminal amino acid is removed and the identity of the next amino acid at the terminus is assessed, and this process is repeated until a plurality of successive amino acids in the polypeptide are assessed. In some embodiments, assessing the identity of an amino acid comprises determining the type of amino acid that is present. In some embodiments, determining the type of amino acid comprises determining the actual amino acid identity, for example by determining which of the naturally-occurring 20 amino acids is the terminal amino acid is (e.g., using a recognition molecule that is specific for an individual terminal amino acid). However, in some embodiments assessing the identity of a terminal amino acid type can comprise determining a subset of potential amino acids that can be present at the terminus of the polypeptide. In some embodiments, this can be accomplished by determining that an amino acid is not one or more specific amino acids (and therefore could be any of the other amino acids). In some embodiments, this can be accomplished by determining which of a specified subset of amino acids (e.g., based on size, charge, hydrophobicity, binding properties) could be at the terminus of the polypeptide (e.g., using a recognition molecule that binds to a specified subset of two or more terminal amino acids).

Amino acids of a polypeptide can be indirectly labeled, for example, using amino acid recognition molecules that selectively bind one or more types of amino acids on the polypeptide. Amino acids of a polypeptide can be directly labeled, for example, by selectively modifying one or more types of amino acid side chains on the polypeptide with uniquely identifiable labels. Methods of selective labeling of amino acid side chains and details relating to the preparation and analysis of labeled polypeptides are known in the art (see, e.g., Swaminathan, et al. *PLoS Comput Biol.* 2015, 11(2):e1004080). Accordingly, in some embodiments, the one or more types of amino acids are identified by detecting binding of one or more amino acid recognition molecules that selectively bind the one or more types of amino acids. In some embodiments, the one or more types of amino acids are identified by detecting labeled polypeptide.

In some embodiments, the relative position of labeled amino acids in a protein can be determined without removing amino acids from the protein but by translocating a labeled protein through a pore (e.g., a protein channel) and detecting a signal (e.g., a Förster resonance energy transfer (FRET) signal) from the labeled amino acid(s) during translocation through the pore in order to determine the relative position of the labeled amino acids in the protein molecule.

As used herein, sequencing a polypeptide refers to determining sequence information for a polypeptide. In some embodiments, this can involve determining the identity of each sequential amino acid for a portion (or all) of the polypeptide. However, in some embodiments, this can involve assessing the identity of a subset of amino acids within the polypeptide (e.g., and determining the relative position of one or more amino acid types without determining the identity of each amino acid in the polypeptide). However, in some embodiments amino acid content information can be obtained from a polypeptide without directly determining the relative position of different types of amino acids in the polypeptide. The amino acid content alone may be used to infer the identity of the polypeptide that is present (e.g., by comparing the amino acid content to a database of polypeptide information and determining which polypeptide(s) have the same amino acid content).

In some embodiments, sequence information for a plurality of polypeptide products obtained from a longer polypeptide or protein (e.g., via enzymatic and/or chemical cleavage) can be analyzed to reconstruct or infer the sequence of the longer polypeptide or protein. Accordingly, some embodiments provide compositions and methods for sequencing a polypeptide by sequencing a plurality of fragments of the polypeptide. In some embodiments, sequencing a polypeptide comprises combining sequence information for a plurality of polypeptide fragments to identify and/or determine a sequence for the polypeptide. In some embodiments, combining sequence information may be performed by computer hardware and software. The methods described herein may allow for a set of related polypeptides, such as an entire proteome of an organism, to be sequenced. In some embodiments, a plurality of single molecule sequencing reactions may be performed in parallel (e.g., on a single chip). For example, in some embodiments, a plurality of single molecule sequencing reactions are each performed in separate sample wells on a single chip.

In some embodiments, methods provided herein may be used for the sequencing and identification of an individual protein in a sample comprising a complex mixture of proteins. Some embodiments provide methods of uniquely identifying an individual protein in a complex mixture of proteins. In some embodiments, an individual protein is detected in a mixed sample by determining a partial amino acid sequence of the protein. In some embodiments, the partial amino acid sequence of the protein is within a contiguous stretch of approximately 5 to 50 amino acids.

Without wishing to be bound by any particular theory, it is believed that most human proteins can be identified using incomplete sequence information with reference to proteomic databases. For example, simple modeling of the human proteome has shown that approximately 98% of proteins can be uniquely identified by detecting just four types of amino acids within a stretch of 6 to 40 amino acids (see, e.g., Swaminathan, et al. *PLoS Comput Biol.* 2015, 11(2):e1004080; and Yao, et al. *Phys. Biol.* 2015, 12(5): 055003). Therefore, a complex mixture of proteins can be degraded (e.g., chemically degraded, enzymatically degraded) into short polypeptide fragments of approximately 6 to 40 amino acids, and sequencing of this polypeptide library would reveal the identity and abundance of each of the proteins present in the original complex mixture. Compositions and methods for selective amino acid labeling and identifying polypeptides by determining partial sequence information are described in in detail in U.S. patent application Ser. No. 15/510,962, filed Sep. 15, 2015, titled "SINGLE MOLECULE PEPTIDE SEQUENCING," which is incorporated by reference in its entirety.

Sequencing in accordance with some embodiments can involve immobilizing a polypeptide on a surface of a substrate or solid support, such as a chip or integrated device. In some embodiments, a polypeptide can be immobilized on a surface of a sample well (e.g., on a bottom surface of a sample well) on a substrate. In some embodiments, a first terminus of a polypeptide is immobilized to a surface, and the other terminus is subjected to a sequencing reaction as described herein. For example, in some embodiments, a polypeptide is immobilized to a surface through a C-terminal end, and terminal amino acid recognition and degradation proceeds from an N-terminal end of the polypeptide toward the C-terminal end. In some embodiments, the N-terminal amino acid of the polypeptide is immobilized (e.g., attached to the surface). In some embodiments, the C-terminal amino acid of the polypeptide is immobilized (e.g., attached to the surface). In some embodiments, one or more non-terminal amino acids are immobilized (e.g., attached to the surface). The immobilized amino acid(s) can be attached using any suitable covalent or non-covalent linkage, for example as described herein. In some embodiments, a plurality of polypeptides are attached to a plurality of sample wells (e.g., with one polypeptide attached to a surface, for example a bottom surface, of each sample well), for example in an array of sample wells on a substrate.

Some aspects of the present disclosure provide a method of sequencing a polypeptide by detecting luminescence of a labeled polypeptide which is subjected to repeated cycles of terminal amino acid modification and cleavage. For example, FIG. 5-12 shows a method of sequencing a labeled polypeptide by Edman degradation in accordance with some embodiments. In some embodiments, the method generally proceeds as described herein for other methods of sequencing by Edman degradation. For example, in some embodiments, steps (1) and (2) shown in FIG. 5-12 may be performed as described elsewhere herein for terminal amino acid modification and terminal amino acid cleavage, respectively, in an Edman degradation reaction.

As shown in the example depicted in FIG. 5-12, in some embodiments, the method comprises a step of (1) modifying the terminal amino acid of a labeled polypeptide. As described elsewhere herein, in some embodiments, modifying comprises contacting the terminal amino acid with an isothiocyanate (e.g., PITC) to form an isothiocyanate-modified terminal amino acid. In some embodiments, an isothiocyanate modification 5-1210 converts the terminal amino acid to a form that is more susceptible to removal by a cleaving reagent (e.g., a chemical or enzymatic cleaving reagent, as described herein). Accordingly, in some embodiments, the method comprises a step of (2) removing the modified terminal amino acid using chemical or enzymatic means detailed elsewhere herein for Edman degradation.

In some embodiments, the method comprises repeating steps (1) through (2) for a plurality of cycles, during which luminescence of the labeled polypeptide is detected, and cleavage events corresponding to the removal of a labeled amino acid from the terminus may be detected as a decrease in detected signal. In some embodiments, no change in signal following step (2) as shown in FIG. 5-12 identifies an amino acid of unknown type. Accordingly, in some embodiments, partial sequence information may be determined by evaluating a signal detected following step (2) during each sequential round by assigning an amino acid type by a determined identity based on a change in detected signal or identifying an amino acid type as unknown based on no change in a detected signal.

Some aspects of the present disclosure provide methods of polypeptide sequencing in real-time by evaluating binding interactions of terminal amino acids with labeled amino acid recognition molecules and a labeled cleaving reagent (e.g., a labeled exopeptidase). FIG. 5-13 shows an example of a method of sequencing in which discrete binding events give rise to signal pulses of a signal output 5-1300. The inset panel of FIG. 5-13 illustrates a general scheme of real-time sequencing by this approach. As shown, a labeled amino acid recognition molecule 5-1310 selectively binds to and dissociates from a terminal amino acid (shown here as lysine), which gives rise to a series of pulses in signal output 5-1300 which may be used to identify the terminal amino acid. In some embodiments, the series of pulses provide a pulsing pattern which may be diagnostic of the identity of the corresponding terminal amino acid.

Without wishing to be bound by theory, labeled amino acid recognition molecule 5-1310 selectively binds according to a binding affinity ($K_D$) defined by an association rate of binding ($k_{on}$) and a dissociation rate of binding ($k_{off}$). The rate constants $k_{off}$ and $k_{on}$ are the critical determinants of pulse duration (e.g., the time corresponding to a detectable binding event) and interpulse duration (e.g., the time between detectable binding events), respectively. In some embodiments, these rates can be engineered to achieve pulse durations and pulse rates that give the best sequencing accuracy.

As shown in the inset panel, a sequencing reaction mixture further comprises a labeled cleaving reagent 5-1320 comprising a detectable label that is different than that of labeled amino acid recognition molecule 5-1310. In some embodiments, labeled cleaving reagent 5-1320 is present in the mixture at a concentration that is less than that of labeled amino acid recognition molecule 5-1310. In some embodiments, labeled cleaving reagent 5-1320 displays broad specificity such that it cleaves most or all types of terminal amino acids.

As illustrated by the progress of signal output 5-1300, in some embodiments, terminal amino acid cleavage by labeled cleaving reagent 5-1320 gives rise to a uniquely identifiable signal pulse, and these events occur with lower frequency than the binding pulses of a labeled amino acid recognition molecule 5-1310. In this way, amino acids of a polypeptide can be counted and/or identified in a real-time sequencing process. As further illustrated in signal output 5-1300, in some embodiments, a labeled amino acid recognition molecule 5-1310 is engineered to bind more than one type of amino acid with different binding properties corresponding to each type, which produces uniquely identifiable pulsing patterns. In some embodiments, a plurality of labeled amino acid recognition molecules may be used, each with a diagnostic pulsing pattern which may be used to identify a corresponding terminal amino acid.

VIII. Conclusion

Having thus described several aspects and embodiments of the technology of the present disclosure, it is to be appreciated that various alterations, modifications, and improvements will readily occur to those of ordinary skill in the art. Such alterations, modifications, and improvements are intended to be within the spirit and scope of the technology described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. An integrated device, comprising:
   a first pixel, comprising:
      a first photodetection region; and
      one or more first charge storage bins spaced from the first photodetection region in a first direction;
   a second pixel, comprising:
      a second photodetection region; and
      one or more second charge storage bins,
   wherein the first and second pixels are positioned in a first row in a second direction substantially perpendicular to the first direction; and
   an optical barrier comprising a contact elongated in the second direction across the first and second pixels in the first row, wherein the optical barrier is configured to block at least some photons from reaching the one or more first charge storage bins and the one or more second charge storage bins.

2. The integrated device of claim 1, wherein the contact is electrically isolated from the first photodetection region.

3. The integrated device of claim 1, wherein the one or more first charge storage bins comprise a first charge storage bin and a second charge storage bin spaced from the first charge storage bin.

4. The integrated device of claim 1, further comprising:
   a metal transfer gate configured to control a flow of charge carriers in the first direction,
   wherein the optical barrier further comprises the metal transfer gate.

5. The integrated device of claim 1, wherein the optical barrier further includes an optical waveguide elongated from the first photodetection region in the third direction.

6. The integrated device of claim 1, further comprising a transfer gate, wherein the transfer gate is configured to provide an electrical bias at a semiconductor region between the first photodetection region and the one or more first charge storage bins to selectively direct charge carriers from the first photodetection region to the one or more first charge storage bins for determination of one or more fluorescence lifetimes.

7. The integrated device of claim 1, further comprising a metal layer spaced from the first photodetection region in a third direction substantially perpendicular to the first and second directions.

8. The integrated device of claim 7, wherein the contact is a first contact and the integrated device further comprises:

a transfer gate disposed between the metal layer and the first photodetection region in the third direction; and
a second contact elongated from the metal layer to the transfer gate,
wherein the second contact is electrically coupled to the transfer gate.

9. The integrated device of claim 8, further comprising:
a third contact elongated from the metal layer toward the first photodetection region and electrically isolated from the first photodetection region, wherein the first contact and the third contact are disposed on opposite sides of the first photodetection region in the first direction.

10. The integrated device of claim 9, wherein:
the first contact and the third contact are configured to block at least some photons from reaching the one or more first charge storage bins and the one or more second charge storage bins.

11. The integrated device of claim 10, wherein the first contact and the third contact are elongated in the second direction from the first pixel to the second pixel.

12. The integrated device of claim 7, further comprising:
a transfer gate configured to control a flow of charge carriers from the first photodetection region to the one or more first charge storage bins; and
a second contact elongated from the transfer gate to the metal layer.

13. The integrated device of claim 12, wherein the optical barrier further comprises a via elongated from the metal layer to a second metal layer spaced from the metal layer in the third direction.

14. The integrated device of claim 8, wherein the contact comprises metal.

15. The integrated device of claim 7, wherein the contact is a first contact and the integrated device further comprises a second contact elongated from the metal layer toward the first photodetection region, and wherein the first contact and the second contact are disposed on opposite sides of the first photodetection region in the first direction.

16. The integrated device of claim 15, wherein the first and second contacts are electrically isolated from the first photodetection region.

17. An integrated device, comprising:
a first pixel, comprising:
a first photodetection region configured to receive emission photons along a first portion of a primary path;
one or more first charge storage bins electrically coupled to receive charge carriers from the first photodetection region along a second portion of the primary path;
a second pixel, comprising:
a second photodetection region; and
one or more second charge storage bins electrically coupled to receive charge carriers from the second photodetection region,
wherein the first and second pixels are positioned in a first row in a direction substantially perpendicular to the first and second portions of the primary path; substantially parallel to the first row across the first and second pixels to block at least some photons from reaching the one or more first charge storage bins and the one or more second charge storage bins.

18. The integrated device of claim 17, wherein the contact is electrically isolated from the first photodetection region.

19. The integrated device of claim 18, wherein the contact is a first contact and the integrated device further comprises:

a transfer gate disposed between the metal layer and the first photodetection region in a direction substantially parallel to the first portion of the primary path; and
a second contact elongated from the metal layer to the transfer gate,
wherein the second contact is electrically coupled to the transfer gate.

20. The integrated device of claim 19, further comprising:
a third contact elongated from the metal layer toward the first photodetection region and electrically isolated from the first photodetection region, wherein the first contact and the third contact are disposed on opposite sides of the first photodetection region in a direction substantially parallel to the second portion of the primary path.

21. The integrated device of claim 20, wherein:
the first contact and the third contact are configured to block at least some photons from reaching the one or more first charge storage bins and the one or more second charge storage bins.

22. The integrated device of claim 21, wherein the first contact and the third contact are elongated from the first pixel to the second pixel.

23. The integrated device of claim 17, further comprising:
a transfer gate configured to control a flow of charge carriers from the first photodetection region to the one or more first charge storage bins; and
a second contact elongated from the transfer gate to the metal layer.

24. The integrated device of claim 23, wherein:
the first photodetection region is positioned, in a direction substantially parallel to the first portion of the primary path, after the transfer gate; and
the transfer gate is positioned, in the direction substantially parallel to the first portion of the primary path, after the metal layer.

25. The integrated device of claim 23, wherein the transfer gate is configured to provide an electrical bias at a semiconductor region between the first photodetection region and the one or more first charge storage bins to selectively direct charge carriers from the first photodetection region to the one or more first charge storage bins for determination of one or more fluorescence lifetimes.

26. The integrated device of claim 17, further comprising a metal layer spaced from the first photodetection region in a direction substantially parallel to the first portion of the primary path.

27. The integrated device of claim 26, wherein the contact is a first contact and the integrated device further comprises a second contact elongated from the metal layer toward the first photodetection region, and wherein the first contact and the second contact are disposed on opposite sides of the first photodetection region in a direction substantially perpendicular to the first row and the first portion of the primary path.

28. The integrated device of claim 27, wherein the first and second contacts are electrically isolated from the first photodetection region.

29. A method of operating an integrated device comprising a first pixel, a second pixel, and an optical barrier, the first pixel comprising a first photodetection region and one or more first charge storage bins, the second pixel comprising a second photodetection region and one or more second charge storage bins, and the first and second pixels positioned in a first row, the method comprising:

receiving, at the first photodetection region, along a first portion of a primary path, emission photons, the first portion of the primary path being substantially perpendicular to the first row;

receiving, at the one or more first charge storage bins via electrical coupling from the first photodetection region, along a second portion of the primary path, charge carriers, the second portion of the primary path being substantially perpendicular to the first row;

receiving, at the one or more second charge storage bins via electrical coupling from the second photodetection region, charge carriers; and blocking, using the at least one barrier, at least some photons and/or at least some charge carriers from reaching the one or more first charge storage bins along at least one secondary path, the blocking comprising using a contact elongated substantially parallel to the first row across the first and second pixels to block at least some photons from reaching the one or more first charge storage bins and the one or more second charge storage bins.

* * * * *